United States Patent [19]

Tajiri et al.

[11] Patent Number: 5,727,009
[45] Date of Patent: Mar. 10, 1998

[54] SEMICONDUCTOR LASER APPARATUS AND OPTICAL PICKUP APPARATUS USING THE SAME

[75] Inventors: Atsushi Tajiri; Kazushi Mori; Keiichi Yodoshi; Takao Yamaguchi; Akira Ibaraki; Tatsuhiko Niina, all of Osaka-fu, Japan

[73] Assignee: Sanyo Electric Co., Ltd., Osaka, Japan

[21] Appl. No.: 811,457

[22] Filed: Mar. 3, 1997

Related U.S. Application Data

[63] Continuation of Ser. No. 508,368, Jul. 28, 1995, abandoned.

[30] Foreign Application Priority Data

| Jul. 29, 1994 | [JP] | Japan | 6-179190 |
| Oct. 24, 1994 | [JP] | Japan | 6-258420 |
| Oct. 25, 1994 | [JP] | Japan | 6-260573 |

[51] Int. Cl.⁶ .................. G11B 7/13; H01S 3/19
[52] U.S. Cl. .......... 372/43; 369/44.14; 369/103; 359/13; 359/15; 372/50
[58] Field of Search .................. 369/103, 112, 369/44.14, 44.23, 44.37; 359/13,15; 372/50, 43

[56] References Cited

U.S. PATENT DOCUMENTS

| 4,731,772 | 3/1988 | Lee | 369/45 |
| 4,885,734 | 12/1989 | Yuzo | 369/45 |
| 5,018,804 | 5/1991 | Lee | 350/3.71 |
| 5,136,152 | 8/1992 | Lee |  |
| 5,285,062 | 2/1994 | Lee | 250/216 |
| 5,293,038 | 3/1994 | Kadowaki et al. | 369/44.23 |
| 5,446,719 | 8/1995 | Yoshida et al. | 369/44.37 |
| 5,481,524 | 1/1996 | Ueno et al. | 369/112 |

FOREIGN PATENT DOCUMENTS

| 1-4926 | 1/1989 | Japan . | |
| 1-313987 | 12/1989 | Japan . | |
| 1-313988 | 12/1989 | Japan . | |
| 2-120857 | 9/1990 | Japan . | |
| 3-76035 | 4/1991 | Japan . | |
| 4-60931 | 2/1992 | Japan | 369/103 |
| 5-307760 | 11/1993 | Japan | 369/103 |
| 6-203403 | 10/1994 | Japan | 372/50 |
| 6-103543 | 12/1994 | Japan . | |

OTHER PUBLICATIONS

Lee et al, Optical Pickup for Compact Disc Player Using Computer–Generated Hologram and Reflection–Type Grating, *Samsung Advanced Institute of Technology*; Sep. 18, 1993, pp. 5451–5452.

Lee, Holographic Optical Head for Compact Disk Application, *Optical Engineering*; Jun. 1989, pp. 650–653.

*Primary Examiner*—Rodney B. Bovernick
*Assistant Examiner*—Yisun Song
*Attorney, Agent, or Firm*—Darby & Darby

[57] ABSTRACT

In an optical pickup apparatus, a laser beam emitted from a semiconductor laser device is reflected upward by a reflecting member, transmitted through a transmission type diffraction grating and split into at least three beams, and which beams are transmitted through a transmission type holographic optical element and condensed onto an optical recording medium by a condenser portion. A return beam reflected by the optical recording medium passes through the condenser portion and diffracted not to impinge upon the transmission type diffraction grating by the holographic optical element and directed to a photodetector portion of a light receiving device. The semiconductor laser device and the light receiving device are disposed in a mount member. The transmission type holographic optical element is supported by a supporting member three-dimensionally movably with respect to the mount member, and the supporting member or/and the holographic optical element is/are fixed with adhesive material with the transmission type holographic optical element being positioned with respect to the mount member.

64 Claims, 33 Drawing Sheets

SEMICONDUCTOR LASER APPARATUS AND OPTICAL PICKUP APPARATUS USING THE SAME

This is a continuation of application Ser. No. 08/508,368, filed Jul. 28, 1995, now abandoned.

CROSS-REFERENCE TO RELATED APPLICATION

This application is related to application Ser. No. 08/259,673, filed Jun. 13, 1994, commonly assigned with the present invention.

BACKGROUND OF THE INVENTION

1. Field of the Invention

The present invention relates to optical pickup apparatus, and particularly to a semiconductor laser apparatus having a transmission type holographic optical element and an optical pickup apparatus using the same.

2. Description of the Background Art

The optical pickup apparatuses used in the optical disk drivers, or the like, perform information recording, information reading to and from optical recording media, such as optical disks, or servo signal detection, using the laser beam. With recent demands of reductions in size, weight and price of the optical pickup apparatus, the optical pickup apparatuses using transmission type holographic optical elements, which are a kind of diffraction elements, have been studied and developed. FIG. 38 shows an outline of the structure of an optical pickup apparatus having a transmission type holographic optical element which performs tracking servo using the three-beam method disclosed in Japanese Patent Laying-Open No.3-76035 (G11B 7/135).

In FIG. 38, a semiconductor laser device 202 as light source means emits a laser beam (light beam) upward. The laser beam emitted from the semiconductor laser device 202 is divided by a first holographic optical element (three-beam generating diffraction grating) 203 into three beams, a 0th order diffraction light, +1st order diffraction light and a −1st order diffraction light, and transmitted through a second holographic optical element 204.

The three laser beams transmitted through the second holographic optical element 204 are condensed onto a disk 201 by an objective lens 205 as condenser means to produce three spots on a disk. The laser beams (return beams) reflected by the disk 201 are diffracted by the second holographic optical element 204 so that respective wave fronts have astigmatism, and are detected by a photodetector 206.

In this pickup device, since the return beams from the disk 201 which are received at the photodetector 206 are not diffracted by the first holographic optical element 203, there is no loss of light. Further, as the second holographic optical element 204 is used so as to diffract the return beams in the direction to the photodetector 206, the thickness of the device can be reduced in comparison with the case of using a prism, or the like.

In the optical pickup apparatus described above, however, the semiconductor laser device 202 and the photodetector 206 can not be provided on the same plane. Accordingly, the optical pickup apparatus must be reoriented at the time of wire-bonding to these elements, resulting in a large number of process steps.

In Japanese Patent Laying-Open No.1-313987 (H01S 3/18), an optical pickup apparatus is disclosed, in which a transmission type holographic optical element as a light dividing element is united with mounting on a cap including inside a semiconductor laser device, a light receiving device for signal detection and a light receiving device for laser output monitor. A laser beam emitted from the semiconductor laser device is transmitted through the transmission type holographic optical element and condensed upon an optical recording medium, and the return light from the optical recording medium containing information of reproduction signals, etc. is received by the light receiving device for signal detection.

In such an optical pickup apparatus with a transmission type holographic optical element joined, adjustment is made so that the condensed spot of the return light enters the light receiving device for signal detection by moving the holographic optical element, or the cap itself on which the holographic optical element is fixed. In this case, as the surface of the holographic optical element can be moved in parallel with the surface of the light receiving device, the position of the holographic optical element can be adjusted so that the return light from the optical recording medium is incident upon the light receiving device for signal detection. However, as the position adjustment of the holographic optical element in the height direction is impossible, it is difficult to condense well the return light onto the light receiving surface of the light receiving device for signal detection.

SUMMARY OF THE INVENTION

It is an object of the present invention to present an optical pickup apparatus which provides good tracking servo according to the three-beam method, easy wire-bonding, easy production and installation of the three-beam generating diffraction grating, and high efficiency of the use of lights.

Another object of the present invention is to provide a semiconductor laser apparatus with easy positional adjustment of the transmission type holographic optical element.

Still another object of the present invention is to provide an optical pickup apparatus using a semiconductor laser apparatus with easy positional adjustment of the transmission type holographic optical element.

An optical pickup apparatus according to the present invention includes a light source for emitting a light beam, a reflecting member for reflecting the light beam emitted in a first direction from the light source in a second direction almost vertical to the first direction, a transmission type diffraction grating for transmitting the light beam reflected by the reflecting member and dividing into at least three beams, a transmission type holographic optical element for transmitting the three beams obtained by the diffraction grating, a condenser portion for condensing the three beams transmitted through the holographic optical element onto an optical recording medium, and a photodetector for detecting the return beam reflected by the optical recording medium and transmitted through the condenser portion, wherein the holographic optical element diffracts the return beam transmitted through the condenser portion and directs to the photodetector so that the return beam does not enter the transmission type diffraction grating surface.

In the optical pickup device, the light beam emitted in the first direction from the light source is directed in the second direction by the reflecting member and the reflected light beam is split by the transmission type diffraction grating. The return beam transmitted through the condenser portion is diffracted by the holographic optical element so that the return beam will not enter the transmission type diffraction grating. Accordingly, since the light source and the photodetector can be arranged on the same plane, installation thereof and wire bonding thereto can be performed easily. Furthermore, as the three beams impinge upon the transmission type diffraction grating almost vertically, undulation of the diffraction grating surface can be formed at equal pitches and wide pitches. As a result, production and installation can be accomplished easily, and tracking servo can be done satisfactorily. Also, the angle of diffraction of light at the transmission type diffraction grating can be made small. As a result, the split three beams can efficiently enter the condenser portion without getting off the condenser portion and the efficiency of utilization of light increases. Moreover, as the return beam is detected by the photodetector without impinging upon the transmission type diffraction grating, no loss of light is caused.

The optical pickup apparatus may further include a substrate for supporting the light source, the reflecting member and the photodetector, and the light source, the reflecting member and the photodetector may be disposed on the substrate. The first direction is a direction almost parallel to the main surface of the substrate and the second direction is a direction almost normal to the main surface of the substrate.

The transmission type diffraction grating and the transmission type holographic optical element may be integrally formed of a light-transmitting member, the light transmitting member including a transmission type diffraction grating surface which transmits the light beam reflected by the reflecting member and splits it into at least three beams, and a transmission type holographic functional surface which transmits the beams obtained by the diffraction grating surface. Specifically, the transmission type diffraction grating surface and the holographic functional surface may be arranged almost in parallel to the main surface of the substrate.

It is preferable that the photodetector is arranged on the opposite side to the light source with respect to the reflecting member. In this case, as the reflecting member functions as a light shielding member, the sensitivity of the photodetector increases.

It is preferable that the light source, the reflecting member and the photodetector are arranged almost on a single line along the first direction in this order. In this case, the width of the apparatus can be reduced and then the thickness of the optical pickup apparatus can also be reduced.

The photodetector may include first and second photodetector portions, and the holographic optical element diffracts the return beam transmitted through the condenser portion to the first and second photodetector portions so that the return beam will not impinge upon the transmission type diffraction grating surface. In this case, as the return beam is detected by the two photodetector portions, the reliability of detection is improved. The first photodetector portion may be arranged on the same side as the light source with respect to the reflecting member and the second photodetector portion may be arranged on the opposite side to the light source with respect to the reflecting member.

The optical recording medium may be so arranged that its recording surface is almost parallel to the first and second directions and the optical pickup apparatus may include another reflecting member which reflects the beam transmitted through the holographic optical element in a direction almost normal to the first and second directions and directs it to the recording surface of the optical recording medium via the condenser portion. In this case, the distance between the light source and the optical recording medium can be short, and the thickness of the optical pickup apparatus can thus be reduced.

A semiconductor laser apparatus according to another aspect of the present invention includes a semiconductor laser device, a light receiving device, a mount member in which the semiconductor laser device and the light receiving device are disposed, a transmission type holographic optical element for transmitting a laser beam emitted from the semiconductor laser device and diffracting a return beam originated from the laser beam and directing the return beam to the light receiving device, and a supporting member for supporting the transmission type holographic optical element three-dimensionally movably with respect to the mount member, wherein the supporting member or/and the holographic optical element is/are fixed with an adhesive material in condition that the transmission type holographic optical element is positioned with respect to the mount member.

In that semiconductor laser apparatus, the transmission type holographic optical element which diffracts the return beam reflected by the optical disk after being emitted from the semiconductor laser device so that the diffracted beam impinges upon the light receiving device is supported three-dimensionally movably. Accordingly, optical adjustment can be made easily by positional adjustment of the transmission type holographic optical element since the diffraction direction of the return beam can be changed by the positional adjustment of the holographic optical element.

The holographic optical element may be arranged above the mount member with the supporting member, and the semiconductor laser apparatus may further include a reflecting member for reflecting the laser beam emitted from the semiconductor laser device upward of the mount member and directing the laser beam to the holographic optical element.

The mount member may include an insulating mold body having a concave portion accommodating the semiconductor laser device and the light receiving device and a plurality of leads supported by the insulating mold body, and the semiconductor laser device and the light receiving device may be electrically connected to ones of the plurality of leads in the concave portion. In this case the reliability of electric connections is also ensured in addition that the semiconductor laser device and the light receiving device are protected by the mount member. Also, the reflecting member may be arranged in the concave portion. In this case, the reflecting member is also protected by the mount member.

The mount member may further include a frame held by the insulating mold body, and the semiconductor laser device may be provided on the frame in the concave portion. In this case, the heat of the semiconductor laser device is efficiently dissipated through the frame, which enables long life and high power output of the semiconductor laser device. Also, the electric connection between one electrode of the semiconductor laser device and the frame can be made easily without using wire bonding. In this case, it is enough to connect only the other electrode of the semiconductor laser device to the lead by wire bonding, or the like, which provides easy manufacturing of the semiconductor laser apparatus.

The light receiving device may be provided on the frame in the concave portion. In this case, the heat of the light receiving device is efficiently dissipated through the leads, which dissolves reduction of sensitivity of the light receiving device. Furthermore, electric connection between one electrode of the light receiving device and the frame can be made easily without using wire bonding. In this case, it is enough to electrically connect only the other electrode of the light receiving device to the lead by wire bonding, or the like, which provides still easier production of the semiconductor laser apparatus.

The insulating mold body may include an inclined portion which supports the reflecting member at an angle. The insulating mold body may include additional concave portion formed on the bottom in the concave portion and an inclined portion may be formed in that additional concave portion.

The reflecting member may include a reflection type diffraction grating for reflecting the laser beam emitted from the semiconductor laser device and dividing the laser beam into at least three beams. The at least three beams are preferably a 0th order diffraction beam, a +1st order diffraction beam and a −1st order diffraction beam. This enables tracking servo according to the three-beam method and lessens the number of parts in the optical pickup apparatus.

The semiconductor laser apparatus may further include a transmission type diffraction grating for transmitting the laser beam emitted from the semiconductor laser device and dividing into at least three beams and leading the divided beams to the transmission type holographic optical element.

The reflecting member may be formed of a mirror and the semiconductor laser apparatus may further include a transmission type diffraction grating for transmitting the laser beam reflected by the mirror and splitting the laser beam into at least three beams. The at least three beams are preferably a 0th order diffraction beam, a +1st order diffraction beam and a −1st order diffraction beam.

This enables tracking servo according to the three-beam method in the optical pickup apparatus. As the laser beam is incident almost vertically upon the diffraction grating surface of the transmission type diffraction grating, the undulation on the diffraction grating surface can be formed at equal pitches. Accordingly, positional adjustment of the transmission type diffraction grating is very easy. Furthermore, the distance between the transmission type diffraction grating and the semiconductor laser device can be set larger in comparison with the case of using the reflection type diffraction grating without increasing the dimension of the semiconductor laser apparatus. As a result, period of undulation on the diffraction grating surface can be made larger and the production of the transmission type diffraction grating is easier in comparison with the case of using the reflection type diffraction grating. As the period of the undulation of the diffraction grating surface increase, the diffraction angle of the ±1 order diffraction light, and the like, decreases. Accordingly, if the semiconductor laser apparatus is used in the optical pickup apparatus, the optical axes of these diffraction lights pass through relatively near the center of the condenser portion, which improves efficiency of utilization of light.

The transmission type diffraction grating may be provided in the supporting member. The transmission type diffraction grating may be formed integrally with the supporting member. The holographic optical element may be formed integrally with the supporting member.

The holographic optical element and the transmission type diffraction grating may be integrally formed of a transparent member, the transparent member having a holographic functional surface and a diffraction grating surface which face each other, the diffraction grating surface arranged on the mount member side. This provides less number of parts.

The holographic optical element preferably diffracts the return beam to the light receiving device so that the diffracted beam does not enter the transmission type diffraction grating. In this case, since the return beam impinges upon the light receiving device without impinging upon the transmission type diffraction grating, there is no optical loss.

It is preferable that the semiconductor laser device, the reflecting member and the light receiving device are arranged on a single line in this order. In this case, because the reflecting member serves also as a light shielding member for the light receiving element by intercepting the laser beam from the semiconductor laser device, the laser beam is prevented from directly impinging upon the light receiving device. Also, it provides reduction of width of the semiconductor laser apparatus, which reduces the thickness of the optical pickup apparatus.

The supporting member may be formed of a plurality of members, and the plurality of members may be joined together movably to each other in different directions. In this case, since positional adjustment of the holographic optical element can be made by individually moving the respective members, fine adjustment of the holographic optical element is easy. The movable members are fixed to each other with an adhesive material.

The different directions may be first directions almost vertical to an axis of the incident laser beam into the holographic optical element, a second direction almost parallel to that axis and a rotating direction around an axis almost along the axis of the incident laser beam. That is, the above described rotating direction may be a rotating direction on an axis somewhat inclined from the axis of the incident laser beam or a rotating direction on an axis somewhat inclined from an axis sifted from the axis of the incident laser beam.

The plurality of members may include a first member fixed above the mount member, a second member joined with the first member rotatably about an axis along the second direction and movably in the second direction, and a third member which holds the holographic optical element so that the laser beam impinges upon the holographic optical element almost vertically and which is joined with the second member movably in the first directions.

The first member may include a cylindrical cavity almost around the axis along the second direction, the second member may be formed of a cylinder fitted into the cylindrical cavity slidably in the rotating direction and the second direction and may have at least in part a light-transmitting portion which transmits the incident laser beam, the third member may be fitted to the second member slidably in the first directions and may have at least in part a light-transmitting portion which leads the incident laser beam to the holographic optical element, and the second member and the third member may be fixed with an adhesive material.

The plurality of members may include a first member fixed on the mount member, and a second member joined to the first member rotatably on the axis along the second direction and movable in the second direction, and the holographic optical element may be joined to the second member movably in the first direction.

The first member may have a cylindrical cavity almost around the axis along the second direction, the second member may be formed of a cylinder fitted into the cylindrical cavity slidably in the rotating direction and the second direction and may have at least in part a light-transmitting portion which leads the incident laser beam to the holographic optical element, and the second member and the holographic optical element may be fixed with an adhesive material.

The plurality of members may include a first member which is joined on the mount member movably in the first direction, and a second member which holds the holographic optical element so that the laser beam impinges upon the holographic optical element almost vertically and which is joined to the first member rotatably on the axis along the second direction and movably in the second direction.

The first member may have a cylindrical cavity almost around the axis along the second direction and which may be fitted to the mount member slidably in the first direction, the second member may be formed of a cylindrical body which is fitted in the cylindrical cavity slidably in the rotating direction and the second direction and may have at least in part a light-transmitting portion which leads the incident laser beam to the holographic optical element, and the mount member, the first member and the second member may be fixed with an adhesive material.

The different directions may be a first direction almost vertical to the axis of the incident laser beam, a second direction almost parallel to the axis, and a third direction almost vertical to the first direction and the second direction.

The plurality of members may include a first member which is fixed to the mount member, a second member which is joined with the first member movably in the second direction, a third member which is joined with the second member movably in the first direction, and a fourth member which holds the holographic optical element so that the laser beam impinges upon the holographic optical element almost vertically and which is joined to the third member movably in the third direction.

The first member may have a cavity, the second member may be fitted into the cavity slidably in the second direction and may have at least in part a light-transmitting portion which transmits the incident laser beam, the third member may be fitted to the second member slidably in the first direction and may have at least in part a light-transmitting portion which transmits the incident laser beam, the fourth member may be fitted to the third member slidably in the third direction and have at least in part a light-transmitting portion which leads the incident laser beam to the holographic optical element, and the second member, the third member and the fourth member may be fixed with an adhesive material.

The plurality of members may include a first member fixed on the mount member, a second member joined to the first member movably in the second direction, and a third member joined to the second member movably in the first direction, and the holographic optical element may be joined to the third member movably in the third direction.

The first member may have a cavity, the second member may be fitted movably in the cavity slidably in the second direction and may have at least in part a light-transmitting portion which transmits the incident laser beam, the third member may be fitted to the second member slidably in the first direction and may have at least in part a light-transmitting portion which leads the incident laser beam to the holographic optical element, the holographic optical element may be fitted to the third member slidably in the third direction, and the second member, the third member, and the holographic optical element may be fixed with an adhesive material.

The plurality of members may include a first member which is joined on the mount member movably in the first direction, a second member which is joined to the first member movably in the second direction, and a third member which holds the holographic optical element so that the laser beam is incident almost vertically upon the holographic optical element and which is joined to the second member movably in the third direction.

The first member may have a cavity, and may be joined to the mount member slidably in the first direction, the second member may be fitted in the cavity slidably in the second direction and have at least in part a light-transmitting portion which transmits the incident laser beam, the third member may be fitted to the second member slidably in the third direction and have at least in part a light transmitting portion which leads the incident laser beam to the holographic optical element, and, the first member, the second member and the third member may be fixed with an adhesive material.

The plurality of members may include a first member joined on the mount member movably in the first direction and a second member joined to the first member movably in the second direction and the holographic optical element may be joined to the second member movably in the third direction.

The first member may have a cavity, and may be joined to the mount member slidably in the first direction, the second member may be fitted into the cavity slidably in the second direction and may have at least in part a light-transmitting portion which leads the incident laser beam to the holographic optical element, the holographic optical element may be fitted to the second member slidably in the third direction, and the first member, the second member and the holographic optical element may be fixed with an adhesive material.

The supporting member may be joined to the mount member movably in a direction almost vertical to the axis of the incident laser beam, and the holographic optical element may be joined to the supporting member which is rotatable almost about the axis of the incident laser beam and movable in a direction almost parallel to the axis of the incident laser beam.

The supporting member may be fitted to the mount member slidably in a direction almost vertical to the axis of the incident laser beam and may have a cylindrical cavity almost around the axis, the holographic optical element may be formed of a cylindrical body fitted in the cylindrical cavity in the rotating direction and a direction almost parallel to the axis of the incident laser beam, and the supporting member and the holographic optical element may be fixed with an adhesive material.

Especially when the plurality of members forming the supporting member are fitted to each other, the respective members can be moved witch good orientation, and hence the transmission type holographic optical element can be accurately adjusted.

If one member of the supporting member is rotatable, position of the holographic functional surface of the transmission type holographic optical element can also be adjusted. Therefore, the transmission type holographic optical element can be arranged in a most suitable position while preventing the wave front of the light diffracted by the holographic functional surface of the transmission holographic optical element from being disordered.

If the first member is joined to the mount member movably in the first direction, the number of components of the supporting member is reduced, resulting in cost reduction of the semiconductor laser apparatus. Furthermore, if the transmission type holographic optical element itself is joined movably in the first direction, the number of components of the supporting member can be reduced, which enables cost reduction of the semiconductor laser apparatus. Especially, if the supporting member is joined to the mount member movably in the first direction and the holographic optical element is joined to the supporting member rotatably and movably in the second direction, the number of components is significantly reduced and fine adjustment of the transmission holographic optical element becomes easier.

If the supporting member, the respective components of the supporting member or the holographic optical element move sliding, as there is no gap in the sliding portion, the transmission holographic optical element can be precisely arranged in a predetermined position, and when fixing with the adhesive material, there is no possibility that the adhesive material flows out to attach to undesirable portions.

The holographic optical element may be accommodated in the cavity of the supporting member. In this case, the holographic optical element is protected when incorporated in the optical pickup apparatus, or the like.

The transmission type holographic optical element may provide astigmatism to the diffracted beam. In this case, the transmission type holographic optical element has a function of providing astigmatism to the diffracted beam in addition to the function of diffracting the return beam, preferably the function of diffracting in the 1 or −1st order. This enables focusing error detection according to astigmatism method when the semiconductor laser apparatus is used in the optical pickup apparatus.

The mount member and the supporting member may be formed of resin. This enables weight reduction, cost reduction and mass production of the semiconductor laser apparatus. Furthermore, the mount member may have at least a pair of arc portions on its periphery facing each other. In this case, by incorporating the arc portions into a circular opening of the housing of the optical pickup apparatus, the semiconductor laser apparatus can be rotated. Accordingly, adjustment of the optical system becomes easier.

An optical pickup apparatus according to still another aspect of the present invention includes a semiconductor laser apparatus, which semiconductor laser apparatus includes a semiconductor laser device, a light receiving device, a mount member on which the semiconductor laser device and the light receiving device are mounted, a transmission type holographic optical element for transmitting a laser beam emitted from the semiconductor laser device and diffracting a return beam originated from the laser beam and directing the diffracted beam to the light receiving device, and a supporting member for supporting the transmission type holographic optical element three-dimensionally movably with respect to the mount member, and the supporting member or/and the holographic optical element is/are fixed with an adhesive material on condition that the transmission type holographic optical element is suitably positioned with respect to the mount member.

The semiconductor laser apparatus may further include a reflecting member for reflecting a laser beam emitted in a first direction from the semiconductor laser device toward in a second direction almost vertical to the first direction, and a transmission type diffraction grating which transmits the laser beam reflected by the reflecting member and divides the laser beam into at least three beams and directs the three beams to the holographic optical element, wherein the holographic optical element may diffract the return beam from an optical recording medium and direct to the light receiving device so that the diffracted beam will not impinge upon the transmission type diffraction grating surface.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
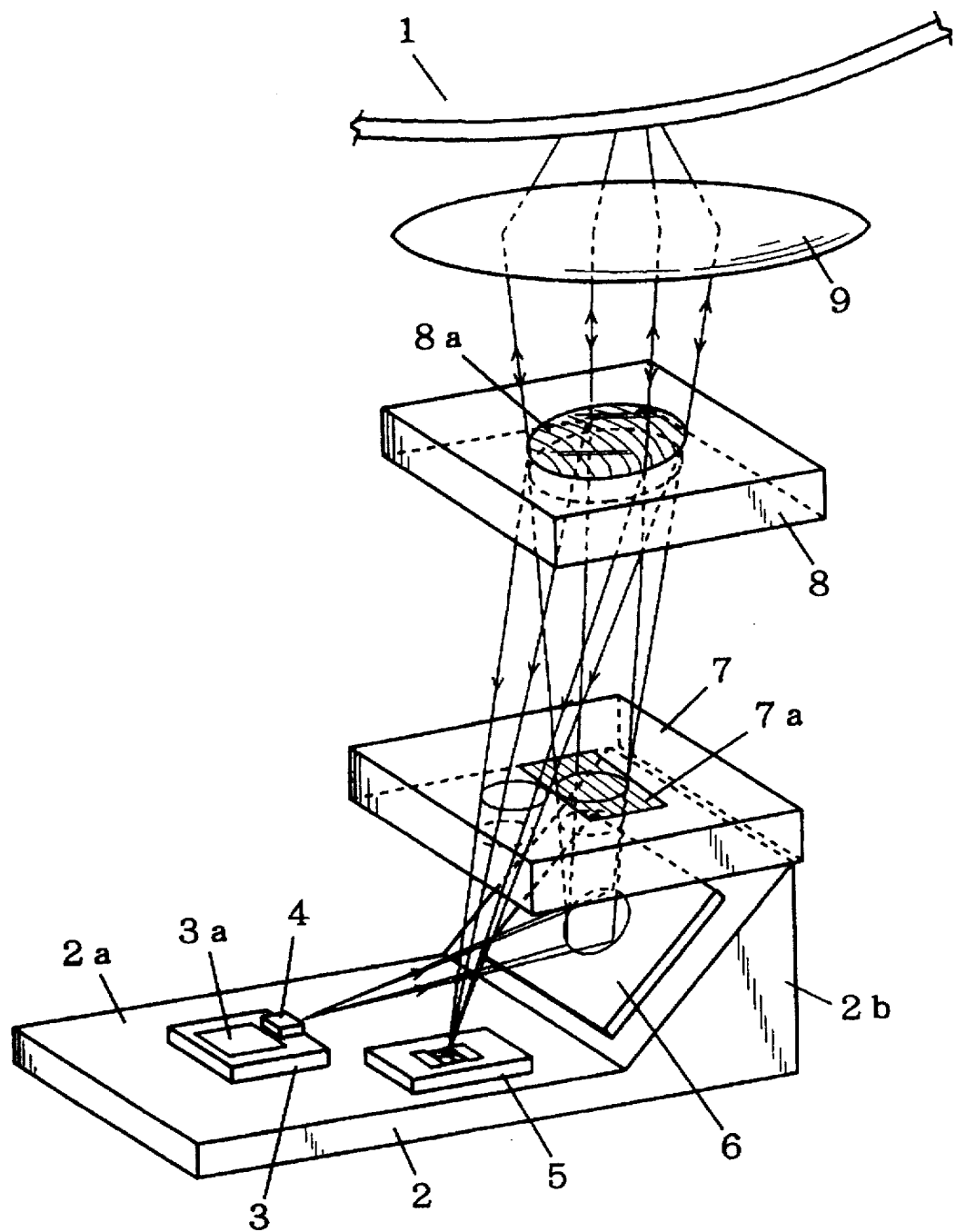
FIG. 1 is a perspective view showing an outline of the structure of an optical pickup apparatus according to a first embodiment of the present invention.

Now, embodiments of the present invention will be described in detail referring to the drawings.

(1) First Embodiment

Figure 2:
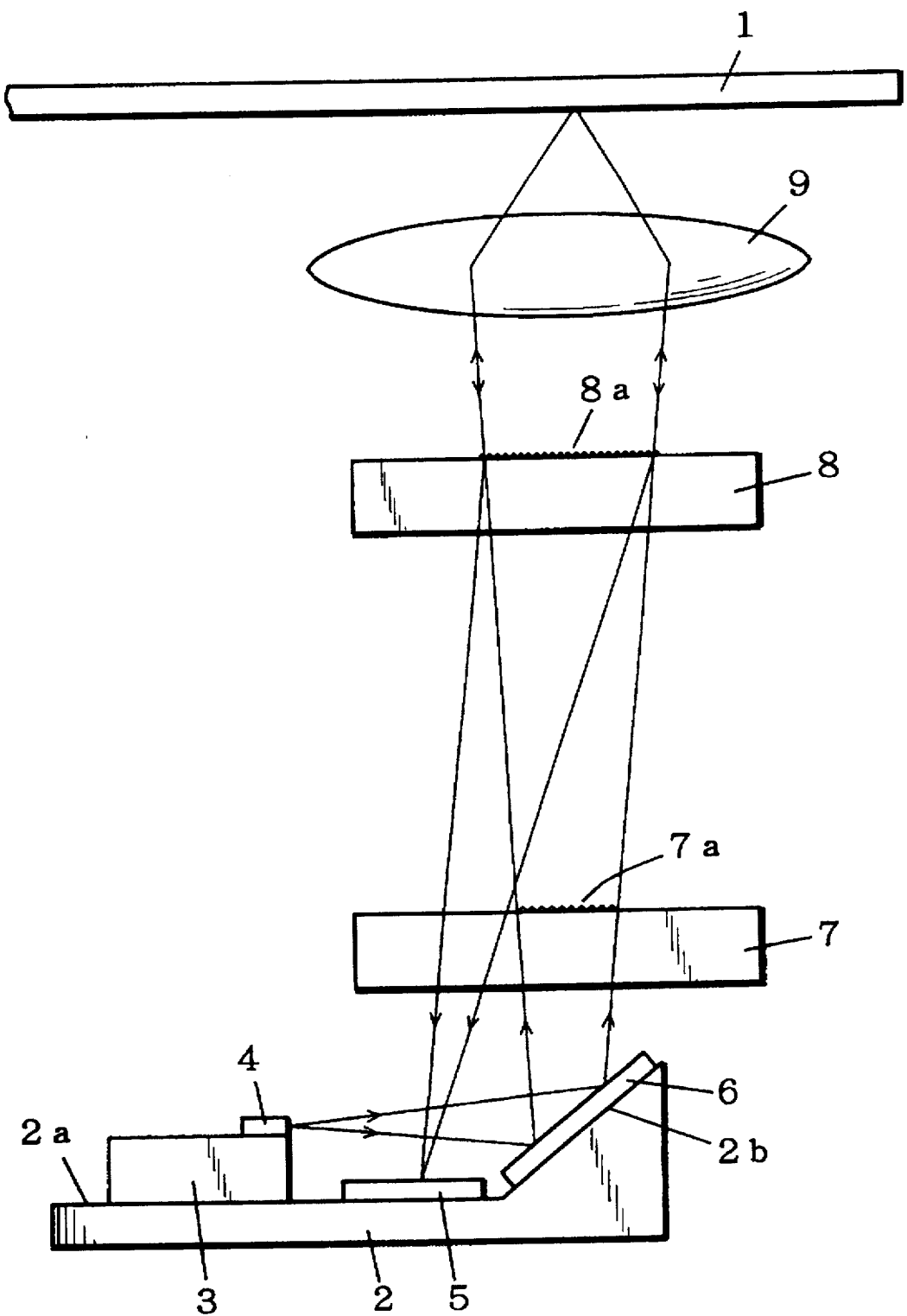
FIG. 2 is a side view showing an outline of the structure of the optical pickup apparatus of the first embodiment.

FIG. 1 and FIG. 2 are a perspective view and a side view, respectively, showing an outline of the structure of an optical pickup apparatus of the first embodiment which performs tracking servo using the three-beam method. In the figure, electrodes and boding wires are not shown and the optical path lines are simplified.

In the figures, a base (installation member) 2 is formed of an electrically conductive semiconductor material, such as an $n^+$-type Si (Silicon), or an electrically conductive metal material, such as copper, and which has good thermal conductivity. The base 2 has an upper plane $2a$ and a portion $2b$ inclined at an angle of 45 deg. with respect to the upper plane $2a$.

An electrically conductive heat sink 3 formed of an $n^+$-type Si semiconductor substrate is die-bonded on the upper plane $2a$ of the base 2 and electrically connected to the base 2. Formed on the upper surface of the heat sink 3 is a PIN-type photodiode $3a$ for laser beam monitoring (photodetector portion for laser output monitor). The photodiode $3a$ is formed of the semiconductor substrate, an $n^-$-type diffusion layer selectively formed near one end on its surface and a $p^+$-type diffusion layer selectively formed in the surface of the $n^-$-type diffusion layer.

A semiconductor laser device (light source) 4 for emitting a laser beam is provided on the heat sink 3. An electrode on the lower surface side of the semiconductor laser device 4 is die-bonded near the other end on the surface of the heat sink 3. Another electrode is provided on the upper surface of the semiconductor laser device 4.

The semiconductor laser device 4 is arranged so that its light emitting front facet faces to the inclined portion $2b$ of the base 2. The semiconductor laser device 4 generates the laser beam in an active region (not shown) extending in parallel with the surface of the heat sink 3, emits a main laser beam from the front facet for detecting signals of optical recording medium and emits a laser beam from the rear facet for being monitored (not shown).

A photodetector for signal detection (signal detecting photodetector) 5 detects a return beam (reflected light) returning from a reflection type optical recording medium 1, such as an optical disk, and reads signals for tracking servo, focusing servo and reproduction. The photodetector 5 is mounted on the upper plane $2a$ of the base 2 so that substantially no other beam than the return beam will enter the photodetector 5. An electrode (not shown) of the photodetector 5 is die-bonded to the base 2 and electrically connected to the base 2.

A reflection mirror (reflection member) 6 is fixed to the inclined portion $2b$ of the base 2 to reflect upward the laser beam emitted from the front end of the semiconductor laser device 4. A transmission type three-beam generating diffraction grating 7 is provided above the reflection mirror 6. The three-beam generating diffraction grating 7 has a diffraction grating surface $7a$ which is formed at equal pitches on the upper surface of a transparent substrate. The three-beam generating diffraction grating 7 divides the laser beam reflected at the reflection mirror 6 into a 0th order diffraction beam, +1st order diffraction beam and a −1st order diffraction beam at its grating surface $7a$ and emits them upward. The 0th order diffraction beam is referred to as a main beam, the +1st order diffraction beam as a sub-beam X, and the −1st order diffraction beam is referred to as a sub-beam Y hereinafter, but "three main beams" denote these three diffraction beams.

A transmission type holographic optical element 8 is disposed above the three-beam generating diffraction grating 7. The holographic optical element 8 is formed of a transparent substrate, where a holographic functional surface $8a$ including a group of curves with gradually changing pitches of undulation is formed on the upper surface of the transparent substrate in this embodiment. This holographic optical element 8 transmits (0th order diffraction) the 0th order diffraction beam, the +1st order diffraction beam and the −1st order diffraction beam (the main beam and the sub-beams X, Y) and 1 order diffracts the 0th order return beam, the +1st order return beam and the −1st order return beam (the main beam and the sub-beams X, Y) of them which were reflected and returned off of the optical recording medium 1 so that they do not impinge upon the diffraction grating surface 7a of the diffracting grating 7, and converges (condenses) them onto the photodetector portion of the photodetector 5.

The holographic optical element 8 produces from the incident beam ±1 order diffraction beams having an optical axis inclined relative to the optical axis of the incident beam, and also produces the effect of condensing the ±1 order diffraction beams so that focusing angles differ between in the direction perpendicular to the direction of propagation of the beam and in the direction perpendicular to this direction (the astigmatism effect). That is to say, the holographic functional surface 8a of the holographic optical element 8 has functions of a beam splitter, a condenser lens and a cylindrical lens.

An objective lens 9 as condenser means is provided above the transmission type holographic optical element 8. The objective lens 9 condenses the 0th order and ±1 order diffraction beams (the main beam and the sub-beams X, Y) passed through (0th order diffraction) the holographic optical element 8 onto the surface of the optical recording medium 1 to produce a main spot m and sub-spots x and y on both sides of the main spot m.

Figure 3:
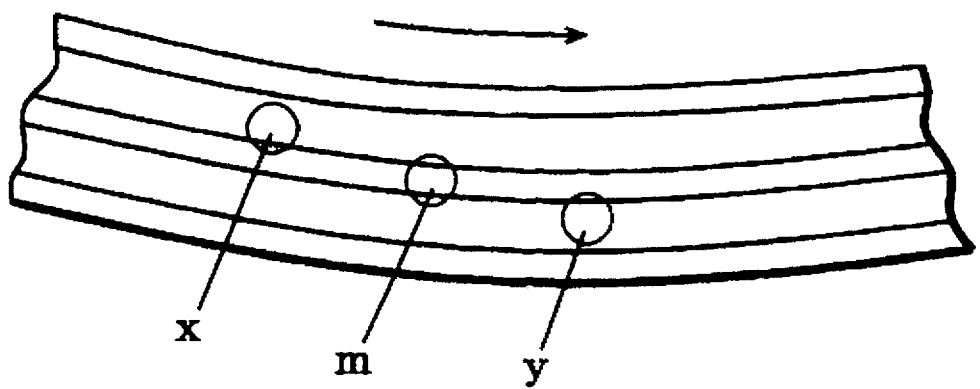
FIG. 3 is a diagram showing a main spot m and sub-spots x and y on the optical recording medium in the first embodiment.

As shown in FIG. 3, the optical system of the optical pickup apparatus is adjusted and arranged so that the main spot m scans a track to be reproduced and the sub-spots x and y scan slightly covering that track on both sides of the main spot m. The objective lens 9 is driven by a driving mechanism (not shown) according to the detection signals of the photodetector 5, and thus effecting focusing servo and tracking servo.

Figure 4:
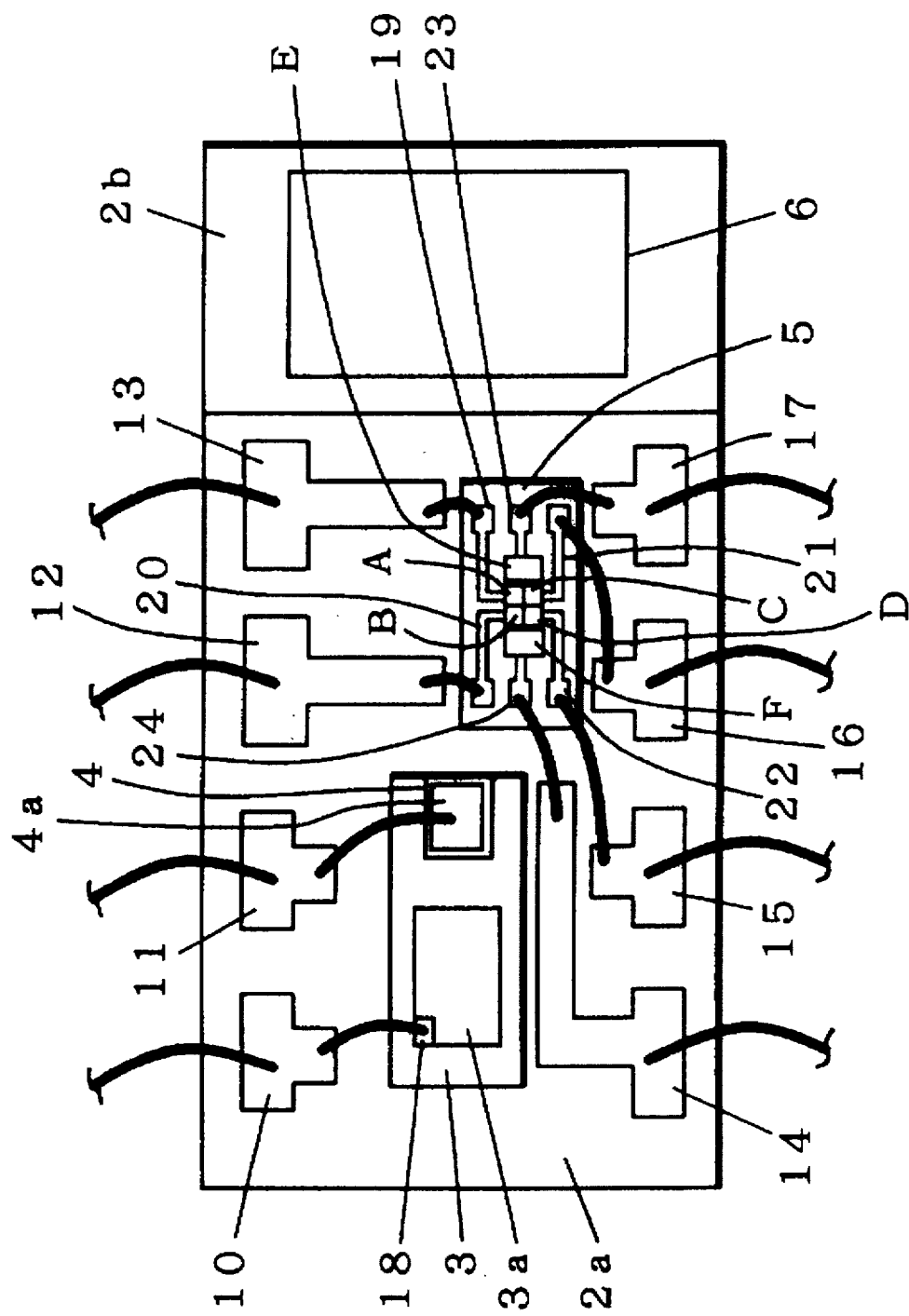
FIG. 4 is a top view of the base in the optical pickup apparatus in the first embodiment.

FIG. 4 is a top view of the base 2 of the optical pickup apparatus, which shows details of the electrodes, bonding wires and the photodetector 5 not shown in FIG. 1 and FIG. 2.

As shown in the figure, the photodetector 5 of this embodiment includes four-segment photodetector portions A, B, C, D which are disposed in the center to perform focusing error detection using the astigmatism method, and photodetector portions E, F disposed on both sides thereof to perform tracking error detection using the three-beam method. The main beam which has been 1 order diffracted at the holographic optical element 8 impinges at the center of the four-segment photodetector portions A, B, C, D, and the sub-beams X, Y which have been 1 order diffracted impinge upon the photodetector portions E, F, respectively.

Figure 5:
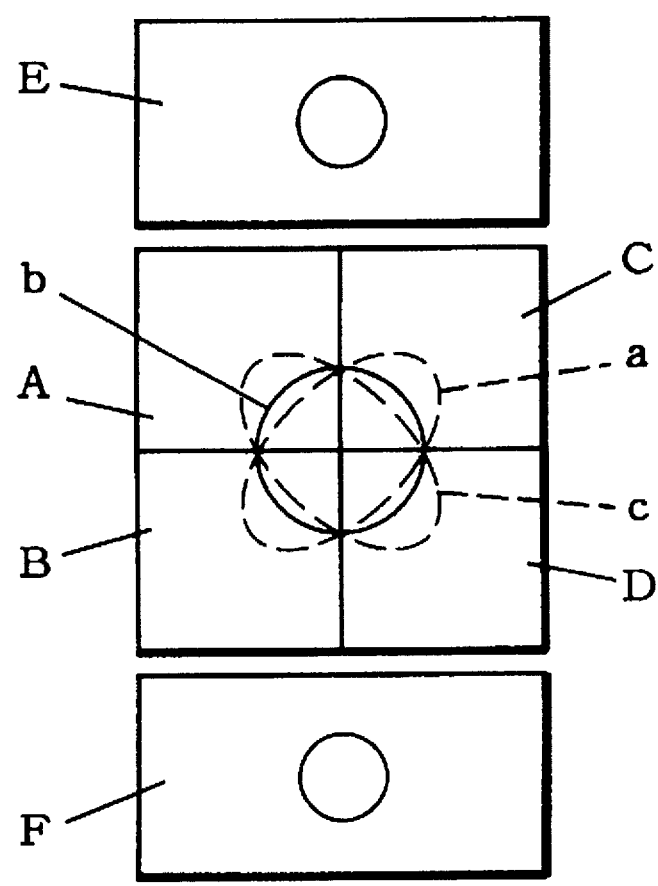
FIG. 5 is a top view of the photodetector in the optical pickup apparatus of the first embodiment.

The 1 order diffracted main beam has the astigmatism owing to the holographic optical element 8. Hence, as schematically shown in FIG. 5, if the objective lens 9 and the optical recording medium 1 are too close, an elliptical spot having its long axis direction in the direction connecting the centers of the photodetector portion B and the photodetector portion C (the broken line a in the figure) is obtained. If the objective lens 9 and the optical recording medium 1 are in the positional relation for producing good focusing, a circular spot is obtained in the center of the photodetector portions A, B, C, D (the solid line b in the figure). If the objective lens 9 and the optical recording medium 1 are too far, an elliptical spot having its long axis direction in the direction connecting the centers of the photodetector portion A and the photodetector portion D, (the broken line c in the figure) is obtained. Accordingly, a focus error (FE) signal of the expression below is obtained from an operation circuit not shown.

$$FE\ signal = (A1+D1)-(B1+C1)$$

The FE signal of the expression above indicates an amount of error of focus, and it is obtained as a negative signal when the optical recording medium 1 is too close, as 0 in the case of good focusing, and as a positive signal when it is too far.

When the main spot is tracking well, the intensities of the sub-beams X, Y, incident on the photodetector portions E and F are equal, and when the main spot is shifted from the reproduced track on either side, the light intensity of corresponding one of the bus-beams X, Y is larger and the other is small. Accordingly, a tracking error (TE) signal of the expression below is obtained from an operation circuit not shown.

$$TE\ signal = E1-F1$$

The TE signal of the expression above provides information indicating the error amount of the main spot and on which side of the track the main spot is shifted.

Furthermore, a reproduction signal of the expression below is obtained from an operation circuit not shown.

$$Reproduction\ signal = A1+B1+C1+D1$$

The A1-F1 in the expression above denote detection signal intensities in the photodetector portions A-F.

In FIG. 4 again, transit electrodes 10-17 formed of Gold, or the like, are formed on the upper plane 2a of the base 2 through an insulating layer formed of $SiO_2$, or the like, not shown. An electrode 18 of the photodiode 3a is also formed of Gold, or the like. An upper surface electrode 4a of the semiconductor laser device 4, the electrode 18 of the photodiode 3a and electrodes 19-24 of the respective photodetector portions A-F are electrically connected to the corresponding transit electrodes 10-17 using bonding wires (the thick lines in the figure), respectively, and the transit electrodes 10-17 are electrically connected to an operation circuit, and the like (not shown) with bonding wires (the thick lines in the figure.) formed of gold or the like. The semiconductor laser device 4, the respective photodetector portions A-F of the detector device 5, and the photodiode 3a are electrically connected to a common back side electrode (not shown) formed on the back side of the base 2.

The reproduction, the tracking servo, and the focusing servo in the optical pickup apparatus described above are accomplished as follows.

A laser beam emitted from the rear end side of the semiconductor laser device 4 is received at the photodiode 3a and it is controlled in an APC (Automatic Power Control) circuit (not shown) so that the laser beam is constant according to a signal corresponding to the amount of received light.

On the other hand, a laser beam emitted from the front end side of the semiconductor laser device 4 is reflected by the reflection mirror upward at a right angle, and then diffracted by the three-beam generating diffraction grating 7 into a plurality of beams including the 0th order and ±1 order beams (the main beam and the sub-beams X, Y). The 0th order and ±1 order diffraction beams (the main beam and the sub-beams X, Y) split by the three-beam generating diffraction grating 7 enter on the transmission type holographic optical element 8 from its one direction. Subsequently, the 0th order and ±1 order diffraction beams (the main beam and the sub-beams X, Y) 0th order diffracted (transmitted) by the holographic optical element 8 are converged (condensed) as the main spot m and the sub-spots x, y described before onto the optical recording medium 1 by the objective lens 9.

A return beam (the main beam and the sub-beams X, Y) containing information from the main spot m and the sub-spots x, y are passed through the objective lens 9 and then 1 order diffracted by the holographic optical element 8, and the main beam is directed to the photodetector portions A–D of the photodetector 5 and the sub-beams X, Y are directed to the photodetector portions E, F. Then, the signals obtained in the photodetector 5 are operated in operation circuits not shown and thus the reproduction signal, the FE signal and the TE signal described above are obtained. The objective lens 9 is driven by a driving mechanism not shown according to the FE signal and the TE signal, thus effecting the tracking servo and the focusing servo.

In this embodiment the light beam emitted from the front end side of the semiconductor laser device 4 is directed upward by the mere reflection mirror 6 and the reflected light beam is split into three main beams by the transmission type three-beam generating diffraction grating 7. Furthermore, the three main beams reflected by the optical recording medium 1 are 1 order diffracted by the transmission type holographic optical element 8 so that the three main beams will not be split by the diffraction grating 7, and the main beams are led to the photodetector 5 beside the reflection mirror 6.

This way, the semiconductor laser device 4 and the photodetector 5 can be arranged on the almost same plane of the same base (installation member) 2, which provides easy arrangement and wire bonding of these elements. Also, because the incident beam is incident upon the diffraction grating surface 7a of the three-beam generating diffraction grating 7 almost vertically, the undulation of the diffraction grating surface 7a can be formed at equal pitches, and because the three-beam generating diffraction grating 7 and the semiconductor laser device 4 can be arranged at a large distance, the undulation of the diffraction grating surface 7a can be formed at large pitches. Furthermore, as the distance between the three-beam generating diffraction grating 7 and the semiconductor laser device 4 increases, the diffraction angle of the ±1 order diffraction lights (the sub-beams X, Y) decreases. As a result, the quantity of light getting off the objective lens 9 becomes smaller to enhance efficiency of the use of light. Moreover, since the three main beams are detected by the photodetector 5 without impinging upon the diffraction grating surface 7a of the diffraction grating 7 again, no loss of light is caused.

As a result, easy production and installation of the three-beam generating diffraction grating 7 is provided and the tracking servo can also be performed with ease.

Although the main beam and the sub-beams X, Y which are 1 order diffracted by the holographic optical element 8 are incident upon the photodetector 5 in this embodiment, the main beam and sub-beams X, Y which are −1st order diffracted may be incident upon the photodetector 5.

(2) Second Embodiment

Figure 6:
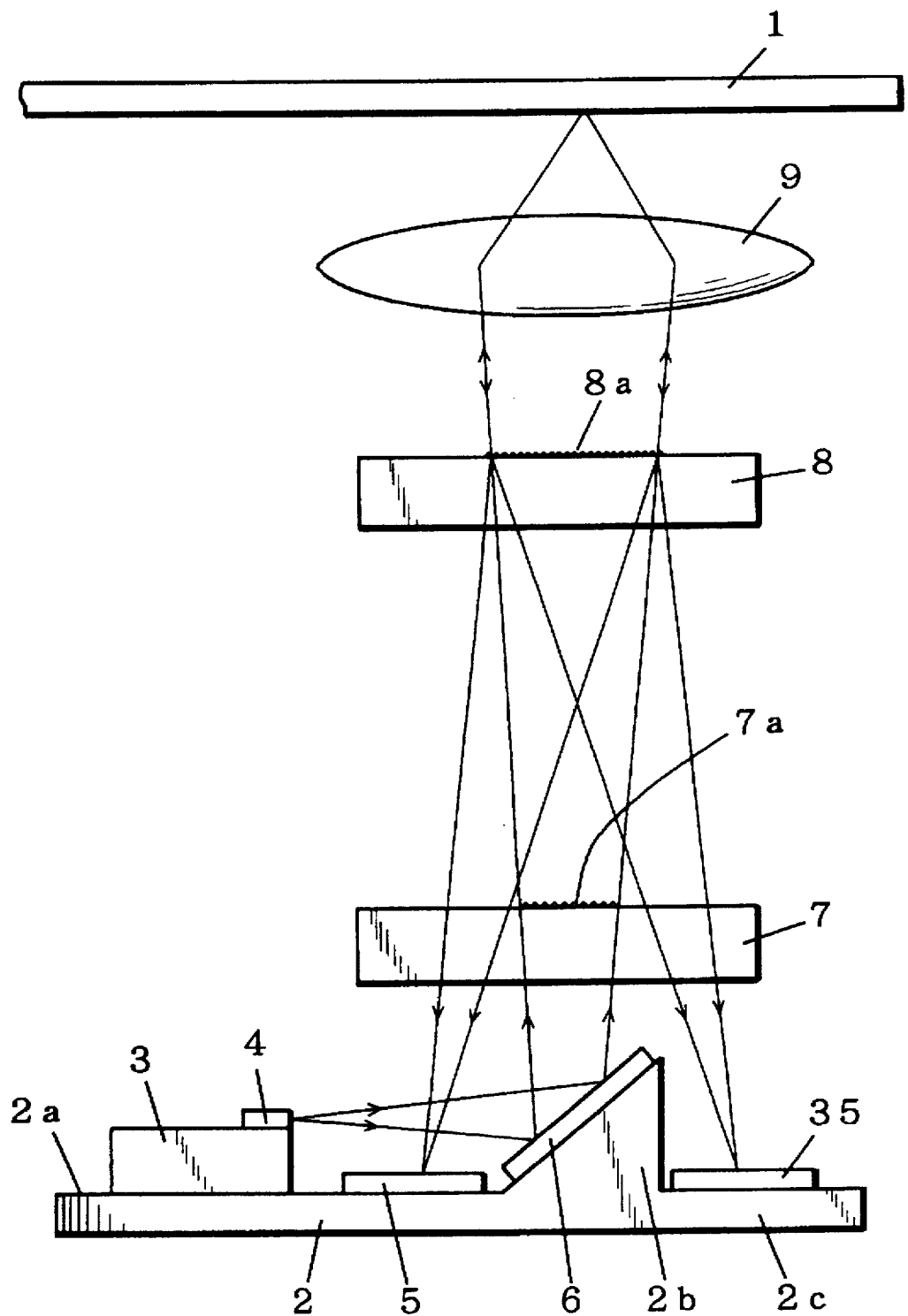
FIG. 6 is a side view showing an outline of the structure of an optical pickup apparatus according to a second embodiment of the present invention.

FIG. 6 is a side view showing an outline of the structure of an optical pickup apparatus according to the second embodiment which performs the tracking servo according to the three beam method and the focusing servo according to the astigmatism method. In the second embodiment, the same reference characters are allotted to the same or corresponding parts as those in the first embodiment, and descriptions thereof are not repeated. In FIG. 6, the reference characters of detailed parts are not shown, and electrodes and other details are not shown in the figure.

The second embodiment is different from the first embodiment in that the base 2 has another upper plane 2c on the opposite side to the upper plane 2a with respect to the inclined portion 2b and another photodetector 35 is provided on this upper plane 2c, too.

In FIG. 6, the base 2 is formed of an electrically conductive semiconductor material, such as $n^+$ type Si, or an electrically conductive metal material, such as copper, and has good thermal conductivity. The base 2 has a portion 2b inclined at an angle of 45 deg. with respect to the upper plane 2a between the upper plane 2a and the other upper plane 2c.

The signal detecting photodetector (photodetector portion) 35 having the same structure as that of the photodetector 5 in the first embodiment is provided on the upper plane 2c of the base 2. This photodetector 35 is die-bonded to the upper plane 2c on the side of an electrode not shown and electrically connected to the base 2. The return beams (the main beam and the sub-beams X, Y) of the 0th order and ±1th order diffractions which are reflected back from the optical recording medium 1 are −1st order diffracted by the holographic optical element 8 so that the return beams will not pass through the diffraction grating surface 7a of the diffraction grating 7, and condensed onto the photodetector portions of the photodetector 35 located behind the reflection mirror 6.

In this optical pickup apparatus, the tracking servo according to the three beam method can be performed well as in the first embodiment. Also, since the semiconductor laser device 4 and the photodetectors 5, 35 for signal detection are provided in the almost same plane of the same base 2, wire-bonding to these elements 4, 5, 35 is easy to perform and installation of these elements 4, 5, 35 is also easy.

In the optical pickup apparatus of the second embodiment, the signal obtained by detecting in the photodetector 5 the diffracted beam which is +1st order diffracted at the holographic optical element 8 and the signal obtained by detecting at the photodetector 35 the diffracted beam which is −1st order diffracted at the holographic optical element 8 are added by an add operation circuit not shown. The reproduction, the tracking servo according to the three beam method and the focusing servo according to the astigmatism are carried out according to the signal obtained by the addition. Accordingly, in the second embodiment, the intensities of the detection signals obtained from the diffracted beams are larger than that of the first embodiment, resulting in higher reliability of performance.

If two photodetectors are used as in the second embodiment, they are appropriately arranged on the base 2 so that the diffracted beam which is +1st order diffracted at the holographic optical element 8 is condensed to one photodetector and the diffracted beam which is −1st order diffracted is condensed to the other photodetector, and other light beams than the corresponding diffracted beams will not substantially be incident upon the two photodetectors.

In the first and second embodiments described above, the holographic optical element 8 has a holographic functional surface 8a on its upper surface and the diffraction grating 7 has the diffraction grating surface 7a on its upper surface, but the holographic functional surface 8a may be provided on the lower surface of the holographic optical element 8 and the diffraction grating surface 7a may be provided on the lower surface of the diffraction grating 7.

(3) Third Embodiment

Figure 7:
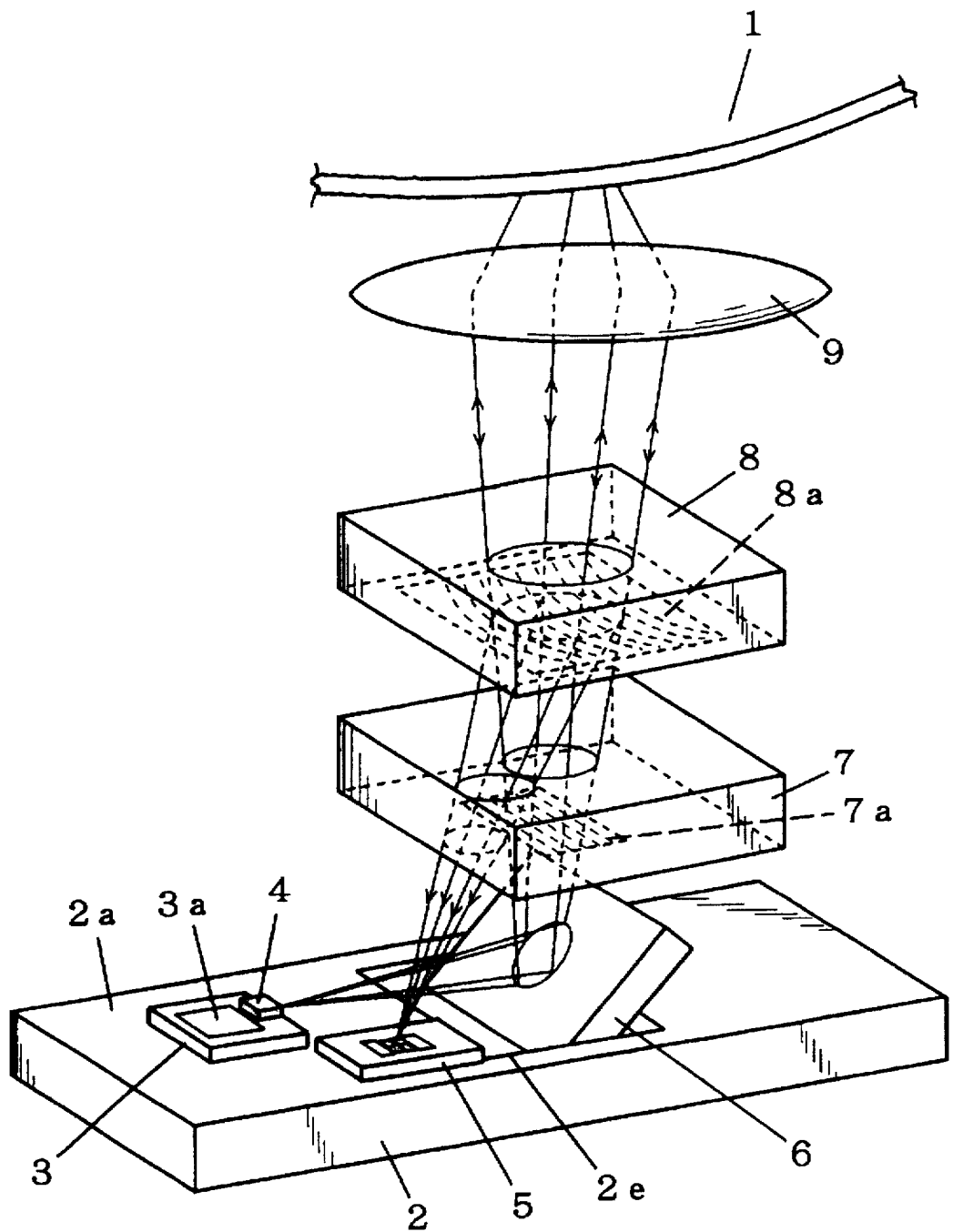
FIG. 7 is a perspective view showing an outline of the structure of an optical pickup apparatus according to a third embodiment of the present invention.
Figure 8:
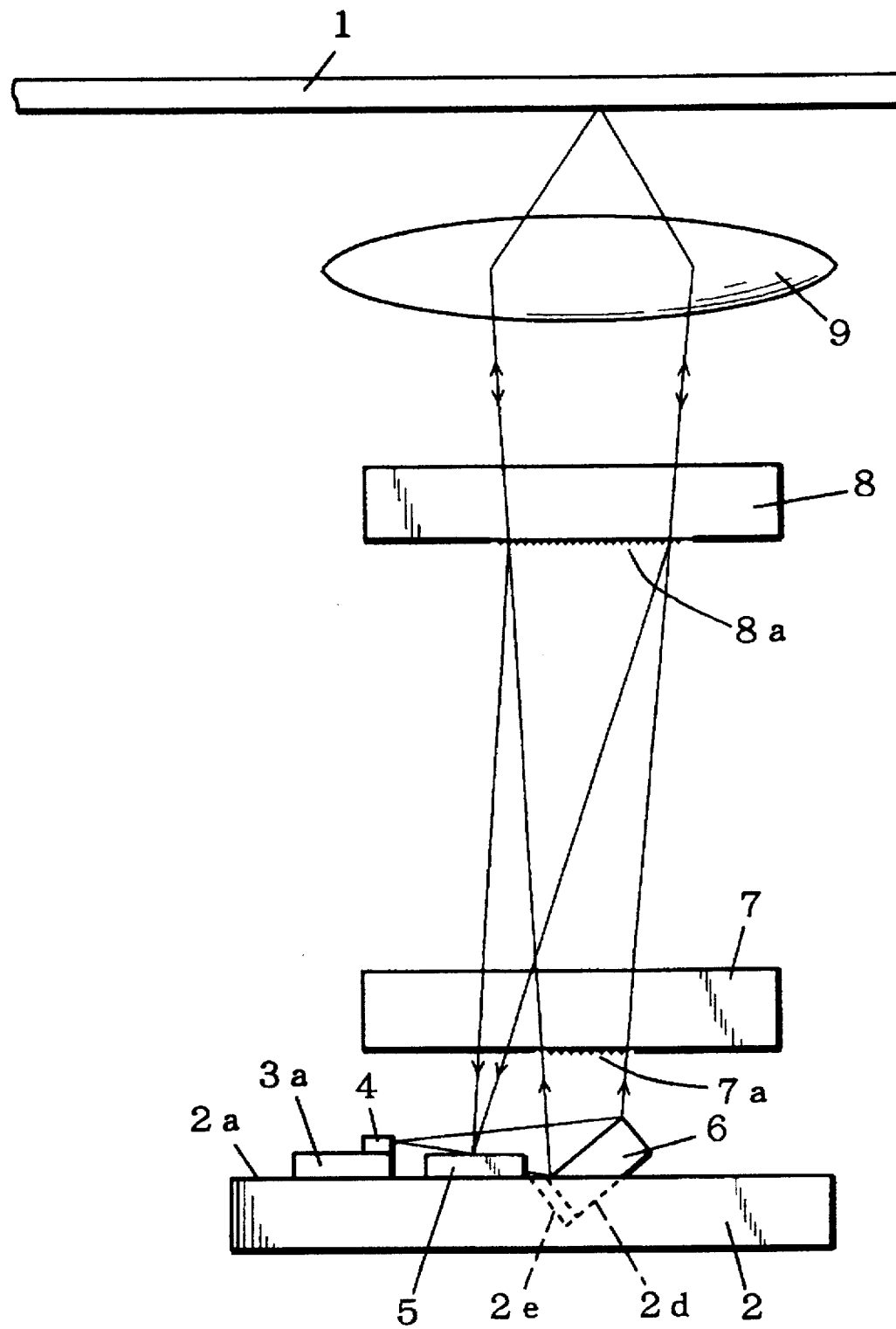
FIG. 8 is a side view showing an outline of the structure of the optical pickup apparatus of the third embodiment.

FIG. 7 and FIG. 8 are a perspective view and a side view showing an outline of the structure of an optical pickup apparatus according to the third embodiment which carries out the tracking servo according to the three beam method and the focusing servo according to the astigmatism method. In the third embodiment, the same reference characters are allotted to the same or corresponding parts in the first embodiment and description thereof is not made here. Details such as electrodes are not shown in FIG. 7 and FIG. 8.

The third embodiment is different from the first embodiment in that a base 2 has its upper surface flat in all the area with a concave portion 2e having an inclined surface (inclined portion) 2d formed in its upper surface and a reflection mirror 6 is provided on the inclined surface 2d, and that the direction of the holographic functional surface 8a of the holographic optical element 8 and the direction of the diffraction grating surface 7a of the diffraction grating 7 differ.

In FIG. 7 and 8, the base 2 is formed of a semiconductor material, such as Si, or an electrically conductive metal material, such as copper, in the same way as the first embodiment. The concave portion 2e having the inclined surface 2d at an angle of 45 deg. with respect to the upper plane 2a is formed in the upper plane 2a of the base 2. The reflection mirror 6 is fixed on the inclined surface 2d of the concave portion 2e. The transmission type three-beam generating diffraction grating 7 is disposed above the reflection mirror 6.

As the third embodiment has substantially the same structure as the first embodiment except the way of mounting the reflection mirror 6, it has the same effects as the first embodiment.

Although the base having electric conductivity and good thermal conductivity is used in the first through third embodiments, a base may be used which is formed of resin, or the like, which is electrically non-conductive and having poor thermal conductivity. In such a case, an electrode can be formed without through an insulating layer on the base 2. Because the structure can not be adopted where a common electrode is provided on the back side of the base 2 since the base 2 and the heat sink 3 are not electrically connected, design must be altered, and an electrode for the heat sink 3 will instead be provided on the base 2, for example. In the embodiments below, examples with the base 2 formed of an electrically non-conducting material will be described.

(4) Fourth Embodiment

Figure 9:
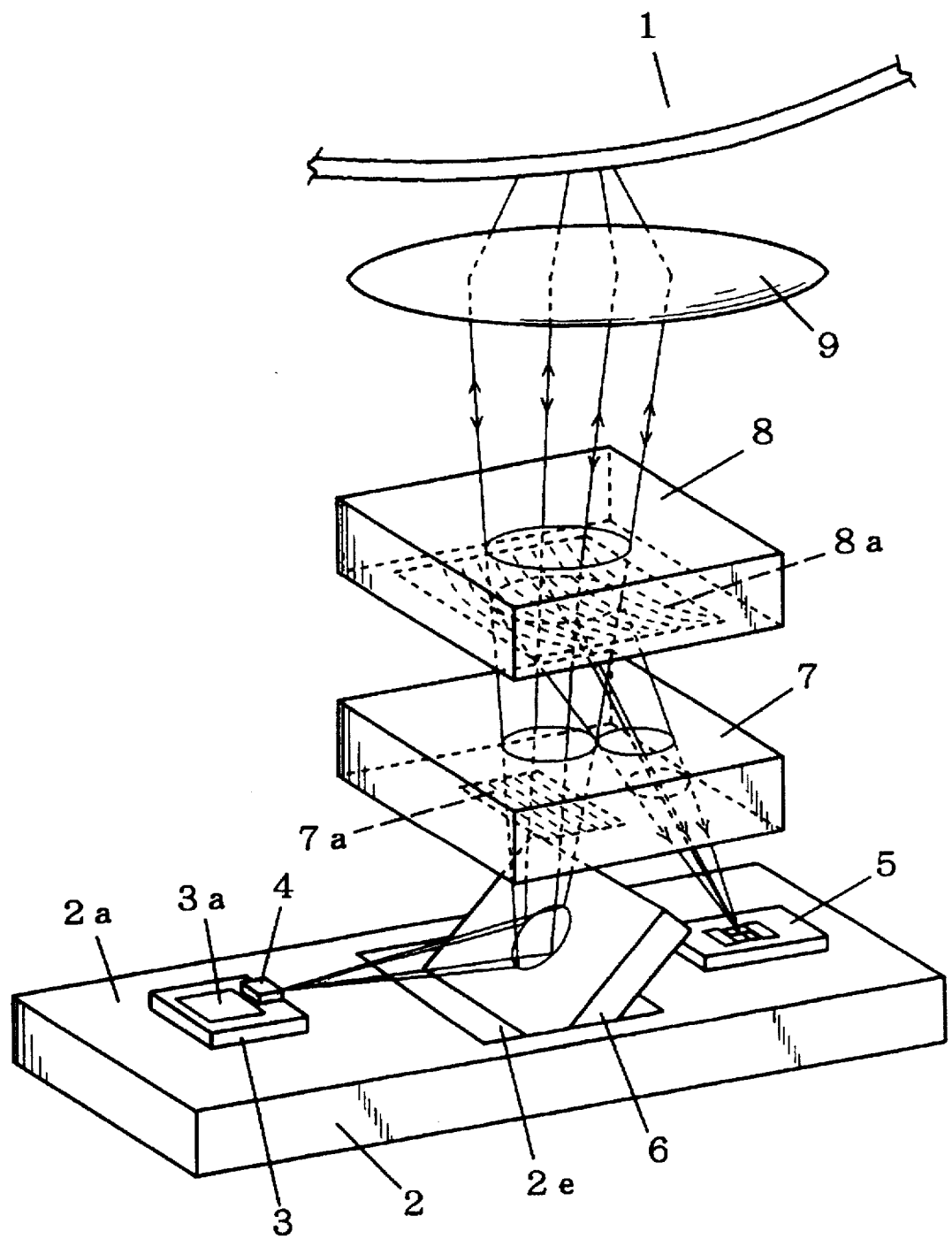
FIG. 9 is a perspective view showing an outline of the structure of an optical pickup apparatus according to a fourth embodiment of the present invention.
Figure 10:
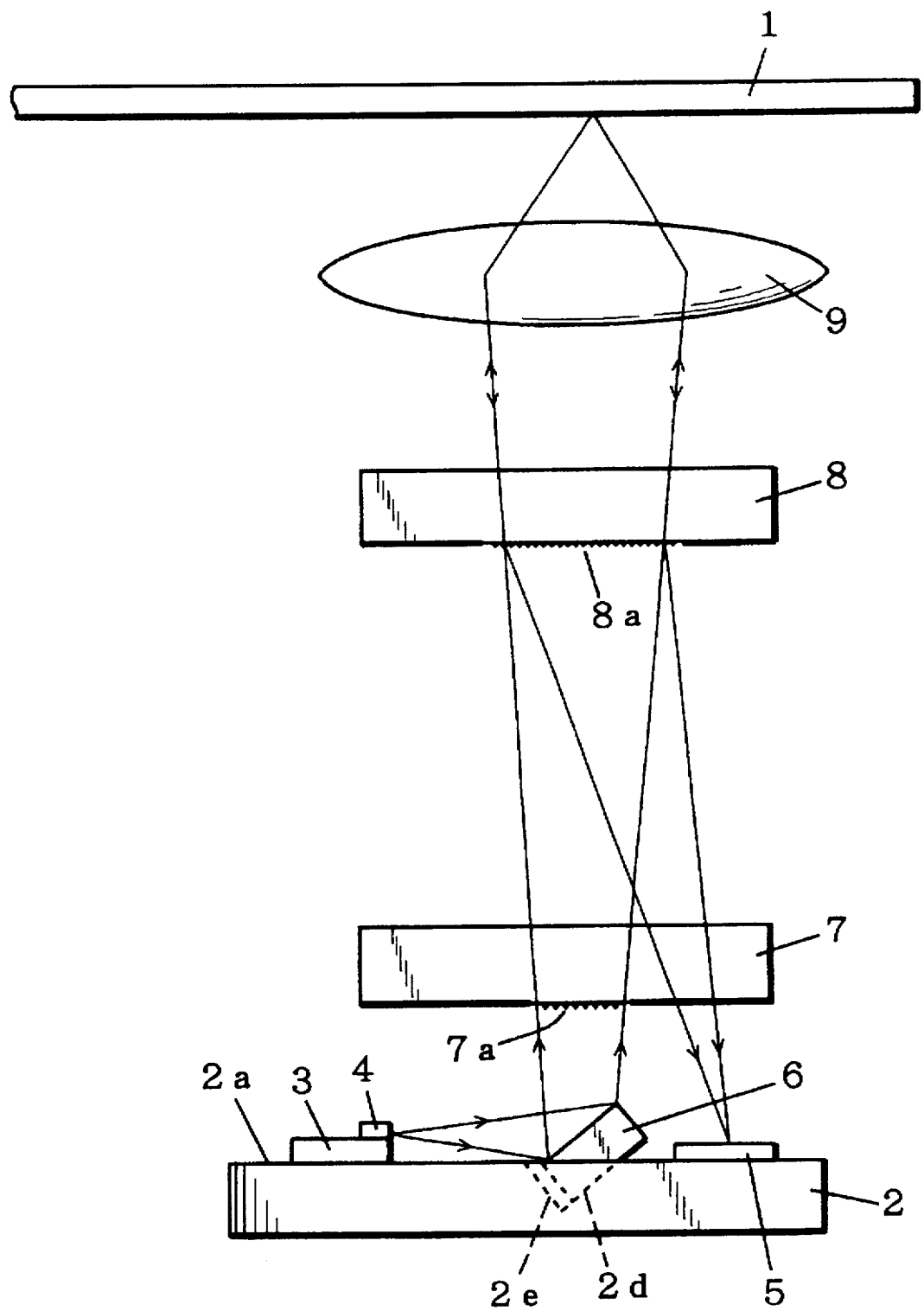
FIG. 10 is a side view showing an outline of the structure of the optical pickup apparatus of the fourth embodiment.

FIG. 9 and FIG. 10 are a perspective view and a side view showing an outline of the structure of an optical pickup apparatus according to the fourth embodiment which performs the tracking servo according to the three beam method and the focusing servo according to the astigmatism method. In the fourth embodiment, the same reference characters are allotted to the same or corresponding parts in the third embodiment, and description thereof is not given here. In FIG. 9 and FIG. 10, details, such as electrodes, are not shown.

The fourth embodiment is considerably different from the third embodiment in that the semiconductor laser device 4, the reflection mirror 6 and the photodetector 5 are aligned on a single line in this order.

In FIG. 9 and FIG. 10, the base 2 is formed of an electrically non-conducting material, such as resin. Formed on the upper plane 2a of the base 2 is the concave portion 2e having the surface 2d inclined at an angle of 45 deg. with respect to its upper surface 2a. The reflection mirror 6 is fixed on the inclined surface 2d of the concave portion 2e. This reflection mirror 6 is so arranged as to face the semiconductor laser device 4 as has been described above, and it reflects upward the laser beam emitted from the front end of the semiconductor laser device 4.

The photodetector 5 is disposed on the upper plane 2a of the base 2 on the opposite side to the semiconductor laser device 4 with the reflection mirror 6 interposed therebetween. That is to say, the semiconductor laser device 4, the reflection mirror 6 and the photodetector 5 are arranged on the upper plane 2a on a single line in this order. As describe above, as the photodetector 5 is located at the back of the reflection mirror 6 (behind the reflection mirror 6), the reflection mirror 6 functions as a light shielding member for the photodetector 5. As a result, it is prevented that the stray lights caused as the laser beam emitted from the front end of the semiconductor laser device 4 are reflected by the reflection mirror 6, and the like, and that the laser beam emitted and spread from the front end are incident upon the photodetector 5.

Figure 11:
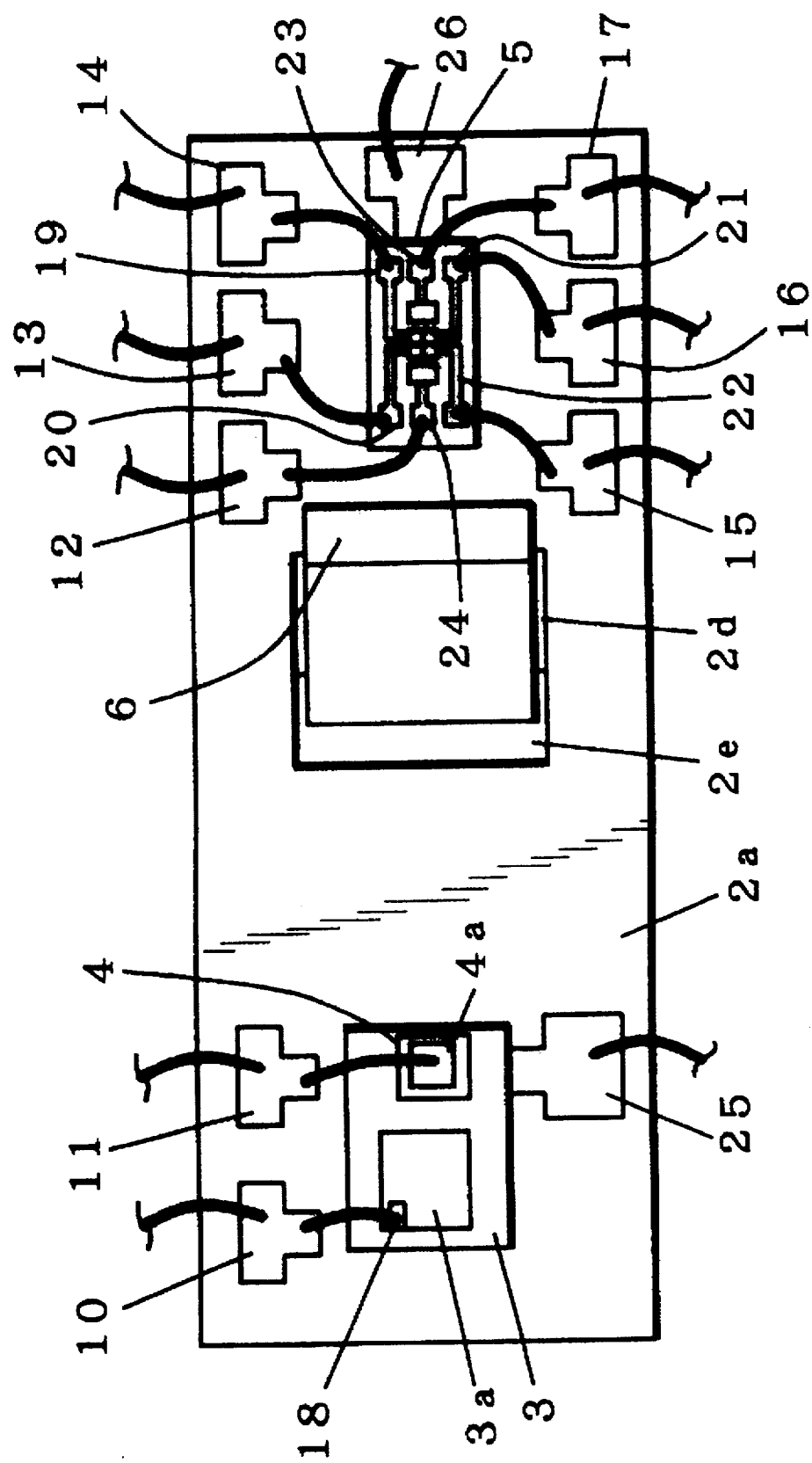
FIG. 11 is a top view of the base in the optical pickup apparatus of the fourth embodiment.

FIG. 11 is a top view of the base 2 of the optical pickup apparatus, which shows electrodes, bonding wires and details of the photodetector 5, which are not shown in FIG. 9 and FIG. 10. In FIG. 11, the same reference characters are allotted to the same or corresponding parts in the first or third embodiment, and the description thereof is not repeated. In this embodiment, as an electrically non-conducting base is used as the base 2, an outgoing electrode 25 for the heat sink 3 and an outgoing electrode 26 for the photodetector 5 are provided.

The fourth embodiment has the substantially same structure as that of the third embodiment except the position of installation of the photodetector 5, and it has the same effects as those of the third embodiment. Further, because the reflection mirror 6 functions as a light shielding member for the photodetector 5, the sensitivity of the photodetector 5 increases.

In the fourth embodiment, since the semiconductor laser device 4, the reflection mirror 6 and the photodetector 5 are arranged on the same line, the width of the base 2 can be reduced. As a result, the thickness of the optical pickup apparatus can be reduced with the structure of the fifth embodiment described below.

Usually, a certain distance is necessary between the semiconductor laser device 4 and the objective lens 9. For example, in a compact disk apparatus, a distance of about 20 mm is required. In order to reduce the thickness of the optical pickup apparatus, it is desirable not to arrange the holographic optical element 8 and the objective lens 9 on the same line, but to dispose light reflecting means, such as a reflection mirror, between the holographic optical element 8 and the objective lens 9 so that the holographic functional surface 8a of the holographic optical element 8 and the objective lens 9 intersect at a right angle. The fifth embodiment with such structure will now be described.

(5) Fifth embodiment

Figure 12:
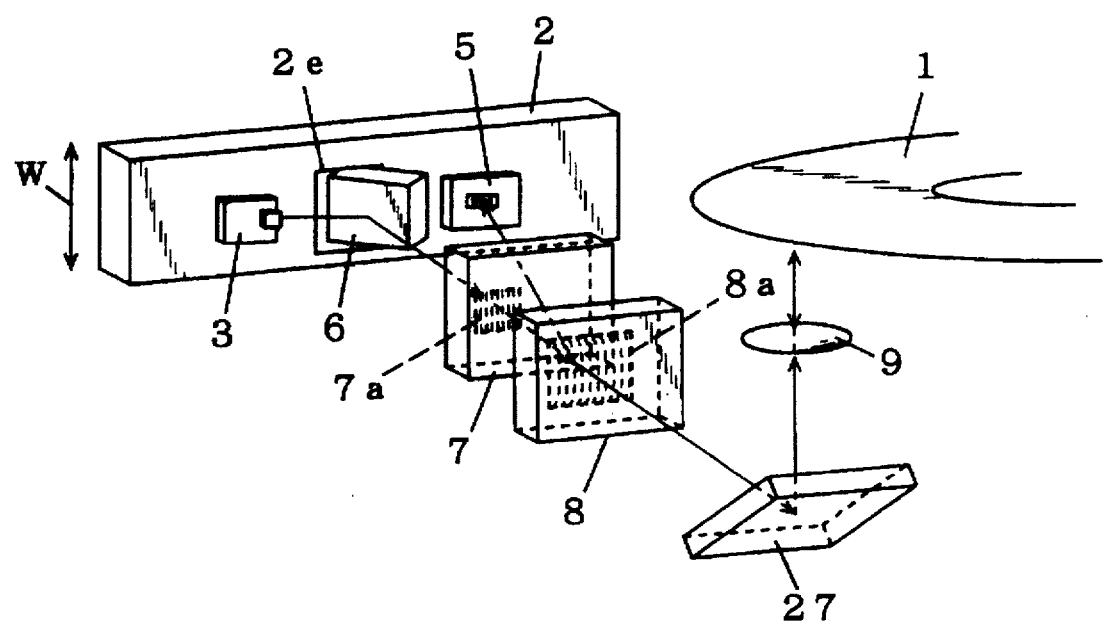
FIG. 12 is a perspective view showing an outline of the structure of an optical pickup apparatus according to a fifth embodiment of the present invention.

FIG. 12 is a perspective view showing an outline of the structure of an optical pickup apparatus according to the fifth embodiment which conducts the tracking servo according to the three beam method and the focusing servo according to the astigmatism method.

The fifth embodiment is different from the fourth embodiment in that a reflection mirror 27 as light reflection means is disposed between the holographic optical element 8 and the objective lens 9. In the fifth embodiment the same reference characters are allotted to the same or corresponding parts in the fourth embodiment and it is shown in a simplified form.

In the fifth embodiment, the laser element 4, the reflection mirror 6 and the photodetector 5 are arranged on a single line and the reflection mirror 27, or the like, is provided between the holographic optical element 8 and the objective lens 9. Hence, the diffraction grating surface 7a of the diffraction grating 7 and the holographic functional surface 8a of the holographic optical element 8 are perpendicular to the objective lens 9 and the recording surface of the optical recording medium 1. As a result, the thickness of the optical pickup apparatus can be reduced in the direction designated by the arrow W.

Although the three-beam generating diffraction grating 7 and the transmission type holographic optical element 8 are used in the first through fifth embodiments above, a transparent member having a three-beam generating diffraction grating surface on one of its opposing surfaces and a holographic functional surface on the other surface may be used. Now, examples with such a transparent member applied to the first and third embodiments will be described as the sixth and seventh embodiments.

(6) Sixth Embodiment

Figure 13:
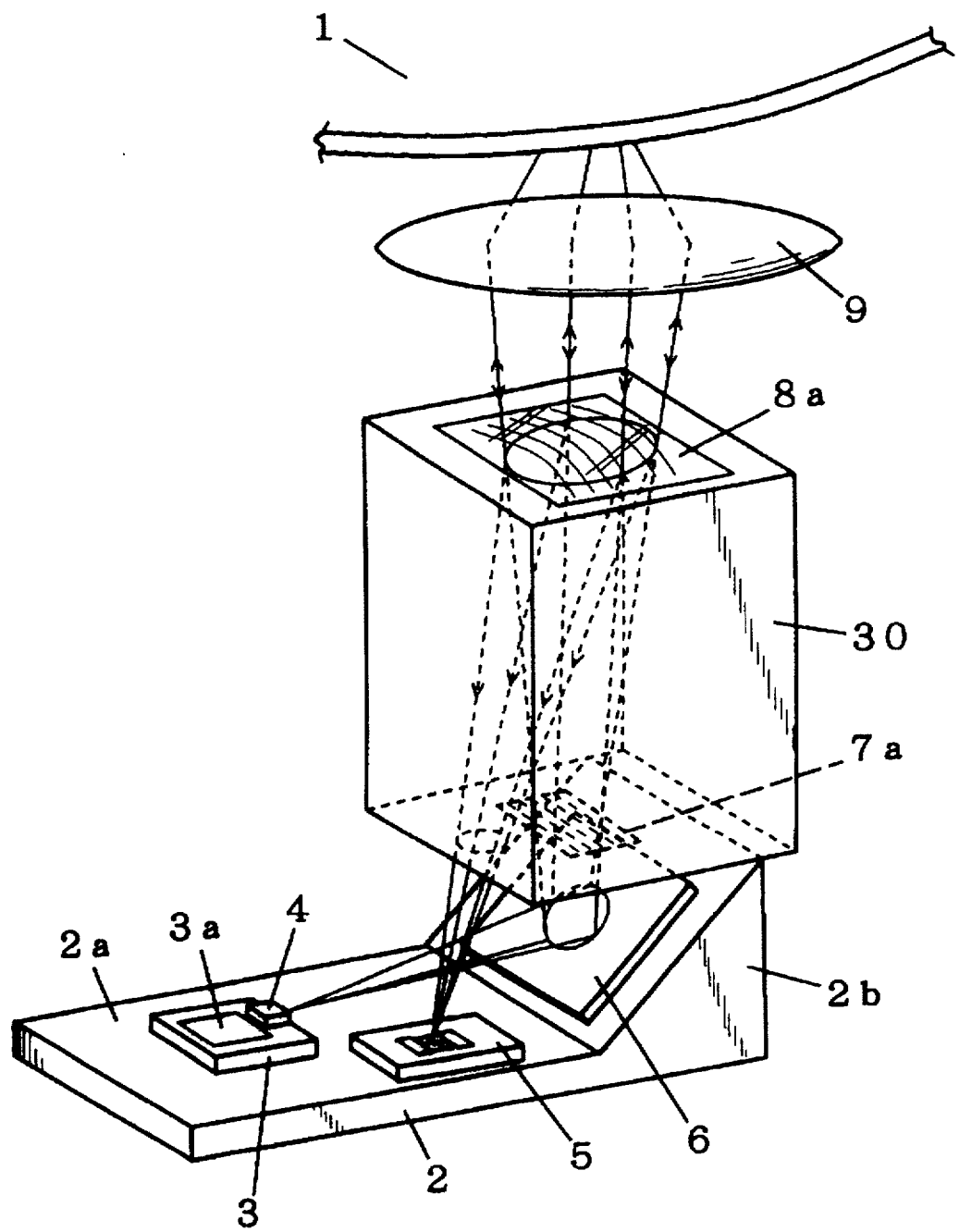
FIG. 13 is a perspective view showing an outline of the structure of an optical pickup apparatus according to a sixth embodiment of the present: invention.
Figure 14:
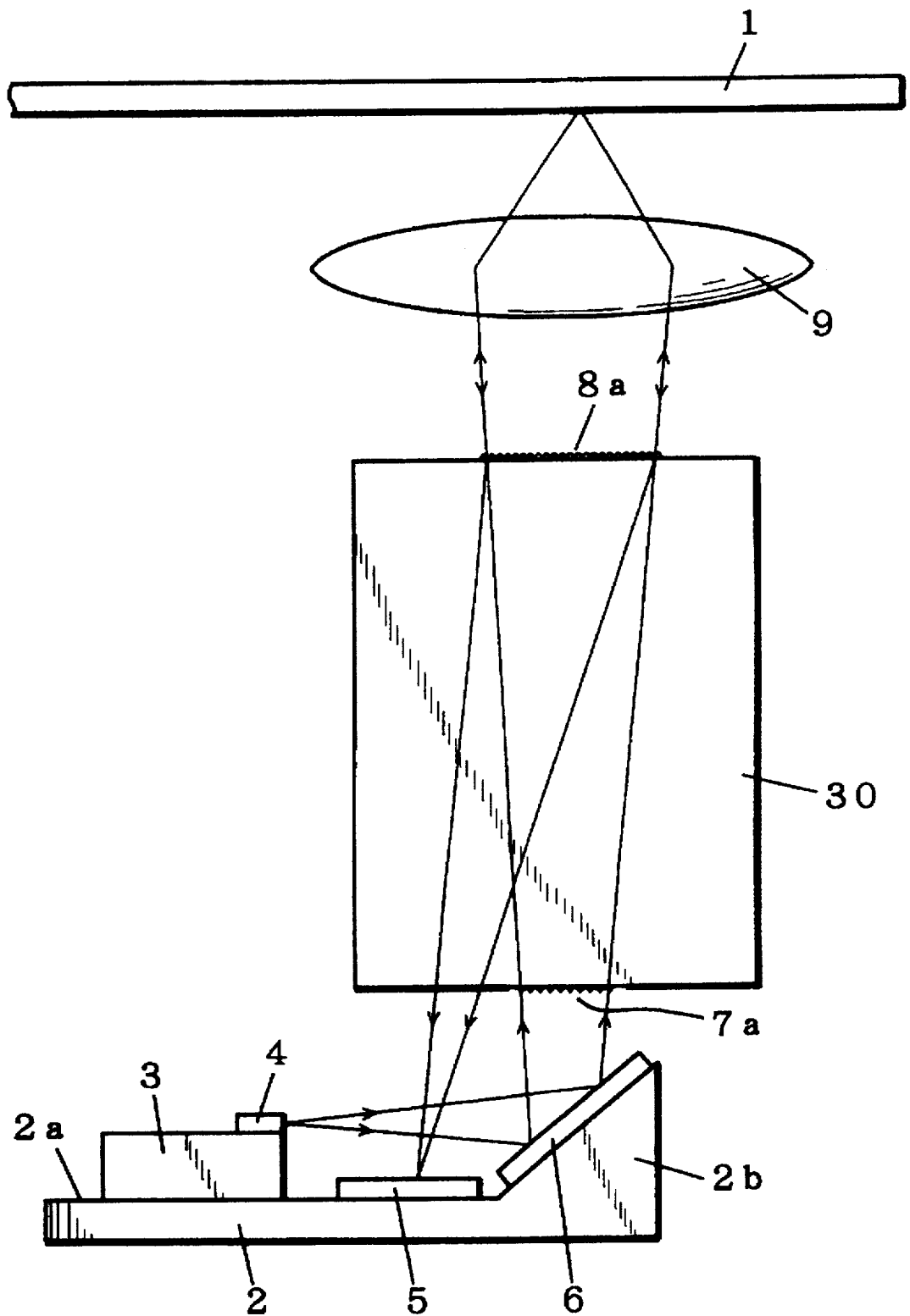
FIG. 14 is a side view showing an outline of the structure of the optical pickup apparatus of the sixth embodiment.

FIG. 13 and FIG. 14 are a perspective view and a side view showing an outline of the structure of an optical pickup apparatus according to the sixth embodiment which performs the tracking servo according to the three beam method and the focusing servo according to the astigmatism method.

The sixth embodiment is different from the first embodiment in that a transparent member 30 formed of glass, or resin, or the like, is used in place of the three-beam generating diffraction grating 8 and the transmission type holographic optical element 7. A transmission type three-beam generating diffraction grating surface 7a is formed on one of opposing surfaces of the transparent member 30 and a transmission type holographic functional surface 8a is formed on the other surface. The functions of the transmission type three-beam generating diffraction grating surface 7a and the transmission type holographic functional surface 8a are the same as those in the first embodiment, and the description thereof is not repeated here.

(7) Seventh Embodiment

Figure 15:
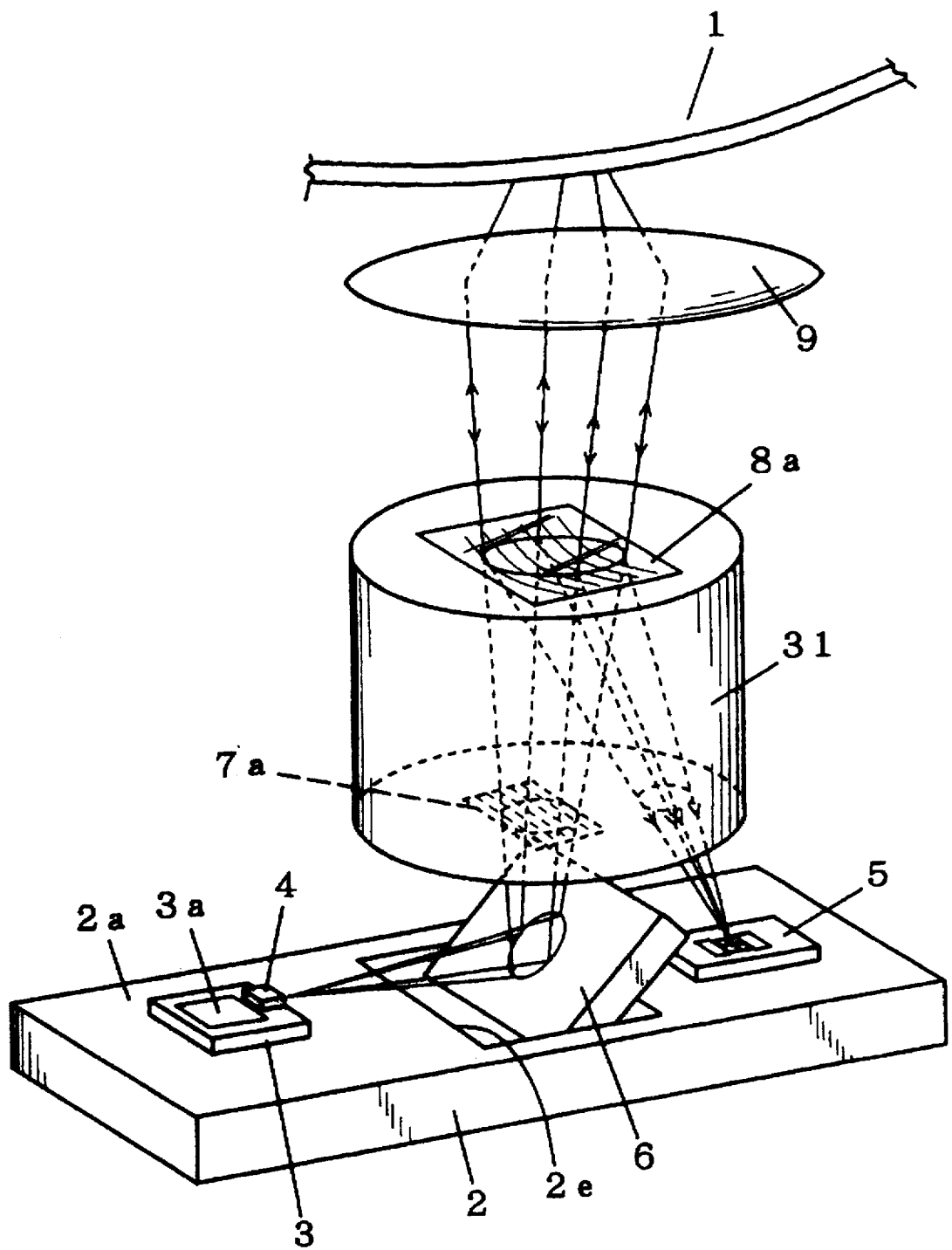
FIG. 15 is a perspective view showing an outline of the structure of an optical pickup apparatus according to a seventh embodiment of the present invention.
Figure 16:
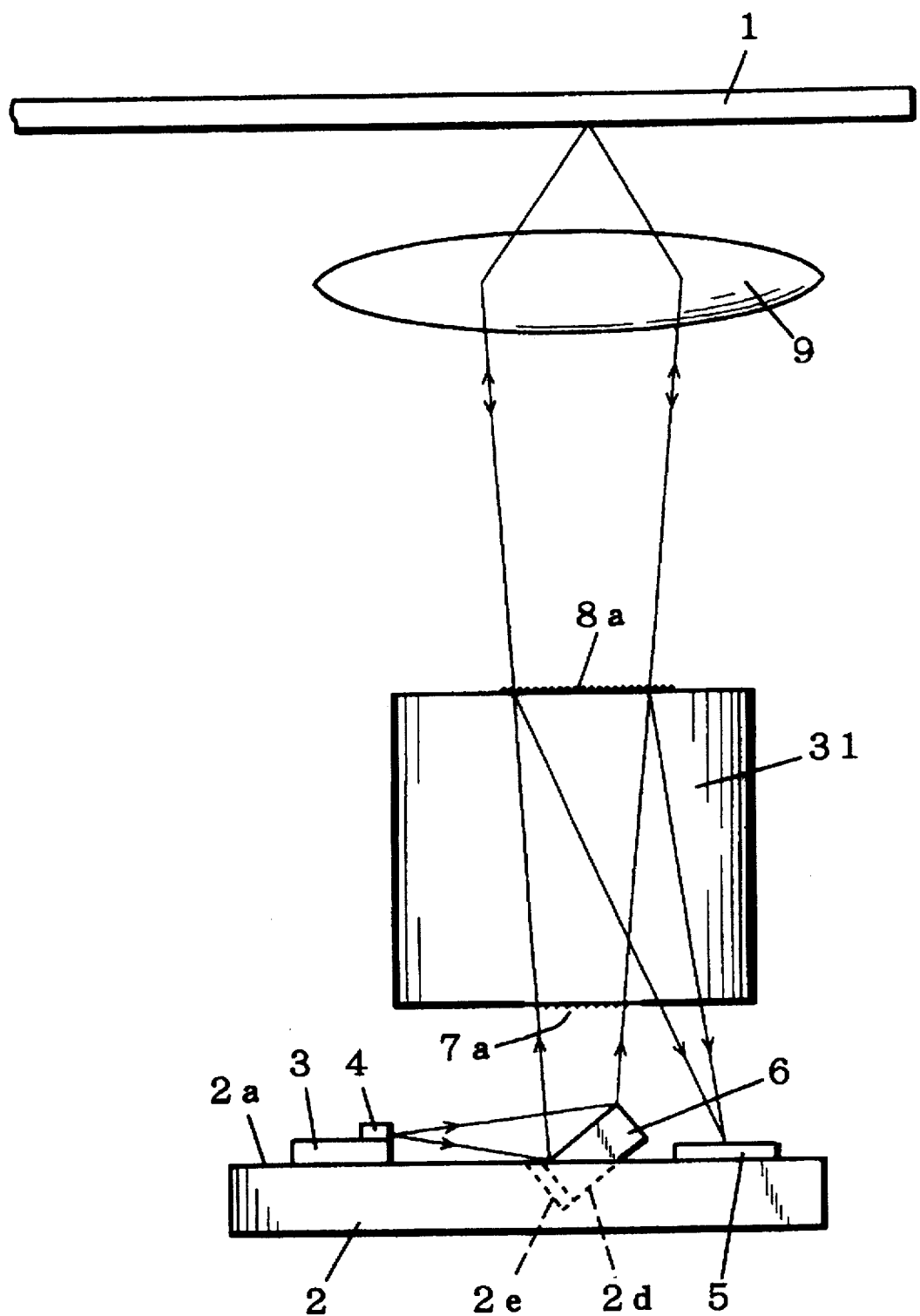
FIG. 16 is a side view showing an outline of the structure of the optical pickup apparatus of the seventh embodiment.

FIG. 15 and FIG. 16 are a perspective view and a side view showing an outline of the structure Of an optical pickup apparatus according to the seventh embodiment which performs the tracking servo according to the three beam method and the focusing servo according to the astigmatism method.

The seventh embodiment is different from the third embodiment in that a transparent member 31 formed of glass, or resin, or the like, is used instead of the three-beam generating diffraction grating 7 and the transmission type holographic optical element 8. The transmission type three-beam generating diffraction grating surface 7a is formed on one of opposing surfaces of the transparent member 31 and the transmission type holographic functional surface 8a is formed on the other surface. The functions of the transmission type three-beam generating diffraction grating surface 7a and the transmission type holographic functional surface 8a are the same as those in the third embodiment, and the description thereof is not repeated here.

In the first through seventh embodiments, as the semiconductor laser device 4 and the photodetector 5 are provided on the same plane, installation of elements is easy.

Although the semiconductor laser device 4 and the photodetector 5 are provided on the same plane of the base 2 in the first through seventh embodiments, the base 2 may have a step portion including upper planes formed in parallel to each other and the semiconductor laser device and the photodetector 5 may be formed on the different upper planes. In this case, the step portion can be used as a reference for element installation, which provides still easier positioning of elements.

Figure 17:
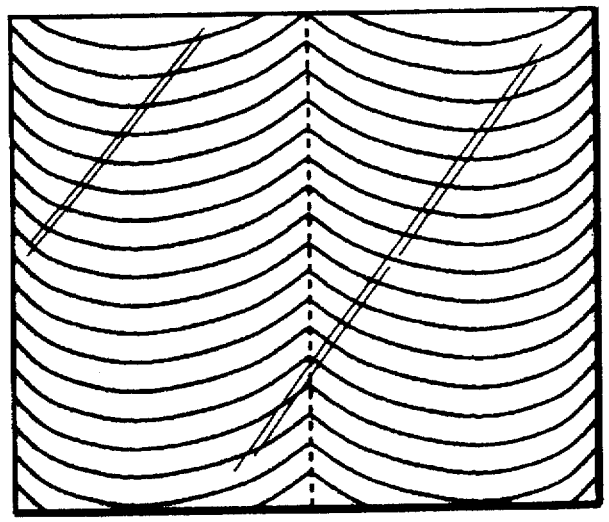
FIG. 17 is a top view of a transmission type holographic optical element used in tire spot size detection method.

Although the focusing servo is carried out by the astigmatism method in the embodiments above, the focusing servo may be carried out according to other methods. For example, using a transmission type holographic functional surface having a grating form shown in FIG. 17 in place of the holographic functional surface 8a and using a photodetector shown in FIG. 18 in place of the photodetectors 5 and 35, the focusing servo may be effected by the spot size detection method.

In this case, the main beam and the sub-beams X and Y are respectively split into two by the holographic optical element and +1st order diffracted (or −1st order diffracted), and the two beams enter the photodetector portions A, C and the photodetector portions B, D, and the two sub-beams X and Y enter the photodetector portions E, F, to form the main spots m and the sub-spots x, y, respectively. In this case, the FE signal, the TE signal and the reproduction signal can be given as follows.

FE signal=(A1−C1)−(B1−D1)

TE signal=E1−F1

Reproduction signal=A1+B1+C1+D1

Figure 18:
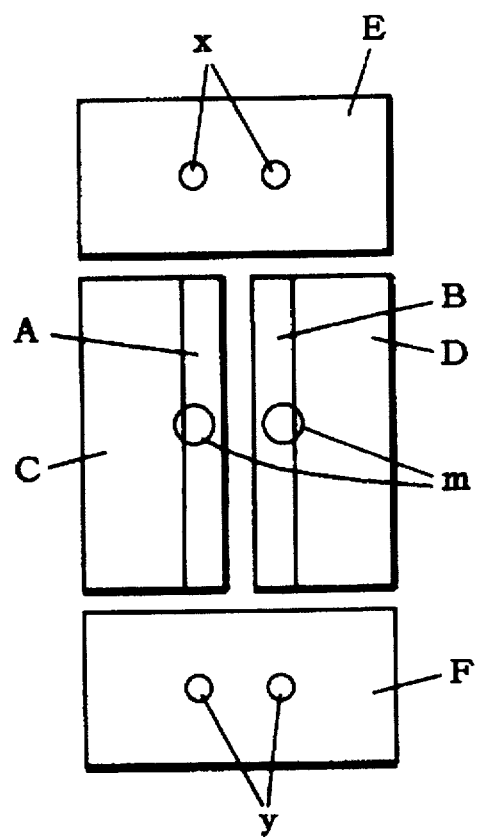
FIG. 18 is a top view of a photodetector used in the spot size detection method.

In the expressions above, A1 through F1 indicate detection intensities at the photodetector portions A–F shown in FIG. 18.

Figure 19:
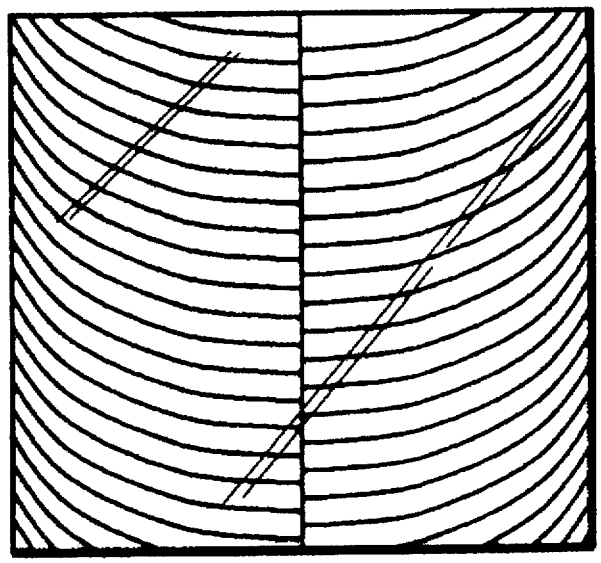
FIG. 19 is a top view of a transmission type holographic optical element used in the Foucault method.
Figure 20:
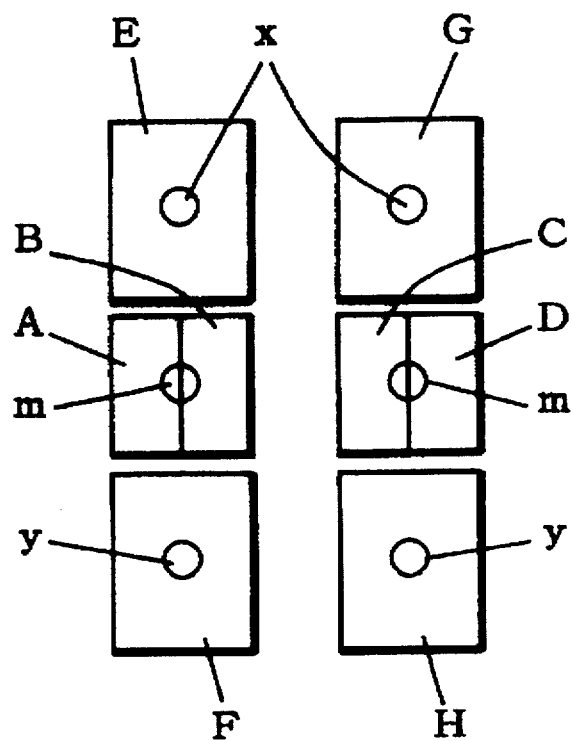
FIG. 20 is a top view of a photodetector used in the Foucault method.

The focusing servo may be carried out by the Foucault method using the holographic optical element having the grating form shown in FIG. 19 in place of the holographic functional surface 8a and the photodetector shown in FIG. 20 in place of the photodetectors 5, 35.

In such a case, the main beam and the sub-beams X, Y are respectively divided into two to impinge upon the photodetector portions A–H to produce the main spots m and the sub-spots x, y, respectively. Then, the FE signal, the TE signal and the reproduction signal can be given as follows.

FE signal=(A1+D1)−(B1+C1)

TE signal=(E1+G1)−(F1+H1)

Reproduction signal=A1+B1+C1+D1

In the expressions above, A1 through H1 denote detection intensities at the photodetector portions A–H shown in FIG. 20. Although the photodetectors 5, 35, the heat sink 3 having the photodiode 3a, and the like, are provided separately on the base 2, the photodetector portions of the photodetectors 5, 35 and the photodiode 3a, or at least one of them may be formed directly in the base 2 using the semiconductor process such as the diffusion method etc. in the same way as the photodiode 3a. This case is included in the cases where the photodetectors 5, 35 and the photodiode 3a are provided on the base 2.

When such structure is applied to the first and second embodiments, the photodetector portions are formed by the semiconductor process on the plate-like base 2, and then the inclined portion 2b as a separate member is attached by an adhesive material, or the like. In this case, an inclined portion having a reflection mirror directly formed thereon may be used.

Furthermore, as diffraction of 2 or higher order is performed in the above-described transmission type diffraction grating surface and the transmission type holographic functional surface, it is desirable to set the optical system so that these diffraction beams of 2 or higher order will not enter the photodetector portions, but it will not cause a serious problem even if such diffraction beams of 2 or higher order enter the photodetector portions, for such diffraction beams have very small intensity. The position of the photodetector portions can be appropriately selected, which must be followed by modification of the grating form of the transmission holographic optical element, and the like. In addition, molding such optical pickup apparatus with clear (transparent) resin will provide prevention of dew condensation and the reduction of cost.

(8) Eighth Embodiment

Figure 21:
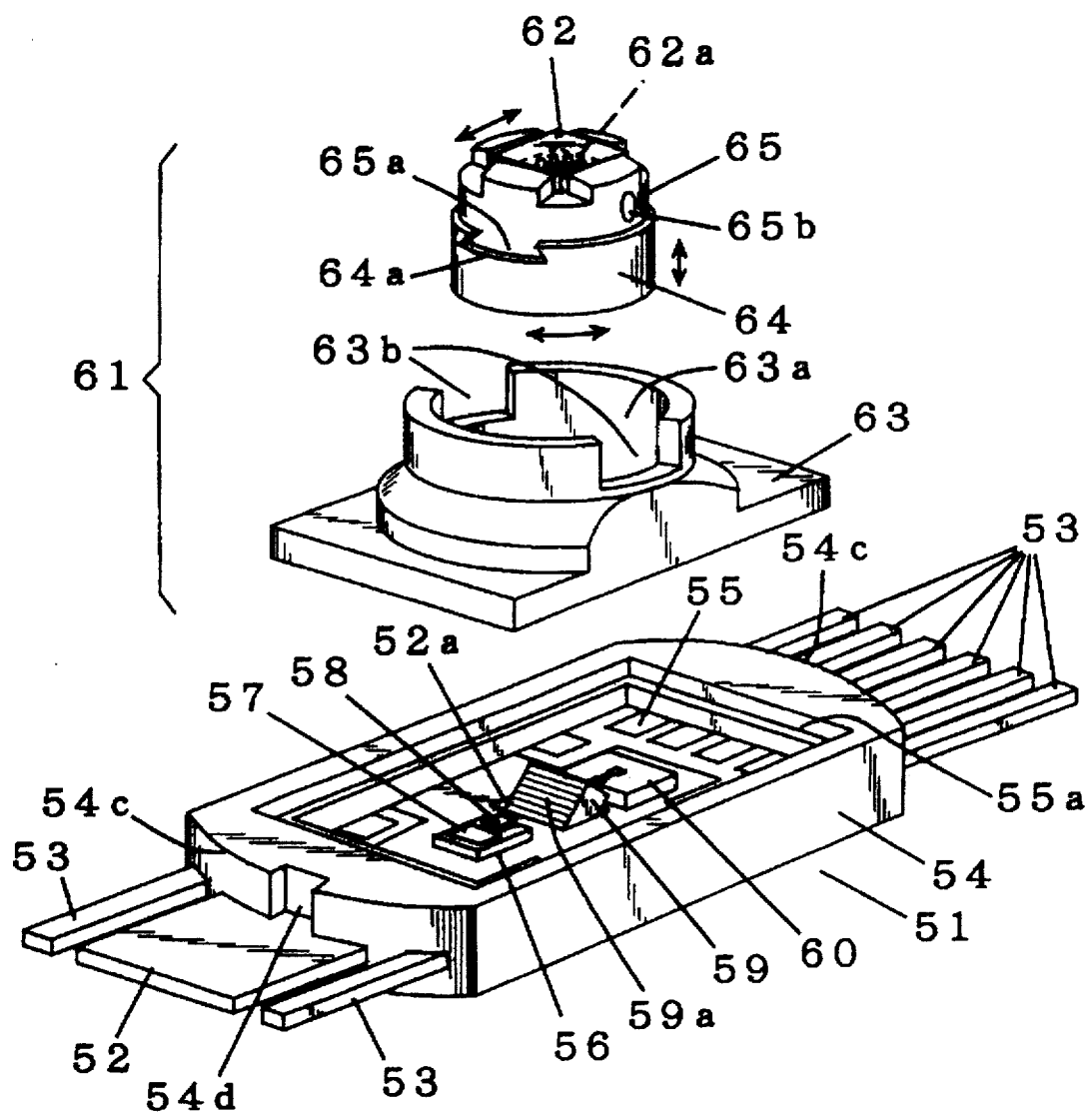
FIG. 21 is a partially exploded perspective view of a semiconductor laser apparatus according to an eighth embodiment of the present invention.
Figure 22:
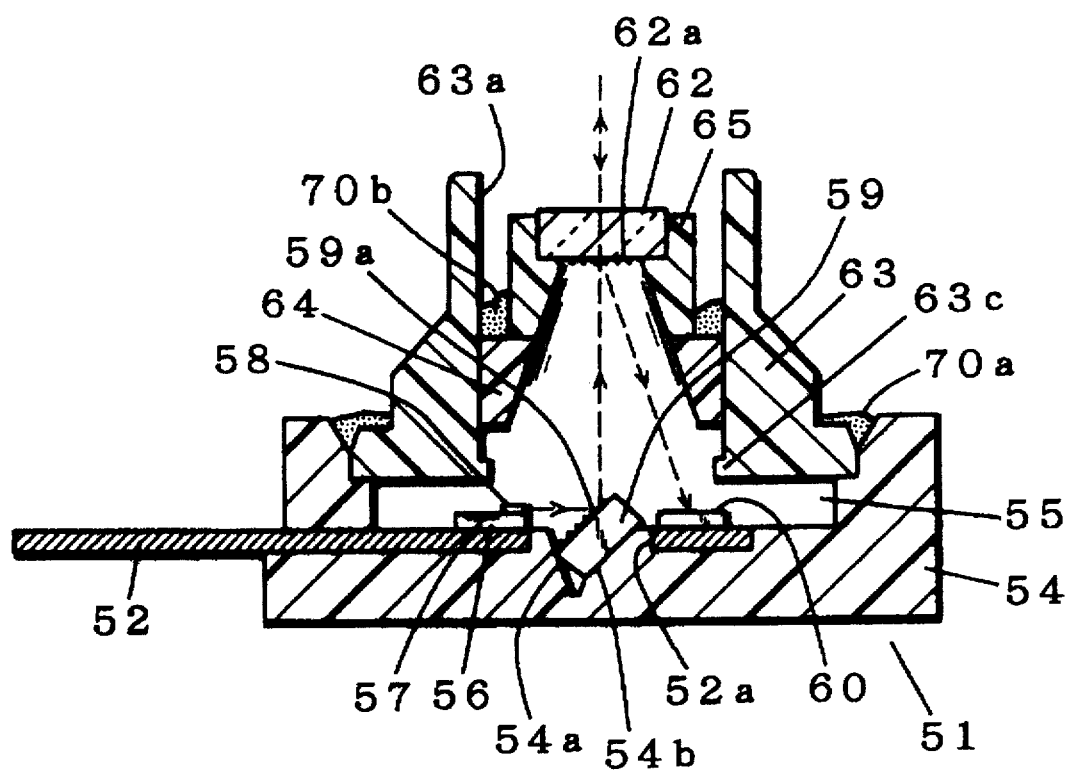
FIG. 22 is a sectional view of the semiconductor laser apparatus of the eighth embodiment of the present invention.
Figure 23:
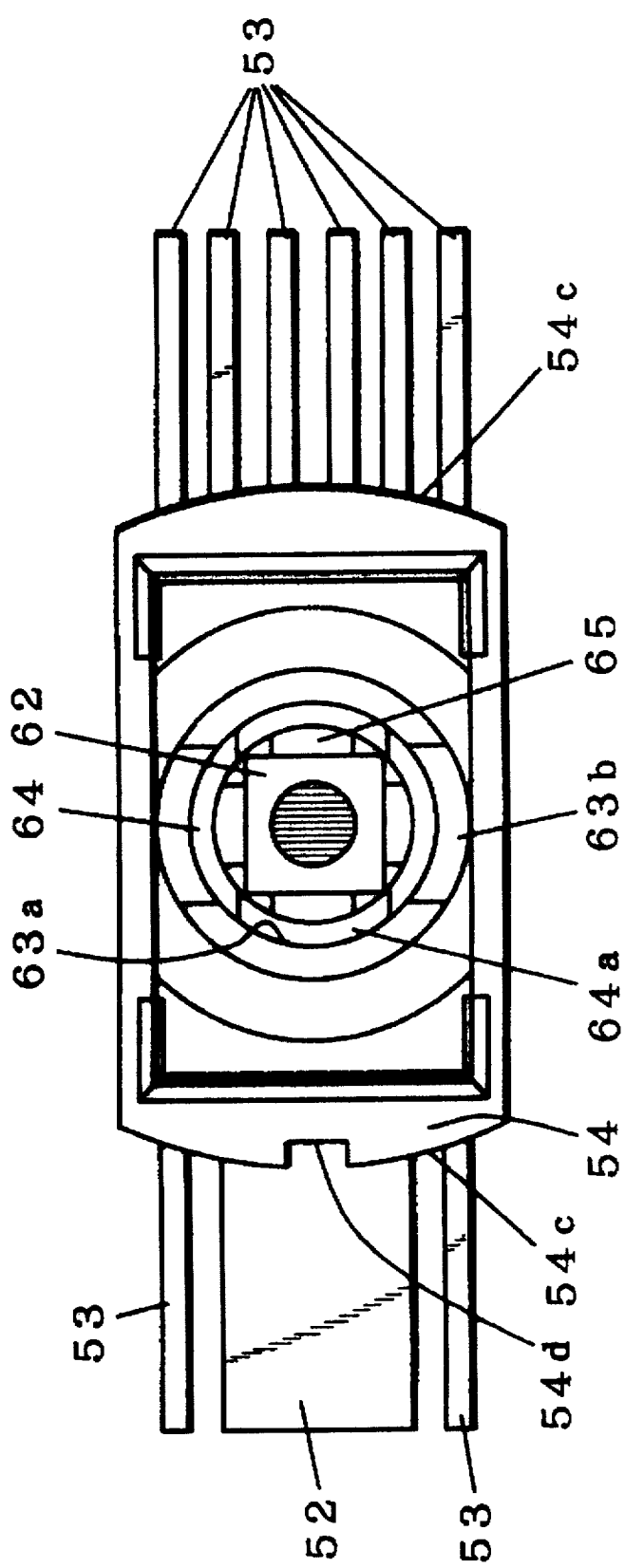
FIG. 23 is a top view of the semiconductor laser apparatus of the eighth embodiment.
Figure 24:
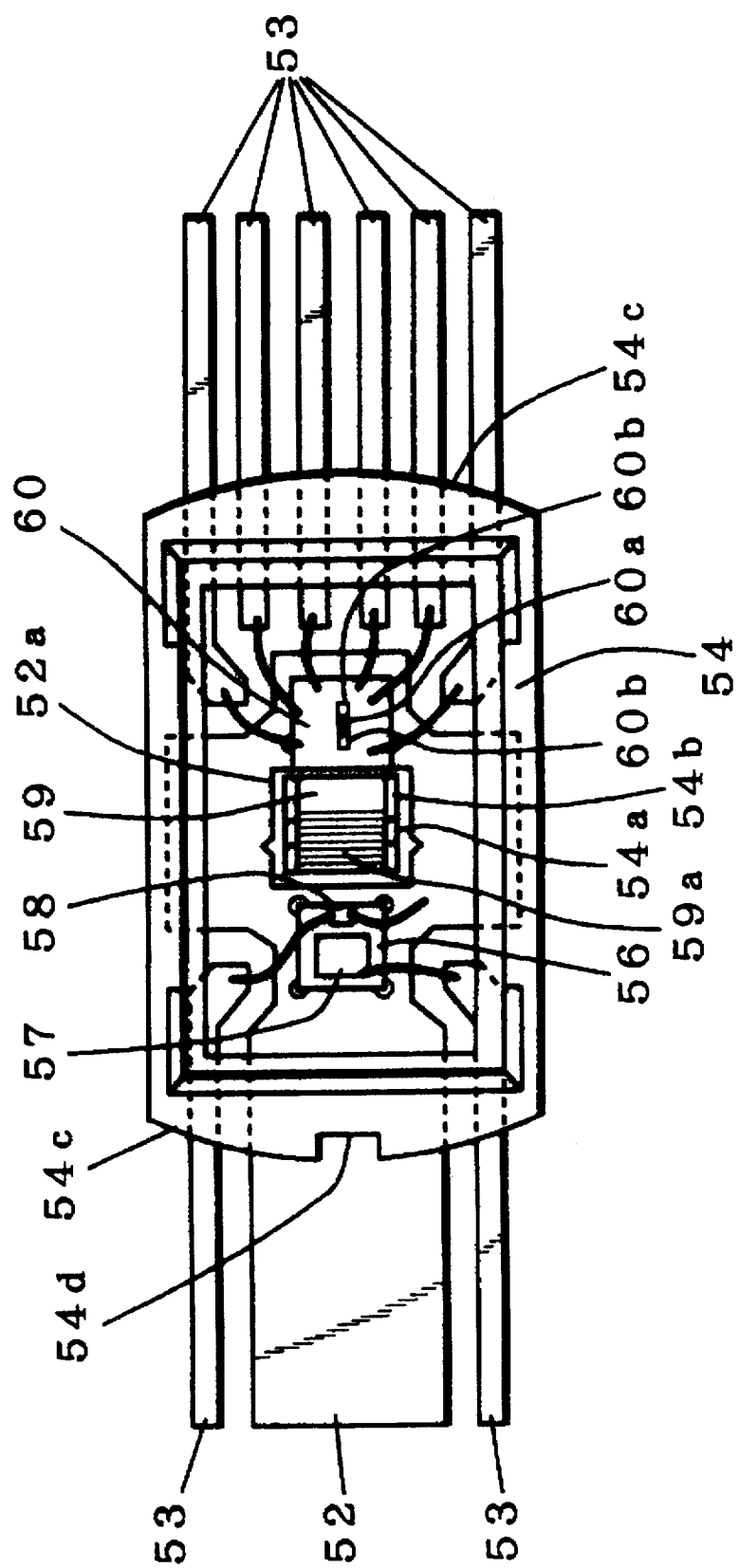
FIG. 24 is a top view of the mount member of the semiconductor laser apparatus of the eighth embodiment.

FIG. 21 and FIG. 22 are a partially exploded perspective view and a sectional view of a semiconductor laser apparatus for the optical pickup apparatus according to the eighth embodiment which performs the tracking servo according to the three beam method and the focusing servo according to the astigmatism method. FIG. 23 is a top view of the semiconductor laser apparatus and FIG. 24 is a top view of a mount member of the semiconductor laser apparatus. In FIG. 21 through FIG. 23, the bonding wire is not shown.

A mount member 51 comprises a lead frame 52 for installation of the semiconductor laser device and a plurality of leads 53 for terminal leading united with a common insulating mold body 54 formed of black resin. The lead frame 52 is formed of an electrically conducting metal, such as phosphor bronze, iron, or copper in the form of a cross (refer to FIG. 24), and functions as a radiation fin, too. The leads 53 are formed of an electrically conducting metal, such as copper. Now, the frame 52 has projecting portions on both sides in order to improve dissipation of heat and stiffness of the mount member 51.

The insulating mold body 54 supports the frame 52 and the leads 53, and it has a concave portion 55 so that the surface of the frame 52 and the leads 53 are exposed inside. That is to say, the mold body 54 forms a framework on its periphery to form a container for accommodating elements. Now, as the frame 52 and the leads 53 are arranged along a single direction, width of the container can be small.

An electrically conducting sub-mount (heat sink) 56 formed of Si, or the like, is die-bonded on the frame 52 exposed in the concave portion 55 and electrically connected to the frame 52. On the sub-mount 56, a PIN-type photodiode 57 for monitoring laser output power is formed having a light receiving surface at a part of its upper surface.

A semiconductor laser device 58 is die-bonded on the sub-mount 56 in front of the light receiving surface of the photodiode 57 through an insulating film not shown. The semiconductor laser device 58 emits laser beams respectively from the front facet and the rear facet, and the laser beam emitted from the rear facet is received at the photodiode 57 as a power monitor light.

A reflection type three-beam generating diffraction grating (reflection member) 59 is disposed facing the semiconductor laser device 58 in front of it. An opening 52a is provided in the frame 52 in the concave portion 55, and a concave portion 54a having an inclined portion 54b is formed in the insulating mold body 54 under the opening 52a. A diffraction grating 59 is fixed to the inclined portion 54b of the concave portion 54a. The diffraction grating surface 59a of the diffraction grating 59 splits the laser beam emitted from the front facet of the semiconductor laser device 58 into 0th order, +1st order and −1st order diffraction beams and reflects them upward at a right angle.

A light receiving device 60 for signal detection has a light receiving surface on its upper surface, and it is die-bonded to the frame 52 in the concave portion 55 behind the three-beam generating diffraction grating 59 (on the opposite side to the semiconductor laser device 58) and electrically connected to the frame 52. The light receiving device 60 is arranged so that its light receiving surface is located on the straight line connecting the laser beam emitting point of the semiconductor laser device 58 and the three-beam generating diffraction grating 59.

A support member 61 formed of black resin includes a first member 63, a second member 64 and a third member 65, which are joined together above the concave portion 55 of the insulating mold body 54. The supporting member 61 supports a transmission type holographic optical element 62 three-dimensionally movably. The holographic functional surface 62a of the holographic optical element 62 generates from the incident beam ±1 order diffraction beams having light axes inclined with respect to its light axis and effects the action of condensing the ±1 diffraction beams so that the focal distances differ in two directions which are vertical to the direction of progress of the beam and perpendicular to each other (the astigmatism action). That is to say, the holographic optical element 62 has the functions of a beam splitter, a condenser lens and a cylindrical lens.

A cylindrical cavity 53a into which the second member 64 is inserted is provided in the center of the first member 63. Adjustment windows 63b are formed at the upper end of the first member 63 on both sides, into which a pinch jig is inserted for positional adjustment of the second and third members 64, 65 inserted into the cavity 63a. A projection 63c for preventing the second member 64 from dropping is provided at the lower end of the first member 63 in the cavity 63a. (Refer to FIG. 22) A step-like engagement portion 55a is provided on the periphery of the concave portion 55 of the mount member 51. The first member 63 is fitted in the engagement portion 55a and fixed on the mount member 51 by an adhesive material 70a such as ultra violet setting resin to serve as a cover.

The second member 64 is formed of a cylindrical member (cylinder-shaped member) having a cavity inside, and has an engagement portion 64a formed of trapezoid concave notches facing each other at its upper end. The second member 64 is inserted into the cavity 63a of the first member 63 rotatably in the circumference direction and slidably in the vertical direction.

The third member 65 is formed of a cylindrical member (cylinder-shaped member) having a cavity inside and has a convex engagement portion 65a on its lower end which corresponds to the engagement portion 64a of the second member 64. The convex engagement portion 65a is engaged with the concave engagement portion 64a slidably in the horizontal direction. Holes 65b for pinch are formed in the side of the third member 65, into which the tips of the pinch jig are inserted. The transmission type holographic optical element 62 is fixed to the upper end of the third member 65. The third member 65 is inserted with play into the cylindrical cavity 63a as the second member 64 is inserted into the cylindrical cavity 63a of the first member 63, and the holographic optical element 62 is protected by the first member 63.

Since the second and third members 64 and 65 are movable to each other as they are only joined, they are fixed with an adhesive material 70b, such as ultra violet setting resin, as they are positioned in desirable positions, as shown in FIG. 22. As the support member 61 having the transmission type holographic optical element 62 is fixed over the concave portion 55 of the mount member 51 and then the concave portion 55 is closed tightly, thus preventing undesirable light from coming into the concave portion 55 from the outside.

In this embodiment, the insulating mold body 54 has arc portions 54c facing each other in the elongate direction so that adjustment of the semiconductor laser apparatus can be rotatably made when the semiconductor laser apparatus is incorporated into a circular opening of the housing of the pickup device, and it also has a concave portion 54d for insert of an adjustment jig at one of the arc portions 54c.

As shown in FIG. 24, the photodiode 57, the semiconductor laser device 58 and the light receiving device 60 for signal detection are electrically connected to the corresponding frame 52 or leads 53 with wires of gold, or the like (the thick lines in the figure). The light receiving device 60 is formed of a four-segment diode 60a for detecting the reproduction signal and the focussing error signal and photodiodes 60b for detecting the tracking error signal provided on both sides of a four-segment diode 60a. In FIG. 24, electrodes of respective photodiodes 60a, 60b are not shown and electrodes of the photodiode 57 and the semiconductor laser device 58 are not shown, either.

The positional adjustment of the transmission type holographic optical element 62 of the semiconductor laser apparatus is made as it is incorporated in the optical pickup apparatus or an adjusting machine for the semiconductor laser apparatus. The positional adjustment of the holographic optical element 62 of the semiconductor laser apparatus being packaged in the optical pickup apparatus will be described referring to FIG. 25. First, in the semiconductor laser apparatus described above, the mount member 51 and the first member 63 are fixed by the an adhesive material 70a and the second and third members 64, 65 only are movable. Important portions only are shown in FIG. 25.

Figure 25:
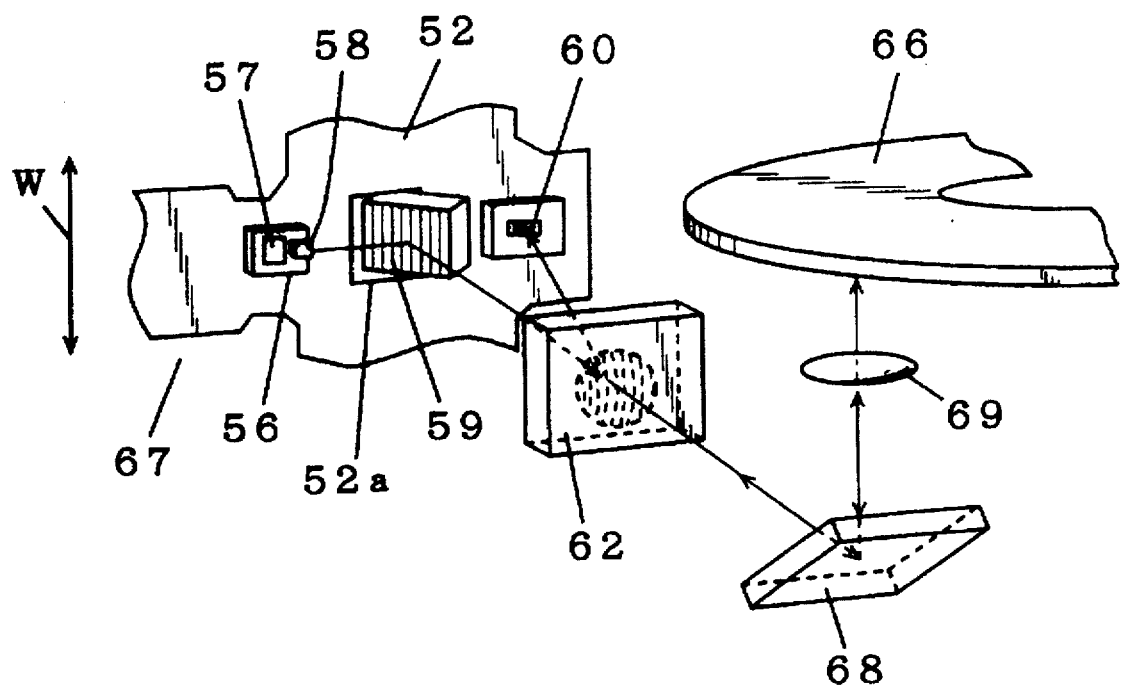
FIG. 25 is an important part perspective view showing the semiconductor laser apparatus of the eighth embodiment installed in an optical pickup apparatus.

In FIG. 25, a reflection member 68 including a reflection mirror, or the like, reflects in the right-angled direction the 0th order and ±1 order diffraction lights emitted from the semiconductor laser apparatus 67 described above. A condenser portion 69 formed of a condenser lens, or the like, condenses the 0th order and ±1 order diffraction lights reflected at the reflection member 68 onto a reflection type optical recording medium 66, such as an optical disk, to form a main spot and sub-spots on both sides of the main spot, respectively. The optical system of the optical pickup apparatus is adjusted and positioned so that the main spot scans a track to be reproduced and the sub-spots scan slightly covering that track on both sides of the main spot.

First, the semiconductor laser apparatus 67 is operated. In this operation state, a laser beam emitted as a power monitor light from the rear facet of the semiconductor laser device 58 is received at the photodiode 57. A signal corresponding to the amount of received light is sent to an APC driving circuit (automatic power control, not shown) and the laser beam emitted from the front facet is controlled so as to have desired optical output power by the APC driving circuit.

The laser beam emitted from the front facet of the semiconductor laser device 57 is split into 0th order and ±1 order diffraction lights at the three-beam generating diffraction grating 59 and reflected toward the transmission holographic optical element 62. The 0th order and ±1 order diffraction lights reflected by the three-beam generating diffraction grating 59 are transmitted (0th order diffracted) through the transmission type holographic optical element 62 and then reflected at an almost right angle at the reflection member 68, and condensed onto the optical recording medium 66 by the condenser portion 69. The main spot and the sub-spots described above are thus formed.

The 0th order and ±1 order diffraction lights reflected at the optical recording medium 66 (return lights) contain information of the optical recording medium 66. The return lights pass through the condenser portion 69 and the reflection member 68 in this order to be incident upon the transmission type holographic optical element 62.

Next, positional adjustment of the transmission type holographic optical element 62 in the three-dimensional directions is made while observing the receive signal of the light receiving device 60 for signal detection. That is to say, the second member 64 is moved in the up and down direction (vertical direction), or rotated, and the third member 65 is moved in the horizontal direction so that the 0th order and ±1 order diffraction lights containing the information (return light) are diffracted in 1st order (−1st order) by the holographic optical element 62 and well received at the light receiving device 60 for signal detection, that is, so that the 0th order diffraction light corresponding to the main spot is well received at the photodiode 60a and the +1 and −1st order diffraction lights corresponding to the sub-spots are well received at the photodiodes 60b. Subsequently, when the adjustment has been completed, as shown in FIG. 22, the second and third members 64, 65 are fixed with respect to the first member 63 with the adhesive material 70b, such as resin.

In an optical pickup apparatus incorporating the semiconductor laser apparatus thus configured, the reproduction signal and the focussing error signal are obtained from the detection signal of the photodiode 60a and the tracking error signal is obtained from the detection signal of the photodiodes 60b. The condenser portion 69 is driven by a driving mechanism not shown according to the focussing error signal. Thus, the tracking error signal and focusing and tracking are performed.

In the semiconductor laser apparatus of this embodiment, the second member 64 is slidable in the vertical direction and rotatable before the second and third members 64, 65 are fixed, and the third member 65 is slidable in the horizontal direction, so that the holographic optical element 62 can easily be moved three-dimensionally.

As a result, the position of the holographic optical element 62 can easily be adjusted so that the light emitted from the semiconductor laser device 68 and passed trough the three-beam generating diffraction grating 59, the holographic optical element 62, the reflection member 68 and the condenser portion 69 is reflected at the optical recording medium 66 and passed through the condenser portion 69 and the reflection member 68 again, and the return light 1 diffracted in 1st order (or −1st order) by the holographic optical element 62 is incident in the center of the four-segment light receiving device 60. Furthermore, as the second and third members 64, 65 move sliding with respect to the first member 63 and the second member 64, respectively, the holographic optical element 62 can easily be positioned precisely.

Especially, the second member 64 and the third member 65 are engaged at the engagement portions 64a and 65a, it is therefore possible to pinch the third member 65 only to move the second member 64 together with the third member 65. As a result, when moving the second and third members 64, 65, they do not have to be re-held, and therefore a time required for the positional adjustment of the holographic optical element 62 is reduced. Moreover, when the first member 63 and the second member 64, the second member 64 and the third member 65 are fixed with the adhesive materials 70a, 70b, such as resin, there is no possibility that the adhesive materials 70a and 70b flow out into the concave portion 55 to attach to the elements and so forth, for there is no gap in the sliding portions in this structure.

The semiconductor laser device 58, the three-beam generating diffraction grating 59 and the light receiving device 60 for signal detection are accommodated in the concave portion 55 of the insulating mold body 54 and the semiconductor laser device 58 and the light receiving device 60 for signal detection are electrically connected to the leads 53 with bonding wires in the concave portion 55. Accordingly, the semiconductor laser device 58, the three-beam generating diffraction grating 59, the light receiving device 60 for signal detection and the bonding wires are protected.

Further, as the semiconductor laser device 58 and the light receiving device 60 are provided on the frame 52, the heat of the semiconductor laser device 58 and the light receiving device 60 can be dissipated efficiently through the frame 52. This enables long life and high output power of the semiconductor laser device 58, and suppresses reduction of sensitivity of the light receiving device 60.

Furthermore, the upper surfaces of the frame 52 and the plurality of leads 53 exist on the same plane, which provides easy wire bonding to the semiconductor laser device 58, the light receiving device 60 and the photodiode 57.

Also, as the semiconductor laser device 58, the three-beam generating diffraction grating 59 and the light receiving device 60 are arranged on a single line in this order, the three-beam generating diffraction grating 59 functions as light shielding means. This prevents the laser beam emitted from the front facet of the semiconductor laser device 58 from entering the light receiving device 60.

Furthermore, as the holographic optical element 62 is accommodated in the cavity 63a of the first member 63, the holographic optical element 62 is protected when incorporated in the optical pickup apparatus, or the like.

Also, since the frame 52 and the plurality of leads 53 extend in the same direction, the width of the mount member 51 can be reduced. Therefore, as has been described above, the structure where the direction of light emission from the semiconductor laser apparatus 67 is almost parallel to the recording surface of the optical recording medium 66 with the reflecting member 68 interposed therebetween can reduce the thickness of the optical pickup apparatus in the direction of the arrow W. Although the thickness can not be reduced, the direction of light emission from the semiconductor laser apparatus 67 and the recording surface of the optical recording medium 66 may be placed almost vertical without the reflection member 68.

(9) Ninth Embodiment

Figure 26:
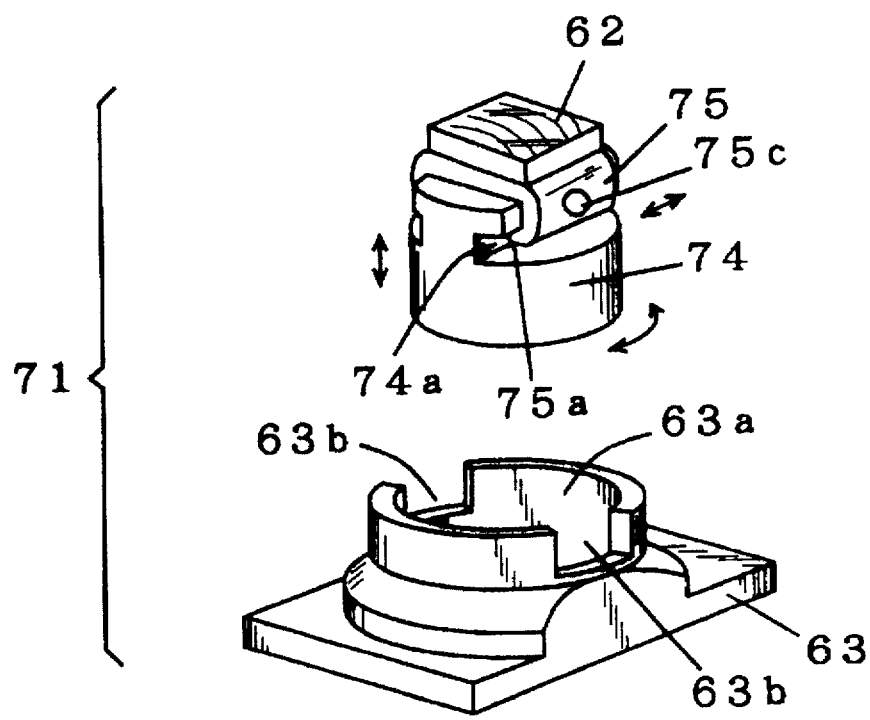
FIG. 26 is a partially exploded perspective view of a supporting member and a holographic optical element of a semiconductor laser apparatus according to a ninth embodiment of the present invention.

As the ninth embodiment is different from the eighth embodiment only in the structure of the supporting member, it will be described referring to FIG. 26 showing a partially exploded perspective view of the supporting member. In the ninth embodiment, the same characters are allotted to the same or corresponding parts in the eighth embodiment, and description thereof is not repeated.

A supporting member 71 includes a first member 63 formed of resin, a second member 74 formed of resin and a third member 75 formed of resin or metal, such as copper, iron or alminium, which are joined together over the concave portion 55 of the insulating mold body 54. This supporting member 71 supports the transmission type holographic optical element 62 movably in three dimensions.

Similarly to the eighth embodiment, the cylindrical cavity 63a into which the second member 74 is inserted is provided in the center of the first member 63. Windows 63b are formed on the upper end of the first member 63 on both sides for positional adjustment of the second and third members 74, 75 inserted into the cavity 63a. The projection 63c (refer to FIG. 22) for preventing the second member 74 from dropping is formed at the lower end of the first member 63 in the cavity 63a. This first member 63 is fixed on the concave portion 55 of the insulating mold body 54 (refer to FIG. 21 and FIG. 22).

Figure 27:
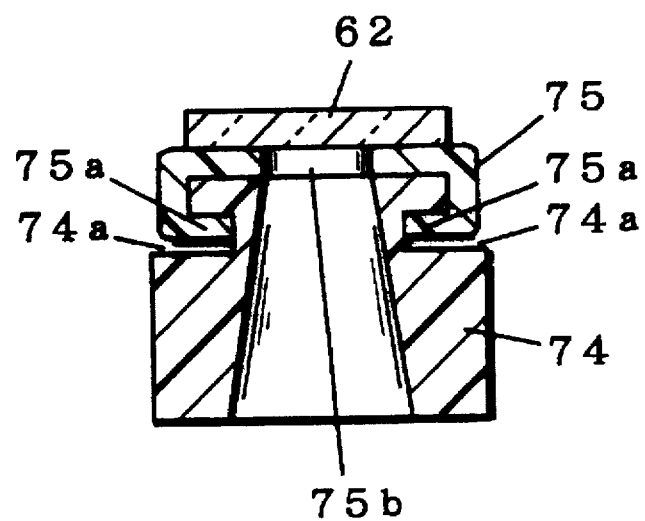
FIG. 27 is a sectional view of the supporting member and the holographic optical element of the semiconductor laser apparatus of the ninth embodiment.

FIG. 27 is a sectional view of the second member 74 and the third member 75. The second member 74 is formed of a cylindrical member (cylinder-shaped member) having a cavity inside. An engagement portion 74a including concave-shaped guide grooves facing each other is formed on the upper end of the second member 74 on both sides.

The second member 74 is fitted in the cavity 63a of the first member 63 rotatably in the circumferential direction and slidably in the vertical direction.

The third member 75 is formed of a member with a C-shaped section (a member with a cavity inside). The transmission type holographic optical element 62 is fixed on the third member 75. A window 75b for exposing the holographic functional surface of the holographic optical element 62 is provided in the upper surface of the third member 75. A claw-like engagement portion 75a which engages with the engagement portion 74a of the second member 74 is provided at the lower ends of the third member 75. The engagement portion 75a of the third member 75 is slidably engaged with the engagement portion 74a of the second member 74. Holes 75c for pinch are formed in the side of the third member 75, into which the tips of a pinch jig are inserted. The third member 75 is also inserted into the cylindrical cavity 63a with play as the second member 74 is inserted into the cylindrical cavity 63a, and the holographic optical element 62 is thus protected by the first member 63.

As the second and third members 74, 75 are movable to each other when they are just combined together, they are fixed with an adhesive material, such as resin, as they are arranged in desired position. As the supporting member 71 having the transmission type holographic optical element 62 is fixed to the engagement portion 55a of the concave portion 55 of the mount member 51, the inside of the concave portion 55 is tightly closed, which prevents undesirable lights from the outside from entering the concave portion 55.

Since the second and third members 74, 75 are movable also in this embodiment similarly to the eighth embodiment, the same effects as those of the eighth embodiment are obtained. Furthermore, since the third member 75 is formed by bending a plate-like member, it is easier to form the third member 75 in the ninth embodiment in comparison with the eighth embodiment, which provides mass productivity.

(10) Tenth Embodiment

Figure 28:
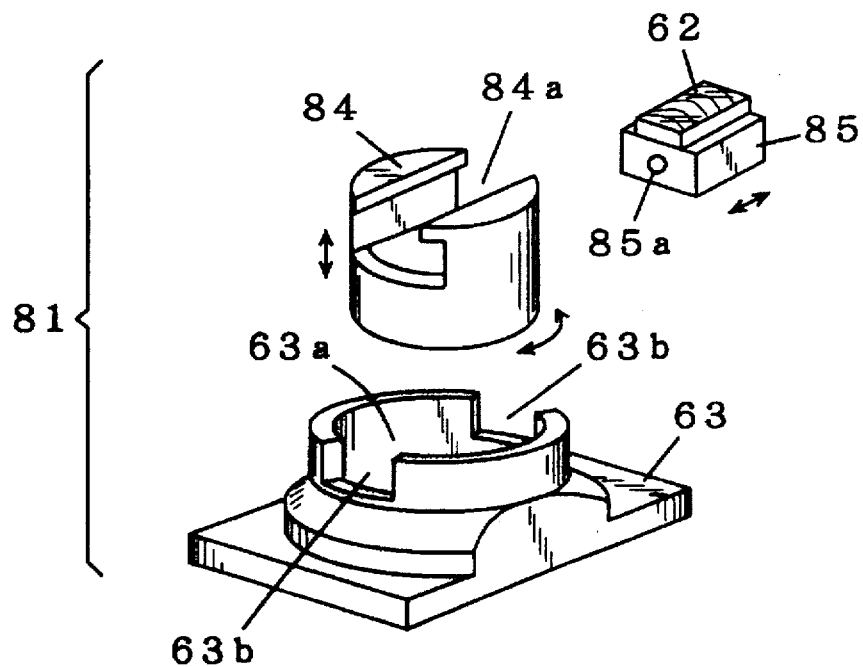
FIG. 28 is an exploded perspective view of a supporting member and a holographic optical element of a semiconductor laser apparatus according to a tenth embodiment of the present invention.

As the tenth embodiment is different from the eighth embodiment only in the structure of the supporting member, it will be described referring to FIG. 28 showing an exploded perspective view of the supporting member. In the tenth embodiment, the same characters are allotted to the same or corresponding parts in the eighth embodiment, and description thereof is not repeated.

A supporting member 81 is formed of resin and includes a first member 63, a second member 84 and a third member 85. The supporting member 81 is joined together above the concave portion 55 of the insulating mold body 54 and supports the transmission type holographic optical element 62 movably in three dimensions.

The cylindrical cavity 63a is provided in the center of the first member 63, in to which the second member 84 is inserted. Windows 63b facing each other are formed on the upper end of the first member 63 for positional adjustment of the second and third members 84, 85 inserted into the cavity 63a. The projection 63c (refer to FIG. 22) for preventing the second member 84 from dropping is formed at the lower end of the first member 63 in the cavity 63a. This first member 63 is fixed over the concave portion 55 of the insulating mold body 54 (refer to FIG. 21 and FIG. 22). The first member 63 of this embodiment is the same as the first member 63 of the eighth embodiment except positional difference of the windows 63b.

The second member 84 is formed of a cylindrical member (cylinder-shaped member) having a cavity inside. An insert groove (engagement portion) 84a into which the third member 85 is inserted is formed in the upper part of the second member 84. The second member 84 is inserted into the cavity 63a of the first member 63 rotatably in the circumferential direction and slidably in the vertical direction.

The third member 85 is formed of a square member having a cavity inside. The transmission type holographic optical element 62 is fixed on the upper surface of the third member 85. The third member 85 is fitted into the insert groove 84a of the second member 84 slidably in the horizontal direction. Holes 85a for pinch are formed in the end surfaces of the third member 85, into which the tips of a pinch jig are inserted. The third member 85 is also inserted into the cylindrical cavity 63a with play as the second member 84 is inserted into the cylindrical cavity 63a of the first member 63, and the holographic optical element 62 is thus protected by the first member 63.

As the second and third members 84, 85 are movable to each other when they are merely joined together, they are fixed with an adhesive material, such as resin, as they are arranged in desired position. As the supporting member 81 having the transmission type holographic optical element 62 is fixed to the engagement portion 55a of the concave portion 55 of the mount member 51, the inside of the concave portion 55 is tightly closed, which prevents undesirable lights from the outside from entering the concave portion 55. The same effects as those in the eighth embodiment can also be obtained in this embodiment.

Although the holographic optical element 62 is fixed to the third member 85 in this embodiment, a holographic optical element itself may be fitted into the insert groove 84a of the second member 84 without using the third member.

(11) Eleventh Embodiment

Figure 29:
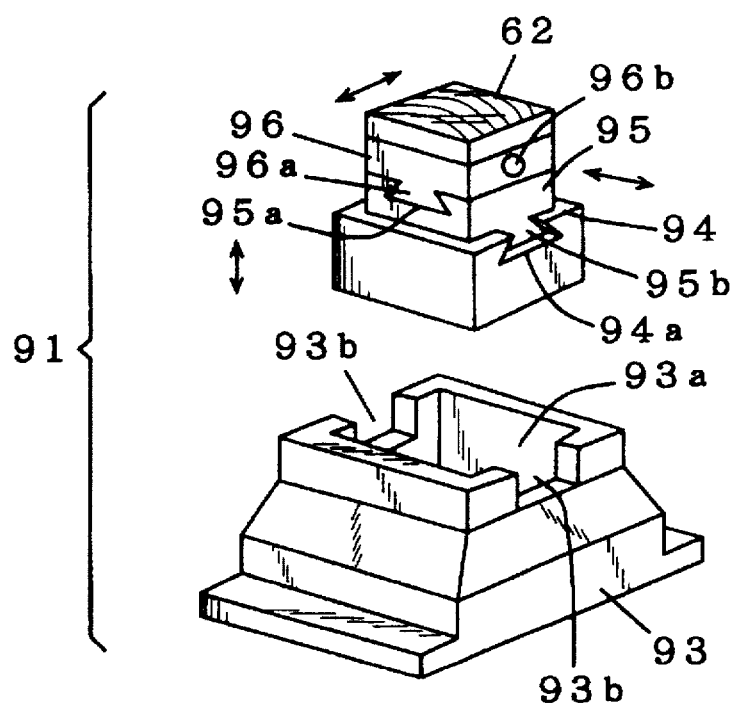
FIG. 29 is a partially exploded perspective view of a supporting member and a holographic optical element of a semiconductor laser apparatus according to an eleventh embodiment of the present invention.

As the eleventh embodiment is different from the eighth embodiment only in the structure of the supporting member, it will be described referring to FIG. 29 showing a partially exploded perspective view of the supporting member. In the eleventh embodiment, the same characters are allotted to the same or corresponding parts in the eighth embodiment, and description thereof is not repeated.

A supporting member 91 is formed of resin and includes a first member 93, a second member 94, a third member 95 and a fourth member 96. The supporting member 91 is combined together above the concave portion 55 of the insulating mold body 54 and supports the transmission type holographic optical element 62 movably in three dimensions.

A square-shaped cavity 93a is provided in the center of the first member 93, into which the second member 94 is inserted. Windows 93b facing each other are formed on the upper end of the first member 93 for adjusting positions of the second, third and fourth members 94, 95 and 96 inserted into the cavity 93a. A projection (not shown) for preventing the second member 94 from dropping is formed at the lower end of the first member 93 in the cavity 93a. This first member 93 is fixed on the concave portion 55 of the insulating mold body 54.

The second member 94 is formed of a square-shaped member having a cavity inside. An engagement portion 94a formed of trapezoid-shaped concave notches facing each other is formed on the top portion of the second member 94. The second member 94 is inserted into the cavity 93a of the first member 93 slidably in the vertical direction.

The third member 95 is formed of a square-shaped member having a cavity therein. An engagement portion 95a including concave-shaped notches facing each other in the perpendicular relation with respect to the engagement portion 94a is formed on the top of the third member 95. A convex-shaped engagement portion 95b corresponding to the engagement portion 94a and in the perpendicular relation with respect to the engagement portion 95a is formed on the bottom of the third member 93. The convex-shaped engagement portion 95b of the third member 95 is engaged with the concave-shaped engagement portion 94a of the second member 94 slidably in the horizontal direction.

The fourth member 96 is formed of a square-shaped member having a cavity inside. The holographic optical element 62 is fixed on the upper surface of the fourth member 96. A convex engagement portion 96a corresponding to the engagement portion 95a of the third member 95 is formed on the bottom of the fourth member 96. The convex engagement portion 96a of the fourth member 96 is engaged with the concave engagement portion 95a of the third member 95 slidably in the horizontal direction. Holes 96b for pinch are formed in the side of the fourth member 96, into which the tips of a pinch jig are inserted.

The third and fourth members 95, 96 are inserted into the cavity 93a with play as the second member 94 is inserted into the cavity 93a of the first member 93, and thus the holographic optical element 62 is protected by the first member 93.

As the second, third and fourth members 94, 95 and 96 are movable to each other when they are just joined together, they are fixed with an adhesive material, such as resin, as they are arranged in desired position. As the supporting member 91 having the transmission type holographic optical element 62 is fixed to the engagement portion 55a of the concave portion 55 of the mount member 51, the inside of the concave portion 55 is tightly closed, thus preventing undesirable lights from outside from entering the concave portion 55.

Although this embodiment is different from the eighth through tenth embodiments: described above in that the three-dimensional adjustment is made in the linear directions perpendicular to each other, the same effects as those in the eighth embodiment are obtained. In this embodiment, the cavity 93a has a square shape and the second member 94 is a square member, but they can have other shapes.

Although the holographic optical element 62 is fixed to the fourth member 96 in this embodiment, the holographic optical element 62 itself may be fitted into the engagement portion 95a of the third member 95 without using the fourth member 96.

(12) Twelfth Embodiment

Figure 30:
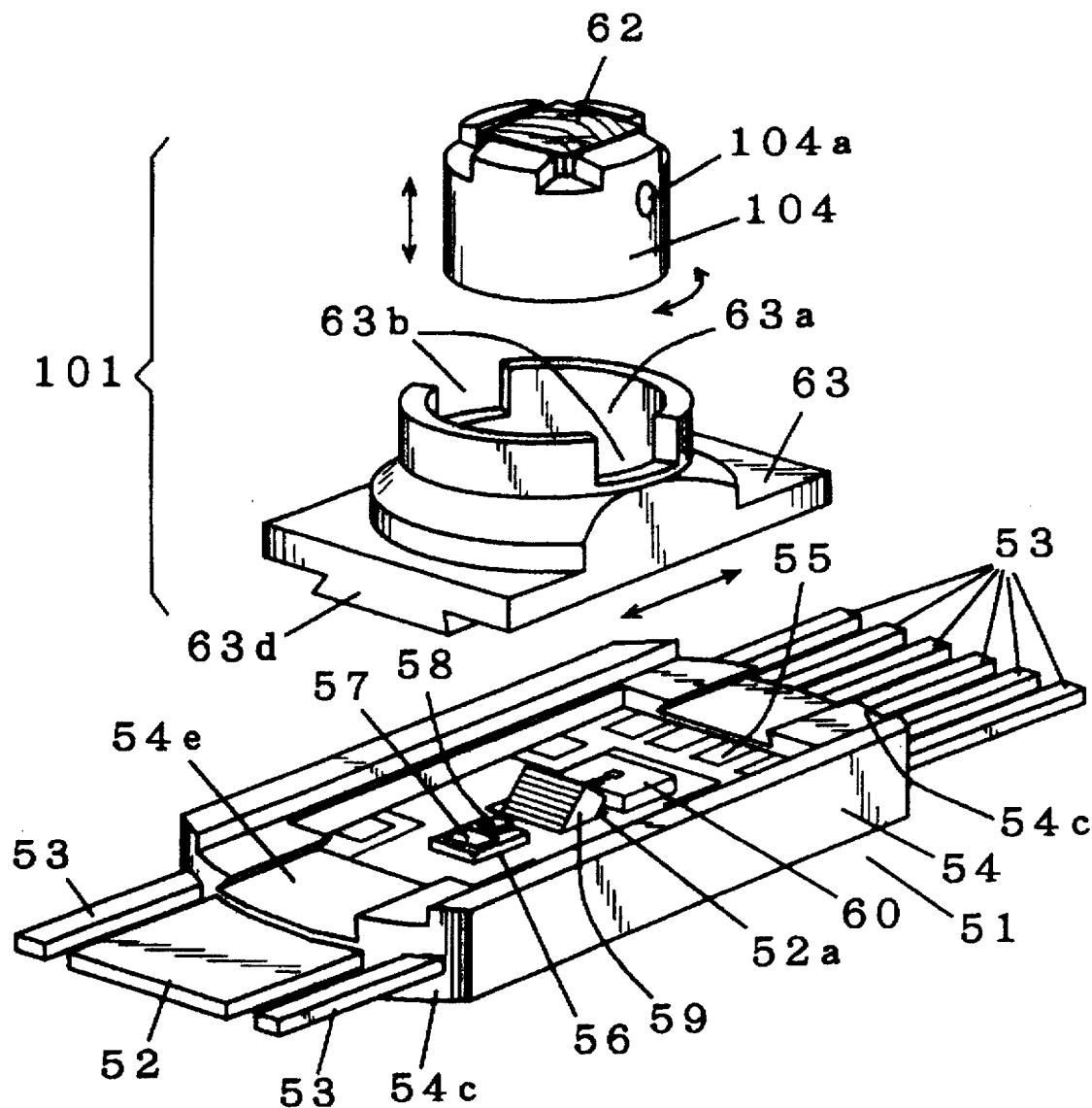
FIG. 30 is an exploded perspective view of a semiconductor laser apparatus according to a twelfth embodiment of the present invention.
Figure 31:
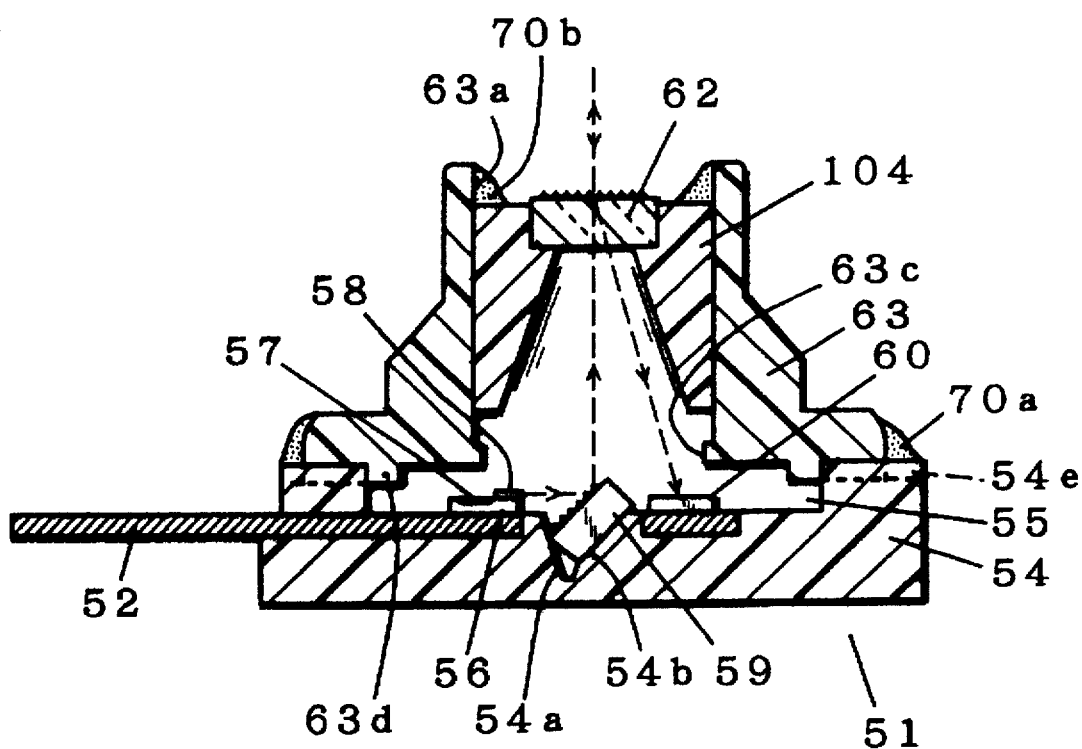
FIG. 31 is a sectional view of the semiconductor laser apparatus of the twelfth embodiment.

FIG. 30 and FIG. 31 are an exploded perspective view and a sectional view of a semiconductor laser apparatus for an optical pickup apparatus according to the twelfth embodiment. The bonding wires are not shown in FIG. 30 and FIG. 31. In the twelfth embodiment, the same characters are allotted to the same or corresponding parts in the eighth embodiment, and differences only will be described.

Unlike the eighth embodiment, the insulating mold body 54 has a stripe-like guide groove 54e on its top. The guide groove 54e has a trapezoid concave engagement portion formed in parallel to the line connecting the three-beam generating diffraction grating 59 and the light receiving device 60.

A supporting member 101 is formed of black resin and includes a first member 63 and a second member 104. The supporting member 101 is joined together above the concave portion 55 of the insulating mold body 54 and supports the transmission type holographic optical element 62 movably in the three dimensions.

A cylindrical cavity 53a is provided in the center of the first member 63, into which the second member 104 is inserted. Windows 63b facing each other are formed on the upper end of the first member 63 for positional adjustment of the second member 104 inserted into the cavity 63a.

A projection 63c for preventing the second member 104 from dropping is formed at the lower end of the first member 63 in the cavity 63a. Furthermore, a stripe-shaped convex engagement portion 63d is provided on the bottom of the first member 63, whose engagement portion 63d is engaged with the concave engagement portion of the guide groove 54e of the insulating mold body 54 slidably in the horizontal direction.

The second member 104 is formed of a cylindrical member with the transmission type holographic optical element 62 fixed on its top, which is inserted into the cavity 63a of the first member 63 rotatably in the circumferential direction and slidably in the vertical direction. Holes 104a for pinch are formed in the side of the second member 104, into which the tips of a pinch jig are inserted.

As the first member 63 and the second member 104 are movable to each other when they are just joined, they are fixed with adhesive materials 70a, 70b, such as resin, as they are arranged in desired position, as shown in FIG. 31. As the supporting member 101 having the transmission type holographic optical element 62 is fixed into the concave portion 55 of the mount member 51, the inside of the concave portion 55 is tightly closed, which prevents undesirable lights from the outside from entering the concave portion 55.

In the semiconductor laser apparatus of this embodiment, because the second member 104 is slidable in the vertical direction and rotatable before the first and second members 63, 104 are fixed, and the first member 63 is slidable in the horizontal direction, the holographic optical element 62 can easily be three-dimensionally moved. As a result, the positional adjustment of the holographic optical element 62 can be accomplished easily. Moreover, since the first and second members 63, 104 move sliding, the same effects as those in the eighth embodiment can be obtained, including that the holographic optical element 62 can be positioned precisely. Further, the twelfth embodiment with less number of parts than the eighth embodiment can produce the same effects as the eighth embodiment with lower cost.

(13) Thirteenth Embodiment

Figure 32:
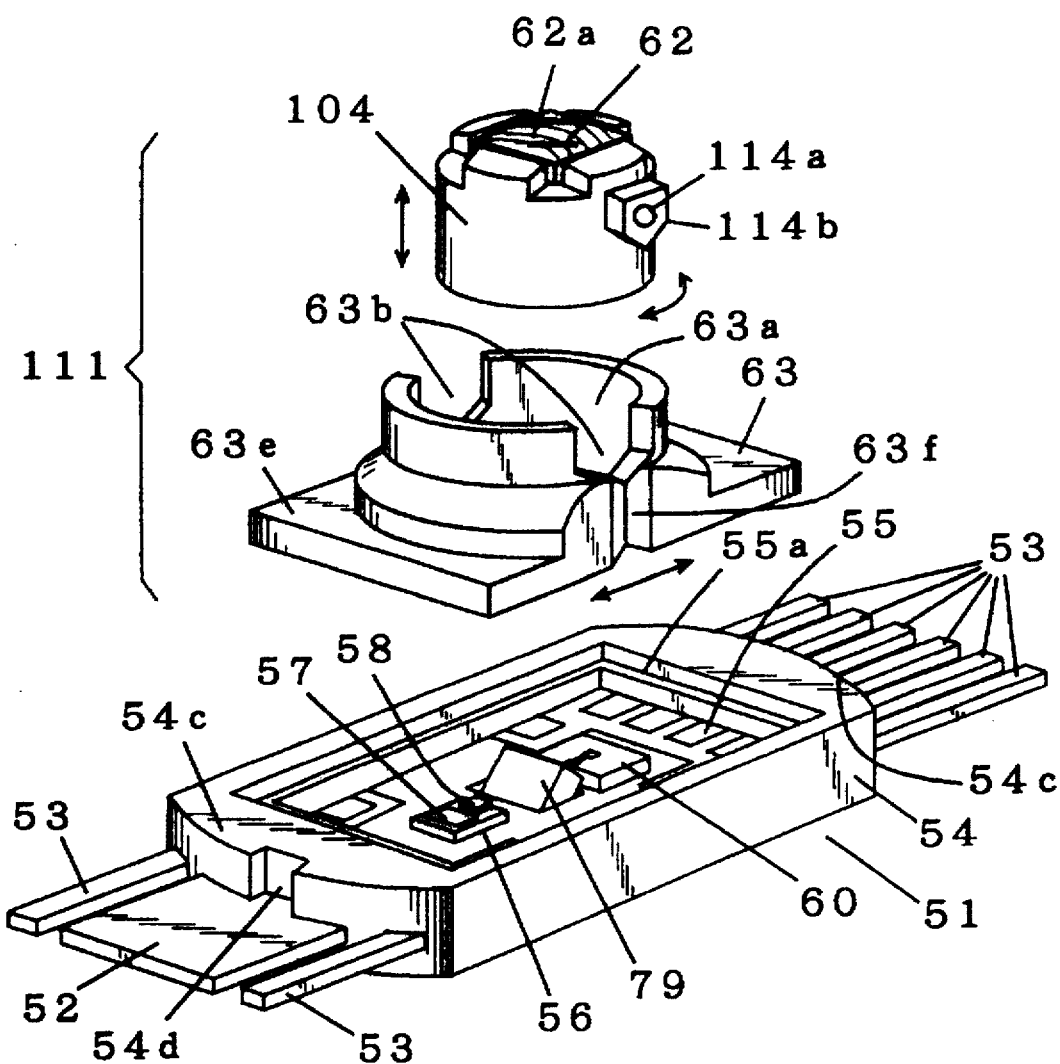
FIG. 32 is an exploded perspective view of a semiconductor laser apparatus according to a thirteenth embodiment of the present invention.
Figure 33:
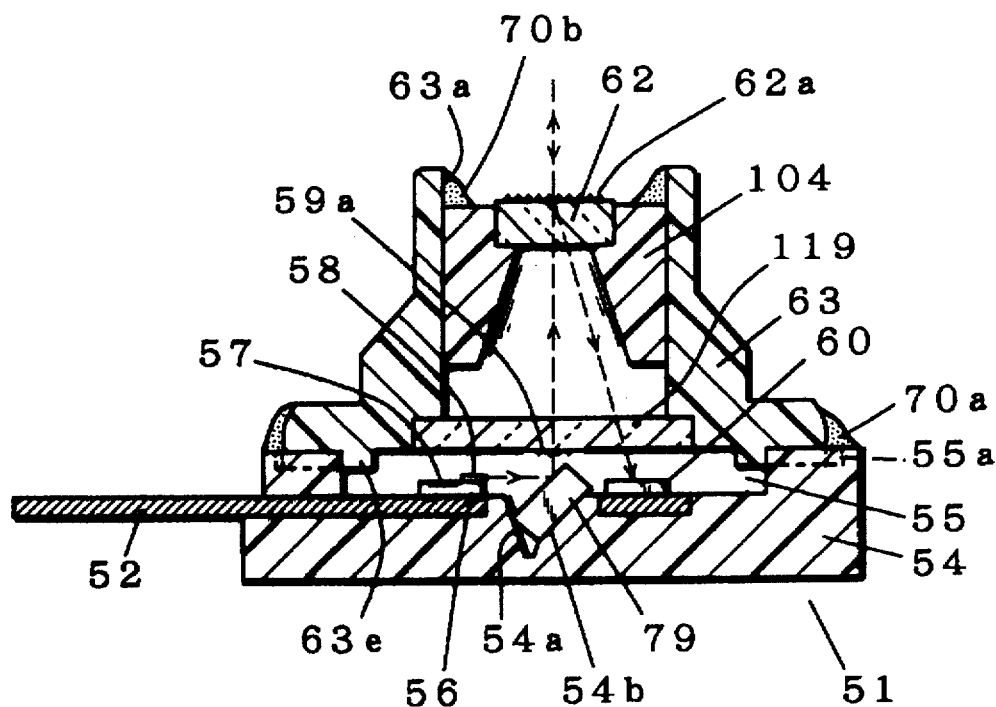
FIG. 33 is a sectional view of the semiconductor laser apparatus of the thirteenth embodiment.

FIG. 32 and FIG. 33 are an exploded perspective view and a sectional view of a semiconductor laser apparatus for an optical pickup apparatus according to the thirteenth embodiment. Bonding wires are not shown in FIG. 32 and FIG. 33. In the thirteenth embodiment, the same characters are allotted to the same or corresponding parts in the twelfth embodiment, and differences only will be described.

The thirteenth embodiment considerably differs from the twelfth embodiment in that a mere reflection mirror 79 is used in place of the reflection type three-beam generating diffraction grating 59 and a transmission type three-beam generating diffraction grating 119 is provided above the reflection mirror 79, and that the shape of the engagement portion of the insulating mold body 54 is different.

The reflection mirror (reflection member) 79 is fixed on the inclined surface 54b of the concave portion 54a of the insulating mold body 54. The insulating mold body 54 has an engagement portion 55a formed by providing a step on the periphery of the concave portion 55.

A supporting member 111 is formed of black resin and includes a first member 63 and a second member 104. The supporting member 111 is joined together above the concave portion 55 of the insulating mold body 54 and supports the transmission type holographic optical element 62 movably in the three dimensions.

A cylindrical cavity 53a is provided in the center of the first member 63, into which the second member 104 is inserted. Windows 63b facing each other are formed on the upper end of the first member 63 for positional adjustment of the second member 104 inserted into the cavity 63a. A transmission type three-beam generating diffraction grating 119 is provided on the bottom of the first member 63 so that the three-beam generating diffraction grating surface 59a faces in the opposite side of the cylindrical cavity 63a. An engagement portion 63e which is shorter in the elongate direction by 0.6 mm, for example, than the engagement portion 55a of the insulating mold body 54 is provided in the bottom of the first member 63, which engagement portion 63e is fitted in the engagement portion 55a of the insulating mold body 54 slidably in the horizontal direction. Concave portions 63f are provided on both sides of the first member 63. These concave portions 63f are pinched when sliding the first member 63 in the horizontal direction with respect to the mount member 51. Windows 63b for adjustment have a different shape from that of the windows 63b of the twelfth embodiment, which have a V-shaped notches to enable initial positioning of the second member 104.

The second member 104 is formed of a cylindrical member having the transmission type holographic optical element 62 fixed on its top and inserted into the cavity 63a of the first member 63 rotatably in the circumferential direction and slidably in the vertical direction. Convex portions 114b for pinch having a shape corresponding to the V-shape of the windows 63b of the first member 63 are provided on both sides of the second member 104. The width of the convex portion 114b is formed smaller than the width of the window 63b so that the second member 114 is rotatable in the circumferential direction in the cavity 63a of the first member 63. A hole 114a for pinch is formed in each convex portion 114b, into which the tips of a pinch jig is inserted.

As the first member 63 and the second member 104 are movable to each other when they are just combined, they are fixed with an adhesive material 70b, such as resin, as they are arranged in desired position, as shown in FIG. 33. As the supporting member 111 having the transmission type holographic optical element 62 is fixed in the concave portion 55 of the mount member 51, the inside of the concave portion 55 is tightly closed, which prevents undesirable lights from the outside from entering the concave portion 55.

In the semiconductor laser apparatus of this embodiment, because the second member 104 is slidable in the vertical direction and rotatably before the first and second members 63, 104 are fixed, and the first member 63 is slidable in the horizontal direction, the holographic optical element 62 can easily be three-dimensionally moved. As a result, the positional adjustment of the holographic optical element 62 can be accomplished easily. Moreover, since the first and second members 63, 104 move sliding, the holographic optical element 62 can be positioned precisely.

In the optical pickup apparatus using the semiconductor laser apparatus of this embodiment, a laser beam emitted from the front end of the semiconductor laser device 58 is reflected upward at a right angle by the reflection mirror 79 and then enter the transmission type three-beam generating diffraction grating 119. The beam incident upon the diffraction grating 119 is split into the 0th order and ±1 order diffraction beams similarly to the description above, and the three beams are transmitted through the transmission type holographic optical element 62 and condensed onto the optical recording medium through the condenser portion in the same way described in the eighth embodiment. The three beams reflected by the optical recording medium pass through the condenser portion and then enter the transmission type holographic optical element 62, and diffracted in +1st order (or -1st order) so as to avoid the diffraction grating surface 59a of the transmission type three-beam generating diffraction grating 119 and received at the photodetector 60.

The diffraction grating surface 59a may be provided on the upper surface of the transmission type three-beam generating diffraction grating 119. The transmission type three-beam generating diffraction grating 59 may be provided on the top of the mount member 51.

Figure 34:
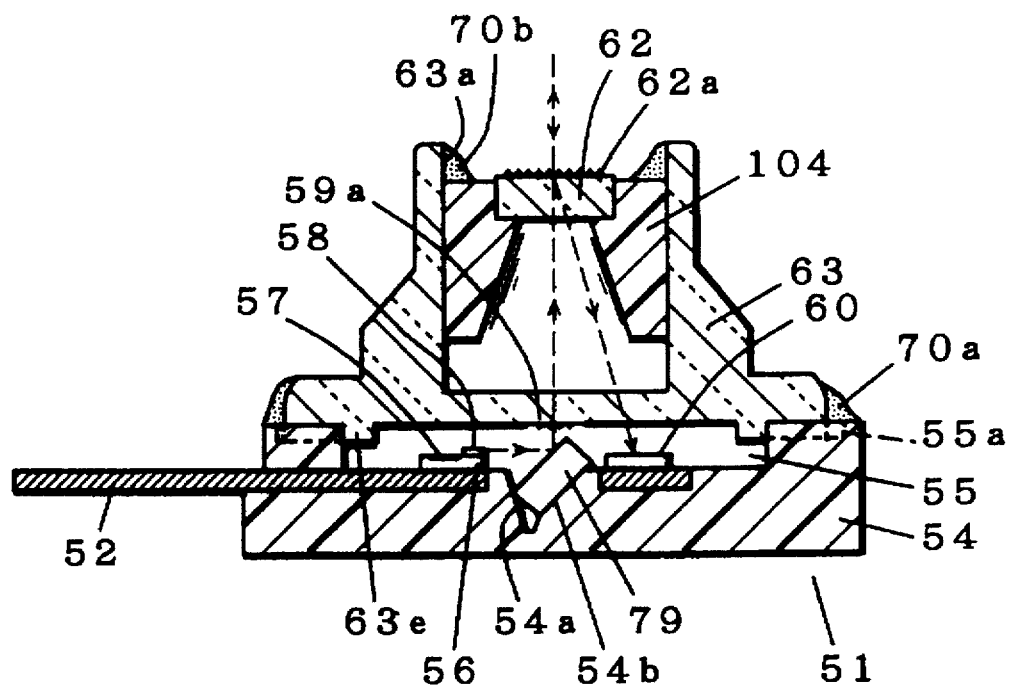
FIG. 34 is a sectional view showing another implementation of the semiconductor laser apparatus of the thirteenth embodiment.

Although the transmission type three-beam generating diffraction grating 119 is provided as a separate member on the bottom of the first member 63 in this embodiment, the transmission type three-beam generating diffraction grating may be provided by the integral formation using transparent resin in the lower part of the first member 63 as shown in FIG. 34, and the diffraction grating surface 59a may be formed on the bottom of the first member 63.

Figure 35:
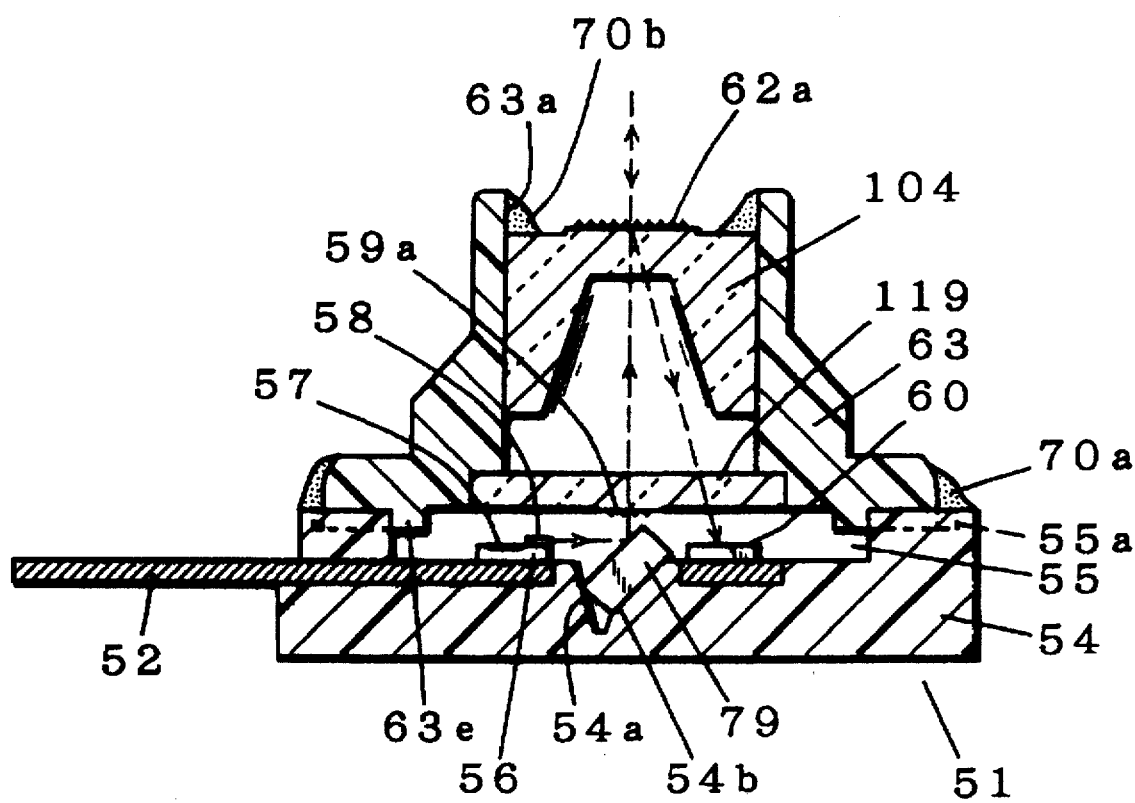
FIG. 35 is a sectional view showing still another implementation of the semiconductor laser apparatus of the thirteenth embodiment.

Although the transmission type holographic optical element 62 is provided as a separate member on the top of the second member 104 in this embodiment, the transmission type holographic optical element may be formed using transparent resin integrally with the second member 104, as shown in FIG. 35, and the holographic functional surface 62a may be formed on the upper surface of the second member 104. In this case, the number of parts and the manufacturing processes can be reduced.

(14) Fourteenth Embodiment

Figure 36:
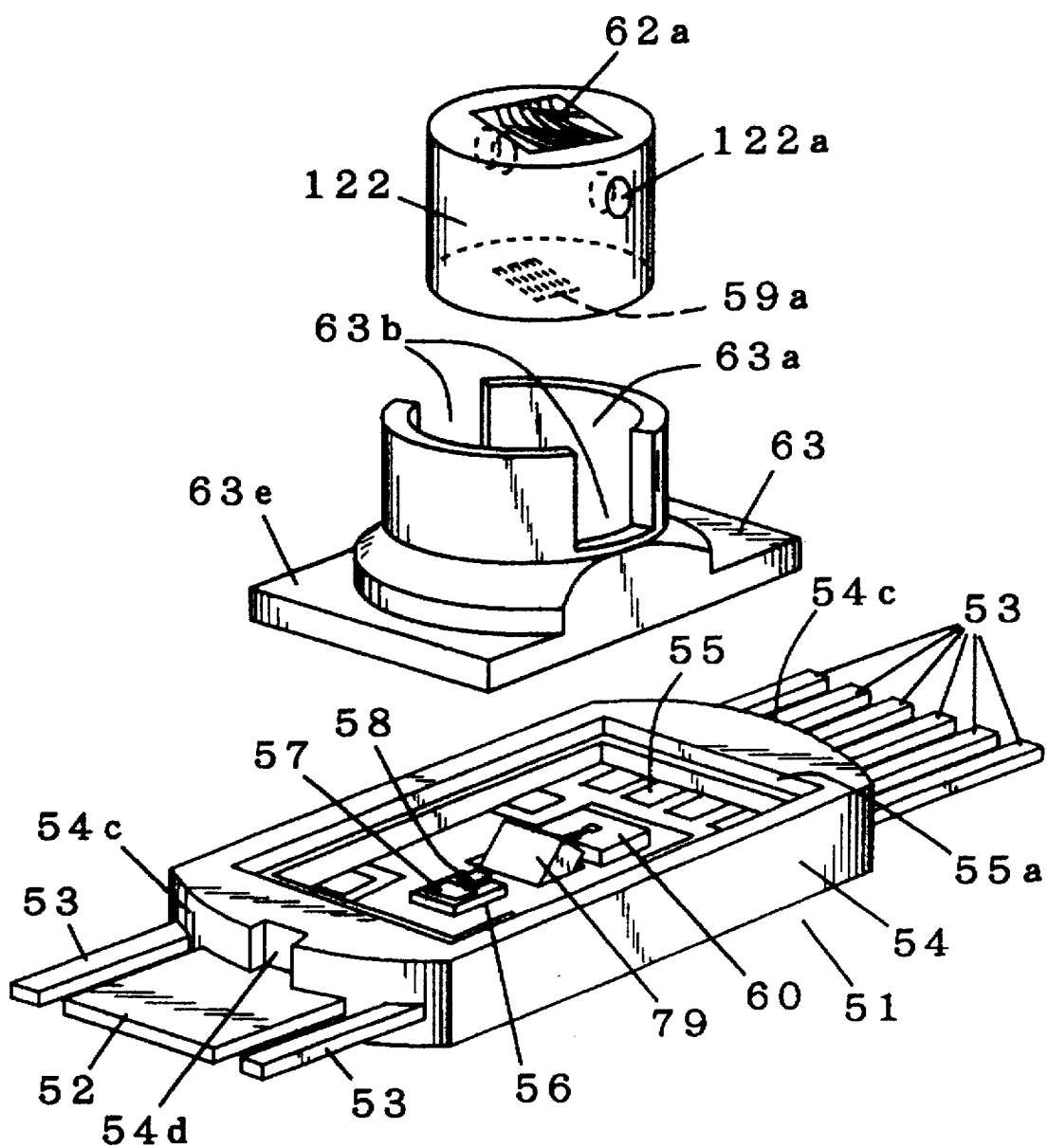
FIG. 36 is an exploded perspective view of a semiconductor laser apparatus according to a fourteenth embodiment of the present invention.
Figure 37:
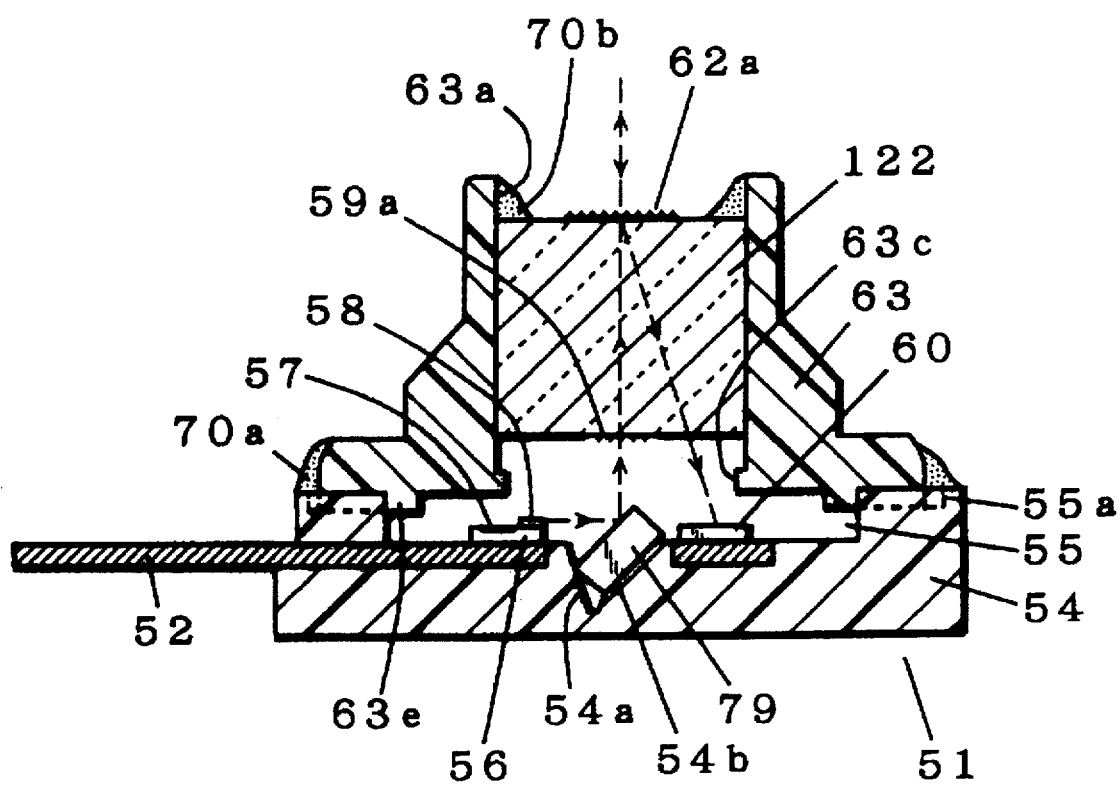
FIG. 37 is a sectional view of the semiconductor laser apparatus of the fourteenth embodiment.
Figure 38:
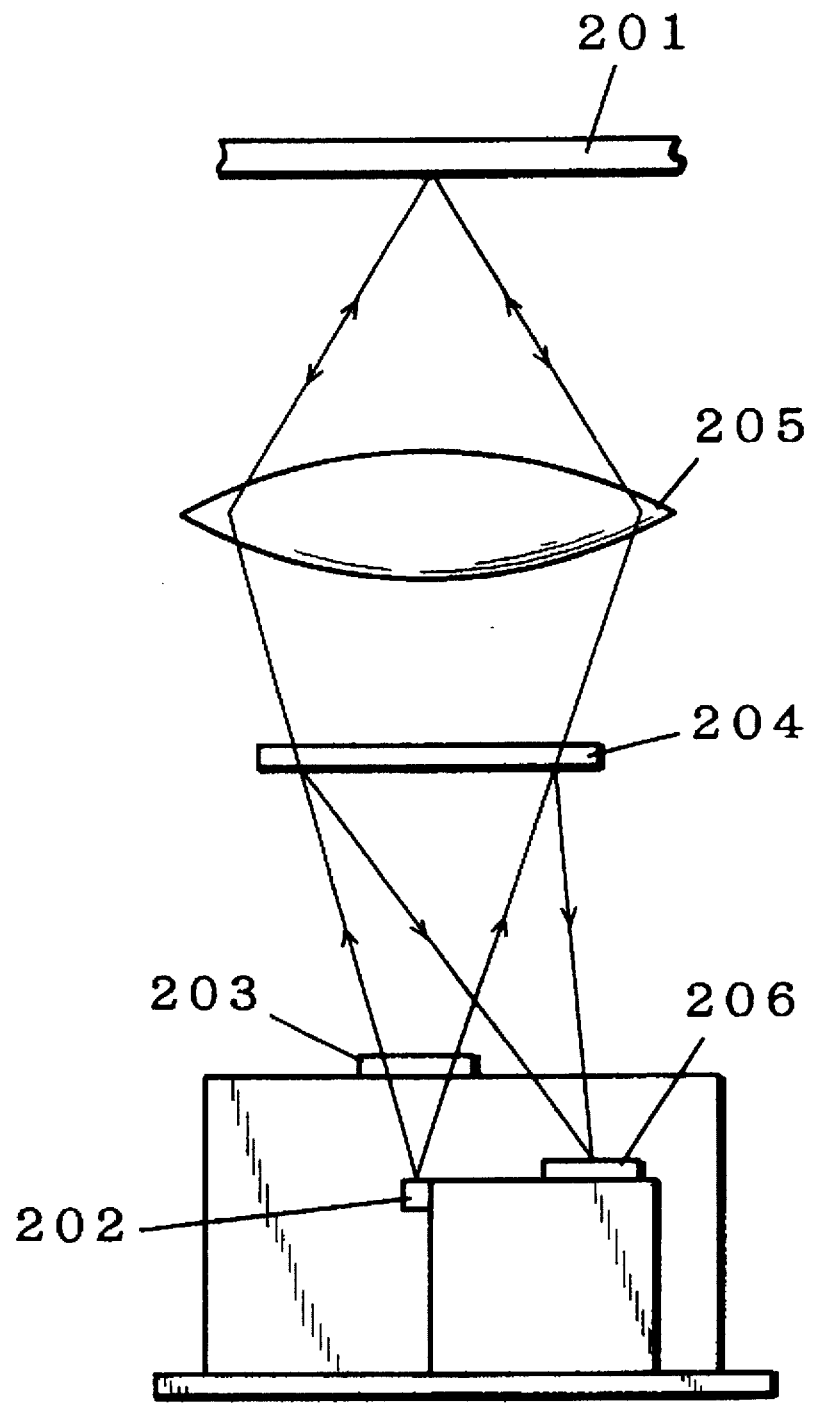
FIG. 38 is a diagram showing an outline of the structure of a conventional optical pickup apparatus.

FIG. 36 and FIG. 37 are an exploded perspective view and a sectional view of a semiconductor laser apparatus for an optical pickup apparatus according to the fourteenth embodiment. Bonding wires are not shown in FIG. 36 and FIG. 37. In the fourteenth embodiment, the same characters are allotted to the same or corresponding parts in the thirteenth embodiment, and differences only will be described.

The fourteenth embodiment considerably differs from the thirteenth embodiment in that a transmission type holographic optical element 122 is used which has the three-beam generating diffraction grating surface 59a on the surface facing the holographic optical element 62a instead of the three-beam generating diffraction grating 119.

A supporting member 63 is formed of black resin and joined on the concave portion 55 of the insulating mold body 54. The supporting member 63 supports the transmission type holographic optical element 122 three-dimensionally movably.

The cylindrical cavity 63a is provided in the center of the supporting member 63, into which the holographic optical element 122 is inserted. Windows 63b facing each other for positional adjustment of the holographic optical element 122 inserted into the cavity 63a are formed on the upper end of the supporting member 63. The projection 63c for preventing the holographic optical element 122 from dropping is provided in the lower end portion of the supporting member 63 in the cavity 63a. An engagement portion 63e which is shorter in the elongate direction by 0.6 mm, for example, than the engagement portion 55a of the insulating mold body 54 is provided in the bottom of the supporting member 63, which engagement portion 63e is fitted in the engagement portion 55a of the insulating mold body 54 slidably in the horizontal direction.

The transmission type holographic optical element 122 is formed of a cylindrical transparent member having the transmission type holographic functional surface 62a on its top surface and the three-beam generating diffraction grating surface 59a on its bottom surface. The transmission type holographic optical element 122 is inserted into the cylindrical cavity 63a of the supporting member 63 rotatably in the circumferential direction and slidably in the vertical direction. Holes 122a four pinch are formed in the side of the transmission type holographic optical element 122, into which the tips of a pinch jig are inserted.

As the supporting member 63 and the holographic optical element 122 are movable when they are just joined together, they are fixed with adhesive materials 70a, 70b, such as resin, as they are arranged in desired position, as shown in FIG. 37. As the transmission type holographic optical element 122 and the supporting member 63 are fixed above the concave portion 55 of the mount member 51, the inside of the concave portion 55 is tightly closed, which prevents undesirable lights from the outside from entering the concave portion 55.

Also in the semiconductor laser apparatus of this embodiment, because the holographic optical element 122 is slidable in the vertical direction and rotatable before the supporting member 63 and the holographic optical element 122 are fixed, and the supporting member 63 is slidable in the horizontal direction, the holographic optical element 122 can easily be three-dimensionally moved. As a result, the position of the holographic functional surface 62a of the holographic optical element 122 can be adjusted easily. Moreover, since the supporting member 63 and the holographic optical element 122 move sliding, the holographic functional surface 62a of the holographic optical element 122 can be positioned precisely.

When using a mirror as a reflection member as in the thirteenth and fourteenth embodiments, the transmission type three-beam generating diffraction grating can be used. In the case of such structure, as compared with the eighth through twelfth embodiments, the distance between the three-beam generating diffraction grating and the semiconductor laser device can be increased without increasing the dimension of the semiconductor laser apparatus. Accordingly, the period of undulation on the three-beam generating diffraction grating surface can be made large, resulting in smaller angle of the ±1 order diffraction lights. Furthermore, in the transmission type three-beam generating diffraction grating, as the beam from the semiconductor laser device is incident upon the diffraction grating surface almost vertically, distribution of intensity of respective condensed spots condensed upon the optical recording medium is symmetrical even if the period of undulation of the diffraction grating surface are equal. In the case of such undulation with equal period, no change occurs in characteristic wherever in the three-beam generating diffraction grating surface the beam enters, and therefore the positional adjustment is easy.

The convex portions 114b may be provided on the side of the transmission type holographic optical element 122 similarly to the thirteenth embodiment and the holes 122a for pinch may be formed in the convex portions 114b.

(15) Modified Examples

The present invention is not limited to the embodiments described above, and any of the embodiments can be combined as to the method of moving the respective members forming the supporting member, for example. For example, the first member 93 of FIG. 29 may be fitted slidably in the horizontal direction with respect to the mount member 54, and the holographic optical element 62 may be fixed to the third member 95 without using the fourth member 96, or, the holographic optical element 62 itself may be fitted to the engagement portion 94a of the second member 94 without using the third member 95 and the fourth member 96.

Although the supporting member, especially the first member serves also as a cover of the mount member in the embodiments described above, such structure may be adopted where a mount member having a cover is used and a supporting member (e.g., the first member) is provided on the cover. That is to say, if the mount member is a so-called housing, the supporting member (e.g., the first member) may be provided on the mount member.

The electric connections among elements etc. may be appropriately changed. For example, the light receiving device 60 is electrically connected directly to the frame 52 in the embodiments described above, but the semiconductor laser device 58 may be electrically connected directly to the frame 52, or the light receiving device 60 may be electrically connected to the lead 53.

Although the laser beam emitted from the front facet of the semiconductor laser device 58 is reflected in the direction to the transmission type holographic optical element (upward) using a reflection member in the embodiment described above, there is no need of providing the reflection member if a surface emitting type semiconductor laser device is used.

Further, although the second, third or fourth member has a cavity inside in the up and down direction in the embodiments described above, at least the inside cavity may be formed of a light-transmitting member, and further, the second, third or fourth member itself may be formed of a light-transmitting member. That is to say, the light-transmitting portions in this invention include hollow portions and portions formed of transparent materials.

Although a holographic optical element is used as a grating element in the embodiments described above, other grating elements may be used instead of a holographic optical element.

While the invention has been described in detail, the foregoing description is in all aspects illustrative and not restrictive. It is understood that numerous other modifications and variations can be devised without departing from the scope of the invention.

We claim:

1. A semiconductor laser apparatus, comprising:
   a semiconductor laser device;
   a light receiving device;
   a mount member on which said semiconductor laser device and said light receiving device are arranged;
   a transmission type holographic optical element for transmitting a laser beam emitted from said semiconductor laser device, diffracting a return beam originated from said laser beam and directing said return beam to said light receiving device; and
   a supporting member on said mount for supporting said transmission type holographic optical element that is three-dimensionally movable with respect to said mount member, said supporting member having a surface for allowing said holographic optical element to be moved in a first direction, a surface for allowing said holographic optical element to be moved in a second direction and a surface for allowing said holographic optical element to be moved in a third direction, and
   wherein said supporting member or/and said holographic optical element is/are fixed with said transmission type holographic optical element being positioned with respect to said mount member.

2. The semiconductor laser apparatus according to claim 1, wherein
   said holographic optical element is arranged above said mount member by said supporting member, and
   wherein said semiconductor laser apparatus further comprises a reflecting part for reflecting the laser beam emitted from said semiconductor laser device upward of said mount member and directing the laser beam to said holographic optical element.

3. The semiconductor laser apparatus according to claim 1, where said mount member comprises an insulating mold body having a recessed portion for accommodating said semiconductor laser device, said light receiving device and a plurality of leads supported by said insulating mold body, and
   said semiconductor laser device and said light receiving device are electrically connected to any of the plurality of leads in said recessed portion.

4. The semiconductor laser apparatus according to claim 3, wherein
   said holographic optical element is arranged above said mount member by said supporting member, and
   wherein said semiconductor laser apparatus further comprises a reflecting part arranged in said recessed portion for reflecting the laser beam emitted from said semiconductor laser device upward of said mount member and directing the laser beam to said holographic optical element.

5. The semiconductor laser apparatus according to claim 3,
   wherein said mount member further comprises a frame held by said insulating mold body, and
   said semiconductor laser device is provided on said frame in said recessed portion.

6. The semiconductor laser apparatus according to claim 5, wherein
   said holographic optical element is arranged above said mount member by said supporting member, and
   wherein said semiconductor laser apparatus further comprises a reflecting part arranged in said recessed portion for reflecting the laser beam emitted from said semiconductor laser device upward of said mount member and directing the laser beam to said holographic optical element.

7. The semiconductor laser apparatus according to claim 5, wherein said light receiving device is provided on said frame in said recessed portion.

8. The semiconductor laser apparatus according to claim 2, wherein said reflecting part includes a reflection type diffraction grating for reflecting the laser beam emitted from said semiconductor laser device and dividing the laser beam into at least three beams.

9. The semiconductor laser apparatus according to claim 1, further comprising a transmission type diffraction grating for transmitting the laser beam emitted from said semiconductor laser device and dividing into at least three beams and directing said divided beams to said transmission type holographic optical element.

10. The semiconductor laser apparatus according to claim 2, wherein
    said reflecting part includes a mirror, and
    wherein said semiconductor laser apparatus further comprises a transmission type diffraction grating for transmitting the laser beam reflected by said mirror and dividing the laser beam into at least three beams.

11. The semiconductor laser apparatus according to claim 9, wherein said transmission type diffraction grating is provided in said supporting member.

12. The semiconductor laser apparatus according to claim 9, wherein said transmission type diffraction grating is formed integrally with said supporting member.

13. The semiconductor laser apparatus according to claim 1, wherein said holographic optical element is formed integrally with said supporting member.

14. The semiconductor laser apparatus according to claim 9, wherein said holographic optical element and said transmission type diffraction grating are integrally formed of a transparent member, said transparent member having a holographic functional surface and a diffraction grating surface which face each other, said diffraction grating surface arranged on the side of said mount member.

15. The semiconductor laser apparatus according to claim 8, wherein said holographic optical element diffracts said return beam to said light receiving device so that said return beam does not enter said reflection type diffraction grating.

16. The semiconductor laser apparatus according to claim 9, wherein said holographic optical element diffracts said return beam to said light receiving device so that said return beam does not enter said transmission type diffraction grating.

17. The semiconductor laser apparatus according to claim 2, wherein said semiconductor laser device, said reflecting part and said light receiving device are arranged substantially on a single line in this order.

18. The semiconductor laser apparatus according to claim 1, wherein two of said surfaces of said supporting member are formed of a common surface.

19. The semiconductor laser apparatus according to claim 1, wherein said first direction is a direction substantially vertical to an axis of an incident laser beam, said second direction is a direction substantially parallel to said axis of said incident laser beam, and said third direction is a rotating direction on an axis substantially along said axis of said incident laser beam.

20. The semiconductor laser apparatus according to claim 1, wherein said first direction is a direction substantially vertical to an axis of an incident laser beam, said second direction is a direction substantially parallel to said axis of said incident laser beam, and said third direction is a direction substantially vertical to said first direction and said second direction.

21. The semiconductor laser apparatus according to claim 1, wherein said supporting member and/or said holographic optical element are/is fixed with an adhesive material with said transmission type holographic optical element being positioned with respect to said mount member.

22. A semiconductor laser apparatus comprising:

a semiconductor laser device;

a light receiving device;

a mount member on which said semiconductor laser device and said light receiving device are arranged, a transmission type holographic optical element for transmitting a laser beam emitted from said semiconductor laser device, diffracting a return beam originated from said laser beam, and directing said return beam to said light receiving device;

a supporting member for supporting said transmission type holographic optical element, said holographic optical element being three-dimensionally movably with respect to said mount member, wherein said supporting member or/and said holographic optical element is/are fixed with an adhesive material with said transmission type holographic optical element positioned above said mount member, said mount member comprising an insulating mold body having a recessed portion for accommodating said semiconductor laser device, said light receiving device and a plurality of leads supported by said insulating mold body, said semiconductor laser device and said light receiving device being electrically connected to any of the plurality of leads in said recessed portion, wherein said semiconductor laser apparatus further comprises a reflecting part arranged in said recessed portion for reflecting the laser beam emitted from said semiconductor laser device upward of said mount member and directing the laser beam to said holographic optical element, and wherein said insulating mold body has an inclined portion which supports said reflecting part at an angle.

23. The semiconductor laser apparatus according to claim 22, wherein said insulating mold body includes a second recessed portion formed in the bottom of said recessed portion, and said inclined portion is formed in said second recessed portion.

24. The semiconductor laser apparatus according to claim 22, wherein said supporting member has a surface for allowing said holographic optical element to be moved in a first direction, a surface for allowing said holographic optical element to be moved in a second direction and a surface for allowing said holographic optical element to be moved in a third direction.

25. The semiconductor laser apparatus according to claim 24, wherein two of said surfaces of said supporting member are formed of a common surface.

26. The semiconductor laser apparatus according to claim 24, wherein said first direction is a direction substantially vertical to an axis of an incident laser beam, said second direction is a direction substantially parallel to said axis of said incident laser beam, and said third direction is a rotating direction on an axis substantially along said axis of said incident laser beam.

27. The semiconductor laser apparatus according to claim 24, wherein said first direction is a direction substantially vertical to an axis of a incident laser beam, said second direction is a direction substantially parallel to said axis of said incident laser beam, and said third direction is a direction said incident laser beam, and said third direction is a direction substantially vertical to both said first direction and said second direction.

28. A semiconductor laser apparatus, comprising:

a semiconductor laser device;

a light receiving device;

a mount member on which said semiconductor laser device and said light receiving device are arranged;

a transmission type holographic optical element for transmitting a laser beam emitted from said semiconductor laser device, diffracting a return beam originated from said laser beam, and directing said return beam to said light receiving device; and a supporting member for supporting said transmission type holographic optical element, said transmission type holographic optical element being three-dimensionally movable with respect to said mount member, wherein said supporting member includes a plurality of members, said plurality of members movably joined to each other in different directions, and said supporting member and/or said holographic optical element are/is fixed with an adhesive material with said transmission type holographic optical element being positioned with respect to said mount member.

29. The semiconductor laser apparatus according to claim 28, wherein said different directions are first directions substantially vertical to an axis of an incident laser beam, a second direction substantially parallel to said axis and a rotating direction on an axis substantially along said axis of said incident laser beam.

30. The semiconductor laser apparatus according to claim 29, wherein said plurality of members comprise, a first member fixed on said mount member, a second member joined to said first member rotatably about an axis along said second direction and movably in said second direction, and a third member which holds said holographic optical element so that the laser beam impinges upon said holographic optical element substantially vertically and which is joined to said second member movably in said first directions.

31. The semiconductor laser apparatus according to claim 30, wherein said first member has a cylindrical cavity substantially around the axis along said second direction, said second member comprises a cylinder fitted into said cylindrical cavity slidably in the rotating direction and said second direction and has at least in part a light-transmitting portion which transmits said incident laser beam, said third member is fitted to said second member slidably in said first directions and has at least in part a light-transmitting portion which leads said incident laser beam to said holographic optical element, and said second member and said third member are fixed with an adhesive material.

32. The semiconductor laser apparatus according to claim 29, wherein said plurality of members comprise, a first member fixed on said mount member, and a second member joined to said first member rotatably on an axis along said second direction and movably in said second direction, and wherein said holographic optical element is joined to said second member movably in said first directions.

33. The semiconductor laser apparatus according to claim 32, wherein said first member has a cylindrical cavity substantially around the axis along said second direction, said second member comprises a cylinder fitted into said cylindrical cavity slidably in the rotating direction and said second direction and has at least in part a light-transmitting portion which leads said incident laser beam to said holographic optical element, and wherein said second member and said holographic optical element are fixed with an adhesive material.

34. The semiconductor laser apparatus according to claim 29, wherein said plurality of members comprise, a first member which is joined on/above said mount member movably in said first direction, and a second member which holds said holographic optical element so that the laser beam is incident upon said holographic optical element substantially vertically and which is joined to said first member rotatably on an axis along said second direction and movably in said second direction.

35. The semiconductor laser apparatus according to claim 34, wherein said first member has a cylindrical cavity substantially around the axis along said second direction and which is fitted to said mount member slidably in said first direction, said second member is formed of a cylinder fitted in said cylindrical cavity slidably in the rotating direction and said second direction and has at least in part a light-transmitting portion which leads said incident laser beam to said holographic optical element, and wherein said first member and said second member are fixed with an adhesive material.

36. The semiconductor laser apparatus according to claim 28, wherein said different directions are a first direction substantially vertical to an axis of an incident laser beam, a second direction substantially parallel to said axis, and a third direction substantially vertical to said first direction and said second direction.

37. The semiconductor laser apparatus according to claim 36, wherein said plurality of members comprise, a first member which is fixed to said mount member, a second member which is joined to said first member movably in said second direction, a third member which is joined to said second member movably in said first direction, and a fourth member which holds said holographic optical element so that the laser beam impinges upon said holographic optical element substantially vertically and which is joined to said third member movably in said third direction.

38. The semiconductor laser apparatus according to claim 37, wherein said first member has a cavity, said second member is fitted into said cavity slidably in said second direction and has at least in part a light-transmitting portion which transmits said incident laser beam, said third member is fitted to said second member slidably in said first direction and has at least in part a light-transmitting portion which transmits said incident laser beam, said fourth member is fitted to said third member slidably in said third direction and has at least in part a light-transmitting portion which leads said incident laser beam to said holographic optical element, and wherein said second member, said third member and said fourth member are fixed with an adhesive material.

39. The semiconductor laser apparatus according to claim 36, wherein said plurality of members comprise, a first member fixed on said mount member, a second member joined to said first member movably in said second direction, and a third member joined to said second member movably in said first direction, and said holographic optical element is joined to said third member movably in said third direction.

40. The semiconductor laser apparatus according to claim 39, wherein said first member has a cavity, said second member is fitted in said cavity slidably in said second direction and has at least in part a light-transmitting portion which transmits said incident laser beam.

said third member is fitted to said second member slidably in said first direction and has at least in part a light-transmitting portion which leads said incident laser beam to said holographic optical element, said holographic optical element is fitted to said third member slidably in said third direction, and wherein said second member, third member, and said holographic optical element are fixed with an adhesive material.

41. The semiconductor laser apparatus according to claim 36, wherein said plurality of members comprise, a first member which is joined on said mount member movably in said first direction, a second member which is joined to said first member movably in said second direction, and a third member which holds said holographic optical element so that the laser beam is incident upon said holographic optical element substantially vertically and which is joined to said second member movably in said third direction.

42. The semiconductor laser apparatus according to claim 41, wherein said first member has a cavity, and which is joined to said mount member slidably in said first direction, said second member is fitted in said cavity slidably in said second direction and has at least in part a light-transmitting portion which transmits said incident laser beam, said third member is fitted to said second member slidably in said third direction and has at least in part a light-transmitting portion which leads said incident laser beam to said holographic optical element, and wherein said first member, said second member and said third member are fixed with an adhesive material.

43. The semiconductor laser apparatus according to claim 36, wherein said plurality of members comprises, a first member which is joined on said mount member movably in said first direction, and a second member which is joined to said first member movably in said second direction, and said holographic optical element is joined to said second member movably in said third direction.

44. The semiconductor laser apparatus according to claim 43, wherein said first member has a cavity, and which is fitted to said mount member slidably in said first direction, said second member is fitted into said cavity slidably in said second direction and has at least in part a light-transmitting portion which leads said incident laser beam to said holographic optical element, and said holographic optical element is fitted to said second member slidably in said third direction, and wherein said first member, said second member and said holographic optical element are fixed with an adhesive material.

45. The semiconductor laser apparatus according to claim 28, wherein said supporting member has a surface for allowing said holographic optical element to be moved in a first direction, a surface for allowing said holographic optical element to be moved in a second direction and a surface for allowing said holographic optical element to be moved in a third direction.

46. The semiconductor laser apparatus according to claim 45, wherein two of said surfaces of said supporting member are formed of a common surface.

47. The semiconductor laser apparatus according to claim 45, wherein said first direction is a direction substantially vertical to an axis of an incident laser beam, said second direction is a direction substantially parallel to said axis of said incident laser beam, and said third direction is a rotating direction on an axis substantially along said axis of said incident laser beam.

48. The semiconductor laser apparatus according to claim 45, wherein said first direction is a direction substantially vertical to an axis of an incident laser beam, said second direction is a direction substantially parallel to said axis of said incident laser beam, and said third direction is a direction substantially vertical to said first direction and said second direction.

49. A semiconductor laser apparatus, comprising:

a semiconductor laser device;

a light receiving device;

a mount member on which said semiconductor laser device and said light receiving device are arranged;

a transmission type holographic optical element for transmitting a laser beam emitted from said semiconductor laser device, diffracting a return beam originated from said laser beam, and directing said return beam to said light receiving device, a supporting member for supporting said transmission type holographic optical element, said transmission type holographic optical element being three-dimensionally movable with respect to said mount member, wherein said supporting member is joined to said mount member movably in a direction substantially vertical to an axis of an incident laser beam, said holographic optical element is rotatably joined to said supporting member substantially on said axis and is movably joined in a direction substantially parallel to said axis, and said supporting member and said holographic optical element are fixed to each other by an adhesive material with said transmission type holographic optical element being positioned with respect to said mount member.

50. The semiconductor laser apparatus according to claim 49, wherein said supporting member is fitted to said mount member slidably in a direction substantially vertical to the axis of said incident laser beam and has a cylindrical cavity substantially around said axis, said holographic optical element comprises a cylinder fitted in said cylindrical cavity slidably in a rotating direction and a direction substantially parallel to said axis, and wherein said mount member, said supporting member and said holographic optical element are fixed with an adhesive material.

51. The semiconductor laser apparatus according to claim 34, wherein a first recessed portion having a V-shaped notch is formed on a side of said first member, and a second recessed portion having a shape corresponding to said notch is formed on a side of said second member, which is inserted with play relative to said first recessed portion.

52. The semiconductor laser apparatus according to claim 34, wherein a V-shaped recessed portion is formed in a side of said first member.

53. An optical pickup apparatus which emits a light beam to an optical recording medium and detects a return beam from said optical recording medium, comprising:

a semiconductor laser apparatus, said semiconductor laser apparatus comprising,
a semiconductor laser device,
a light receiving device, and
a mount member on which said semiconductor laser device and said light receiving device are provided;
a transmission type holographic optical element for transmitting a laser beam emitted from said semiconductor laser device and diffracting a return beam originated from said laser beam to said light receiving device, and
a supporting member on said mount member for supporting said transmission type holographic optical element that is three-dimensionally movable with respect to said mount member, said supporting member having a surface for allowing said holographic optical element to be moved in a first direction, a surface for allowing said holographic optical element to be moved in a second direction and a surface for allowing said holographic optical element to be moved in a third direction, and
wherein said supporting member and/or said holographic optical element are/is fixed with said transmission type holographic optical element being positioned with respect to said mount member.

54. The optical pickup apparatus according to claim 53, wherein
said semiconductor laser apparatus further comprises,
reflecting part for reflecting the laser beam emitted in a first direction from said semiconductor laser device in a second direction substantially vertical to said first direction, and
a transmission type diffraction grating which transmits the laser beam reflected by said reflecting part and divides the laser beam into at least three beams and directs said three beams to said holographic optical element,
wherein said holographic optical element diffracts said return beam to said light receiving device so that said diffracted beam does not impinge upon said transmission type diffraction grating surface.

55. The optical pickup apparatus according to claim 53, wherein two of said surfaces of said supporting member are formed of a common surface.

56. The optical pickup apparatus according to claim 53, wherein said first direction is a direction substantially vertical to an axis of an incident laser beam, said second direction is a direction substantially parallel to said axis of said incident laser beam, and said third direction is a rotating direction on an axis substantially along said axis of said incident laser beam.

57. The optical pickup apparatus according to claim 53, wherein said first direction is a direction substantially vertical to an axis of an incident laser beam, said second direction is a direction substantially parallel to said axis of said incident laser beam, and said third direction is a direction substantially vertical to said first direction and said second direction.

58. An optical pickup apparatus which emits a light beam to an optical recording medium and detects a return beam from said optical recording medium, comprising:

a semiconductor laser apparatus, said semiconductor laser apparatus comprising,
a semiconductor laser device,
a light receiving device, and
a mount member on which said semiconductor laser device and said light receiving device are provided;
a transmission type holographic optical element for transmitting a laser beam emitted from said semiconductor laser device and diffracting a return beam originated from said laser beam to said light receiving device;
a supporting member for supporting said transmission type holographic optical element,
said transmission type holographic optical element being three-dimensionally movable with respect to said mount member, wherein
said supporting member includes a plurality of members, said plurality of members movably joined with respect to each other in different directions, and
said supporting member and/or said holographic optical element are/is fixed with an adhesive material with said transmission type holographic optical element being positioned with respect to said mount member.

59. The optical pickup apparatus according to claim 58, wherein said supporting member has a surface for allowing said holographic optical element to be moved in a first direction, a surface for allowing said holographic optical element to be moved in a second direction and a surface for allowing said holographic optical element to be moved in a third direction.

60. The optical pickup apparatus according to claim 59, wherein two of said surfaces of said supporting member are formed of a common surface.

61. The optical pickup apparatus according to claim 59, wherein said first direction is a direction substantially vertical to an axis of an incident laser beam, said second direction is a direction substantially parallel to said axis of said incident laser beam, and said third direction is a rotating direction on an axis substantially along said axis of said incident laser beam.

62. The optical pickup apparatus according to claim 59, wherein said first direction is a direction substantially vertical to an axis of an incident laser beam, said second direction is a direction substantially parallel to said axis, of said incident laser beam, and said third direction is a direction substantially vertical to said first direction and said second direction.

63. The optical pickup apparatus according to claim 53, wherein said supporting member and/or said holographic optical element are/is fixed with an adhesive material with said transmission type holographic optical element being positioned with respect to said mount member.

64. An optical pickup apparatus which emits a light beam to an optical recording medium and detects a return beam from said optical recording medium, comprising:

a semiconductor laser apparatus, said semiconductor laser apparatus comprising,
a semiconductor laser device,
a light receiving device,
a mount member on which said semiconductor laser device and said light receiving device are provided;
a transmission type holographic optical element for transmitting a laser beam emitted from said semiconductor laser device and diffracting a return beam originated from said laser beam to said light receiving device; and
a supporting member for supporting said transmission type holographic optical element,
said transmission type holographic optical element being three-dimensionally movable with respect to said mount member, wherein said supporting member is movably joined to said mount member in a direction substantially vertical to an axis of an incident laser beam, said holographic optical element is rotatably joined to said supporting member on said axis and is joined movably in a direction substantially parallel to said axis, and said supporting member and said holographic optical element are fixed with an adhesive material with said transmission type holographic optical element being positioned with respect to said mount member.

* * * * *